United States Patent [19]
Moore et al.

[11] Patent Number: 5,374,928
[45] Date of Patent: Dec. 20, 1994

[54] METHOD OF PROCESSING A TEXT IN ORDER TO STORE THE TEXT IN MEMORY

[75] Inventors: John D. Moore, Eastwood; Peter G. Swain, Annandale; Roger B. Purchell, Weetangera; John Hilton, Toongabbie, all of Australia

[73] Assignee: Megaword International Pty. Ltd., New South Wales, Australia

[21] Appl. No.: 445,705

[22] PCT Filed: May 25, 1988

[86] PCT No.: PCT/AU88/00161
   § 371 Date: Mar. 14, 1990
   § 102(e) Date: Mar. 14, 1990

[87] PCT Pub. No.: WO88/09586
   PCT Pub. Date: Dec. 1, 1988

[30] Foreign Application Priority Data

May 25, 1987 [AU] Australia .................. PI2103/87
May 25, 1987 [AU] Australia .................. PI2104/87

[51] Int. Cl.⁵ .............................. H03M 7/40
[52] U.S. Cl. .............................. 341/67; 341/51; 341/106
[58] Field of Search ............... 341/51, 55, 67, 90, 341/106

[56] References Cited

U.S. PATENT DOCUMENTS 4,843,389 6/1989 Lisle et al. ............... 341/106
4,881,075 11/1989 Weng ....................... 341/87
4,899,148 2/1990 Sato et al. ................ 341/65

Primary Examiner—Marc S. Hoff
Attorney, Agent, or Firm—Blakely, Sokoloff, Taylor & Zafman

[57] ABSTRACT

A method of compressing text by allocating word tokens to each unique word and phrase tokens to adjacent word tokens, to adjacent phrase tokens or adjacent phrase and word tokens, which occur in the text at least three times and changing the binary character code representation of the text so that the text is represented by phrase and word tokens. A data processing system for decompressing and displaying the compressed text.

39 Claims, 22 Drawing Sheets

METHOD OF PROCESSING A TEXT IN ORDER TO STORE THE TEXT IN MEMORY

The present invention relates to a method of processing a text in order to store the text in memory. The invention also relates to a method of processing the stored text in order to retrieve the text from memory and a data processing system comprising means for performing this method.

In the context of this specification the word "text" refers to any body or sequence of "words". Throughout this specification we use the term "word" to refer to any recognisable word (e.g. water, boat, pen, spoon, etc.), symbol (e.g. 3, &, ?, etc.) or special action instruction (e.g. next word starts with a capital letter, end of line, beginning of paragraph, etc.). The term "word", however, throughout the specification, should also be understood to encompass a number of logical alternatives, which may depend on the particular form of the text to be processed. For instance, a word may be defined as being any group of alphanumeric characters and/or instructions which exist in the text between two consecutive spaces. In the case of the text being data, such as that received from a seismic test or a radio telescope, a word may be defined as being any group of alphanumeric characters and/or instructions which exist between two consecutive occurrences of a commonly occurring alphanumeric character or instruction. Hence, prior to processing a text according to the present invention a determination needs to be made as to what will constitute a word for the purposes of processing the text.

In the past it has proved impractical to store the text of most books in the memory of a data processing system because such a text would require approximately several million bytes of binary code to represent the text and the capacity of the available memory chips could not accommodate such a large amount of information without the resulting data processing system becoming cumbersomely large. In recent years, however, the capacity of available memory chips has increased without substantial alterations to their size. In particular, with the advent of the one megabit chip the feasibility of producing a practical and portable data processing system for storing the text of a book has been enhanced.

The other factor which affects the size and practibility of a data processing system for storing text is the economy and efficiency with which the text is stored in the available memory space. It is desirable to have text stored in the smallest possible memory space in order to minimize the number of memory chips required and, hence, minimize the size and power consumption of a data processing system comprising the chips.

Text is normally represented in digital code by allocating an eight bit binary character code to each alphanumeric character and instruction which could appear in the text, an example being the ASCII code. While it is usually necessary to employ such an eight bit character code for display purposes it is desirable to compress this code representation of the text for storage purposes.

In accordance with the present invention there is provided a method of processing a text comprising words represented by binary character code in order to store the text in storage means, said method comprising:

creating a dictionary file which relates the binary character code of each word in said text to a binary word code representative of the word itself;

altering the binary character code representation of said text by replacing the binary character code representation of each word with the corresponding binary word code according to said dictionary file;

creating a phrase table file which relates the binary word code of pairs of words, which are adjacent one another in said text and occur in said text at least three times, to binary phrase code representative of said pairs;

adjusting said phrase table file so as to relate two binary phrase codes, or a binary phrase code and a binary word code, to a single distinct binary phrase code, said two phrase codes, or said phrase and word codes, representing a group of words which comprise a phrase and occur in said text at least three times; and altering the code representation of said text so as to replace binary word code with binary phrase code according to said phrase table file.

In accordance with the present invention there is also provided a memory medium comprising text which has been processed according to the text processing method described above.

In accordance with the present invention there is also provided a method of decompressing text processed according to the text processing method described above, comprising sequentially processing the code representation of said text and using each word and phrase code accessed therefrom to access the dictionary and phrase table files until character code is obtained therefrom, said phrase table file being recursively accessed by phrase code until word code is retrieved for accessing said dictionary file.

In accordance with the present invention there is also provided a method of accessing stored text which has been processed according to the text processing method described above, comprising:

receiving a signal indicating that a predetermined word or phrase is to be searched for in the text, accessing said dictionary file and phrase file, in response to said signal, to determine the corresponding binary word and/or phrase code to be searched for in said stored text so as to locate said predetermined word or phrase, searching said stored text on the basis of said corresponding binary code, and displaying, in response to said searching step, a location of said predetermined word or phrase in said text.

In accordance with the present invention there is also provided a data processing system connectable to storage means comprising a text processed according to the text processing method described above, said system comprising:

means for sequentially accessing the code representation of said text in said memory and using each word and phrase code accessed from said code to access the dictionary and phrase table files in said storage means until character code is obtained therefrom, said means recursively accessing said phrase table file by phrase code until word code is retrieved for accessing said dictionary file; and means for displaying at least part of said text corresponding to the obtained character code, said displaying means being controlled by said accessing means.

In accordance with the present invention there is also provided a data processing system connectable to storage means comprising a text processed according to the text processing method described above, said system comprising:

means for receiving a signal indicating that a predetermined word or phrase is to be searched for in the text, means responsive to said receiving means for accessing said dictionary file and phrase table file to determine the corresponding binary word and/or phrase code to be searched for in said stored text in order to locate said predetermined word or phrase, and for searching said stored text on the basis of said corresponding binary code, and means responsive to said accessing means for displaying a location of said predetermined word or phrase in said text.

In accordance with the present invention there is also provided a data processing system connectable to storage means which includes a text processed according to the text processing method described above, said storage means having a first section which includes the code representation of said text, a second section which includes said dictionary file, a third section which includes said phrase table file, and a fourth section which includes decompressing, searching and display programs, said system comprising:

an address bus and a data bus which are connectable to said storage means;

a register bank connected to part of said address bus and input/output ports connected to said data bus and the remainder of said address bus;

processor means connectable to said bank and ports so as to control said buses and thereby access said storage means; and means for displaying at least part of said text;

said bank being adapted to store four different most significant parts of an address to be placed on said address bus, thereby enabling said processor means to access one of said sections of storage means in one access cycle and another of said sections in the succeeding cycle and retain an indication as to the location at which said one of said sections was last accessed, such that said processor means may sequentially access and process the code representation of said text using said programs and use each word and phrase code accessed therefrom to access said dictionary and phrase table files until character code is obtained therefrom, said processor means recursively accessing said phrase table file by phrase code until word code is retrieved for accessing said dictionary file;

said processor means being adapted to control said display means to display a part of said text corresponding to said obtained character code.

A preferred embodiment of the present invention will now be described by way of example only, with reference to the accompanying drawings wherein.

Figure 2:
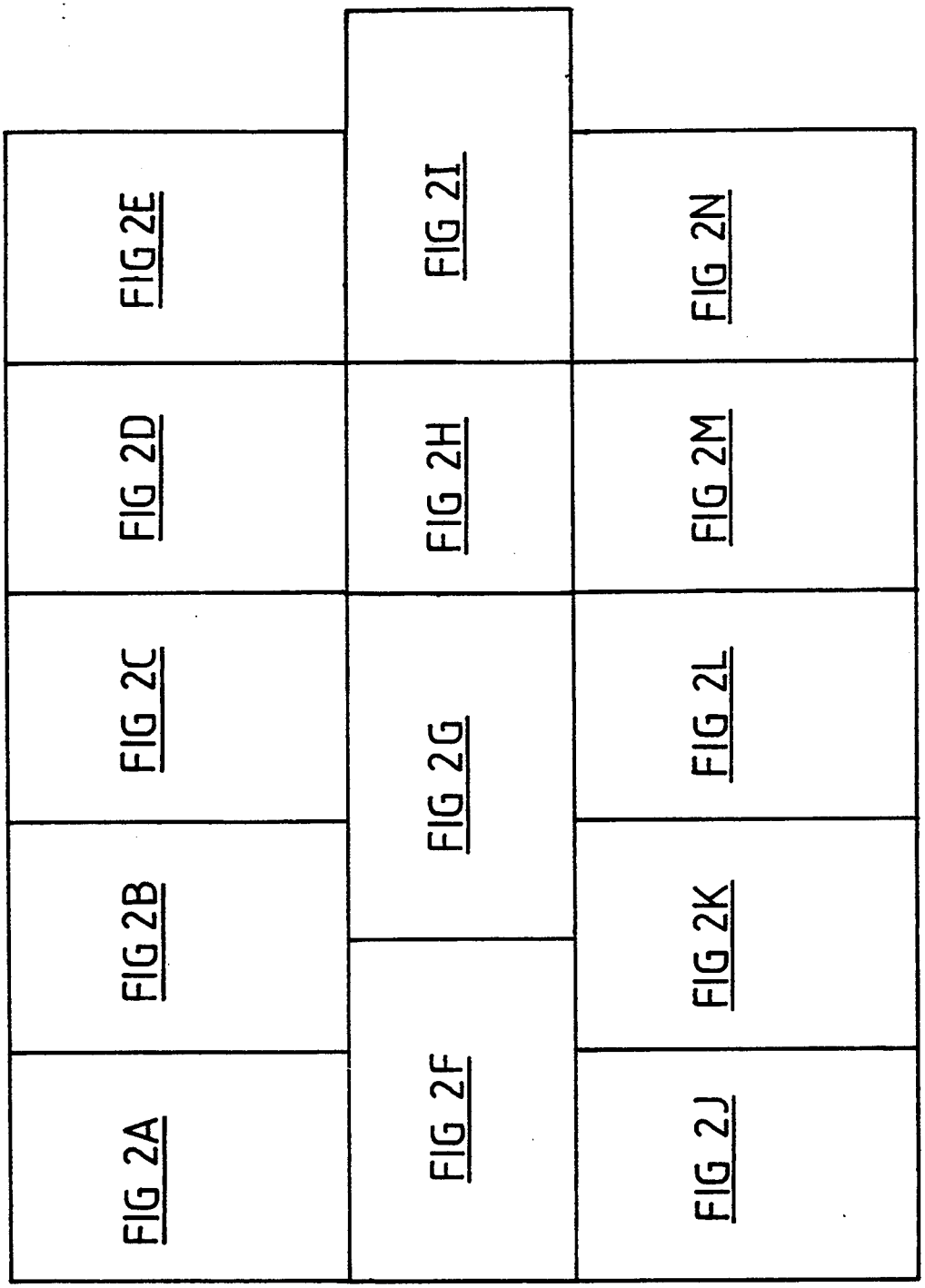
FIG. 2 is a diagram illustrating how FIGS. 2A to 2N relate to one another.
Figure 2A:
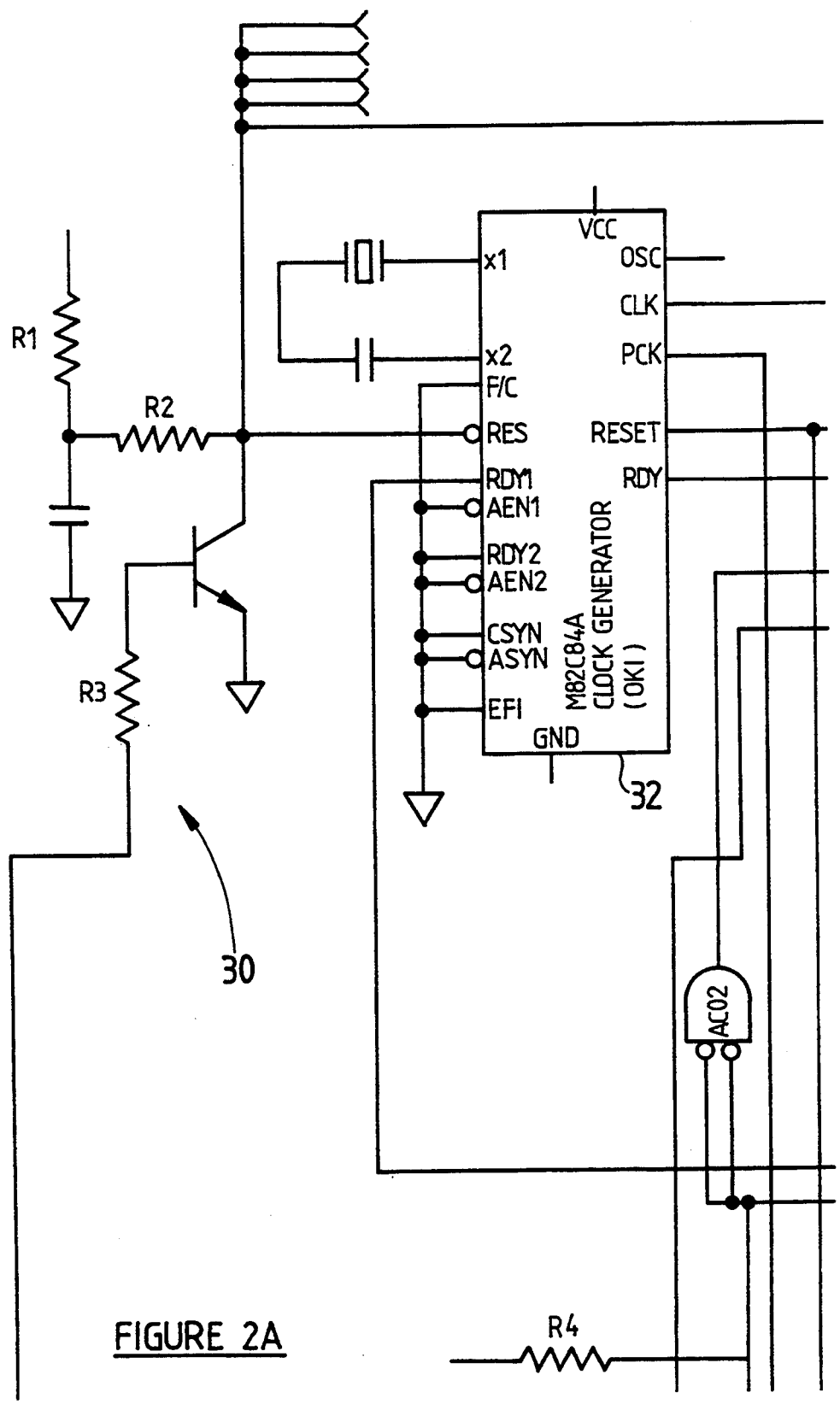
Figure 2B:
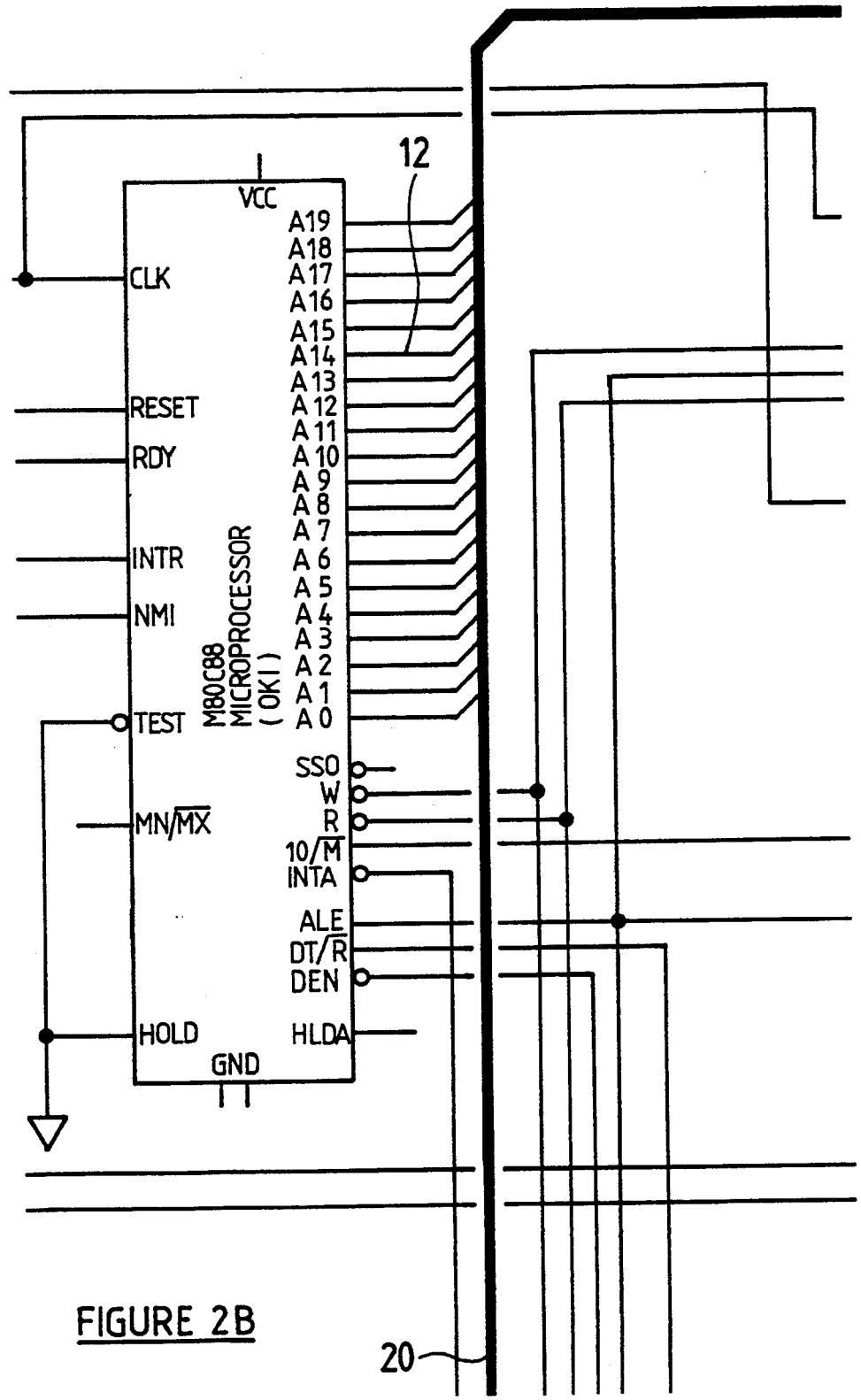
Figure 2C:
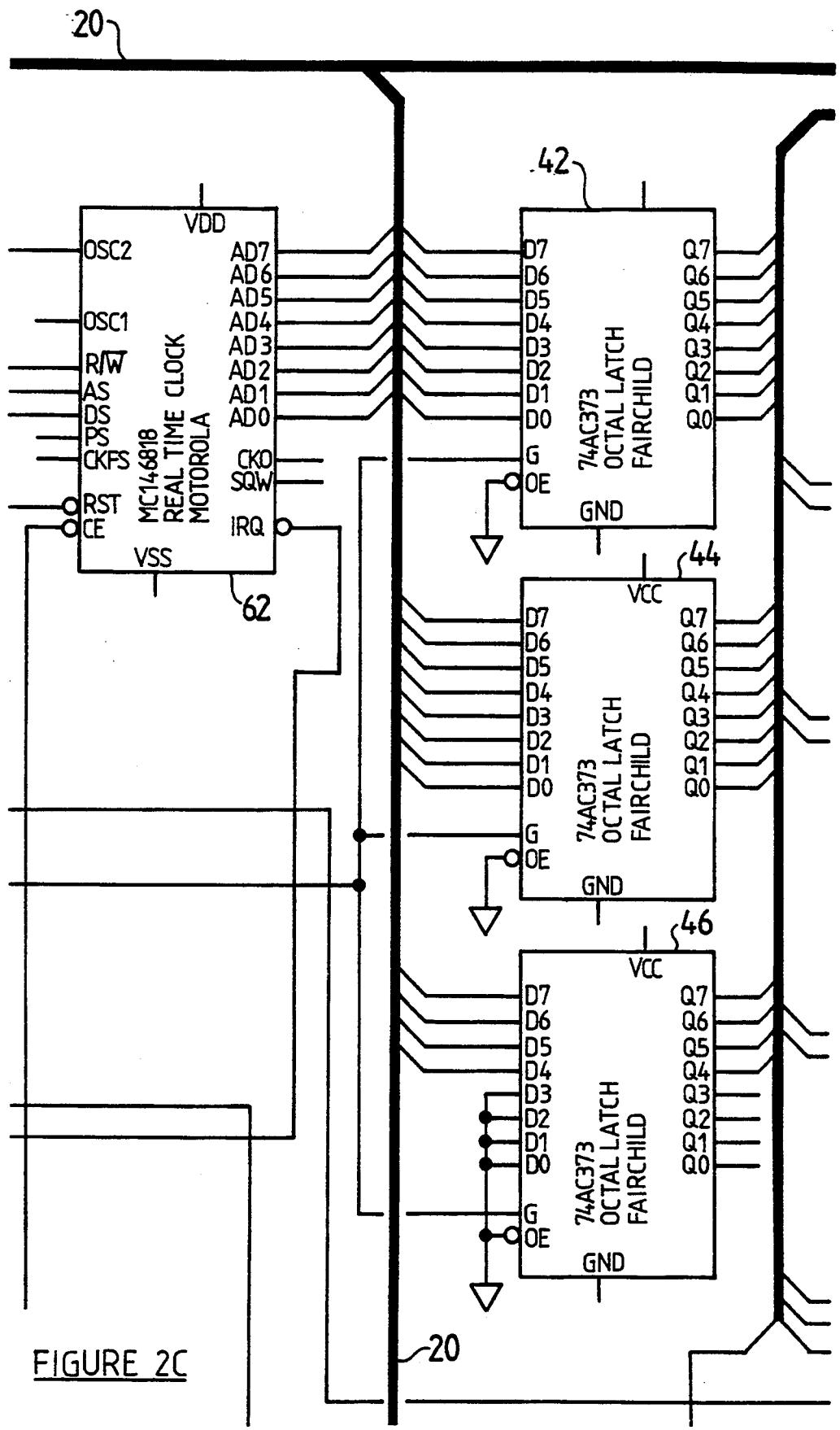
Figure 2D:
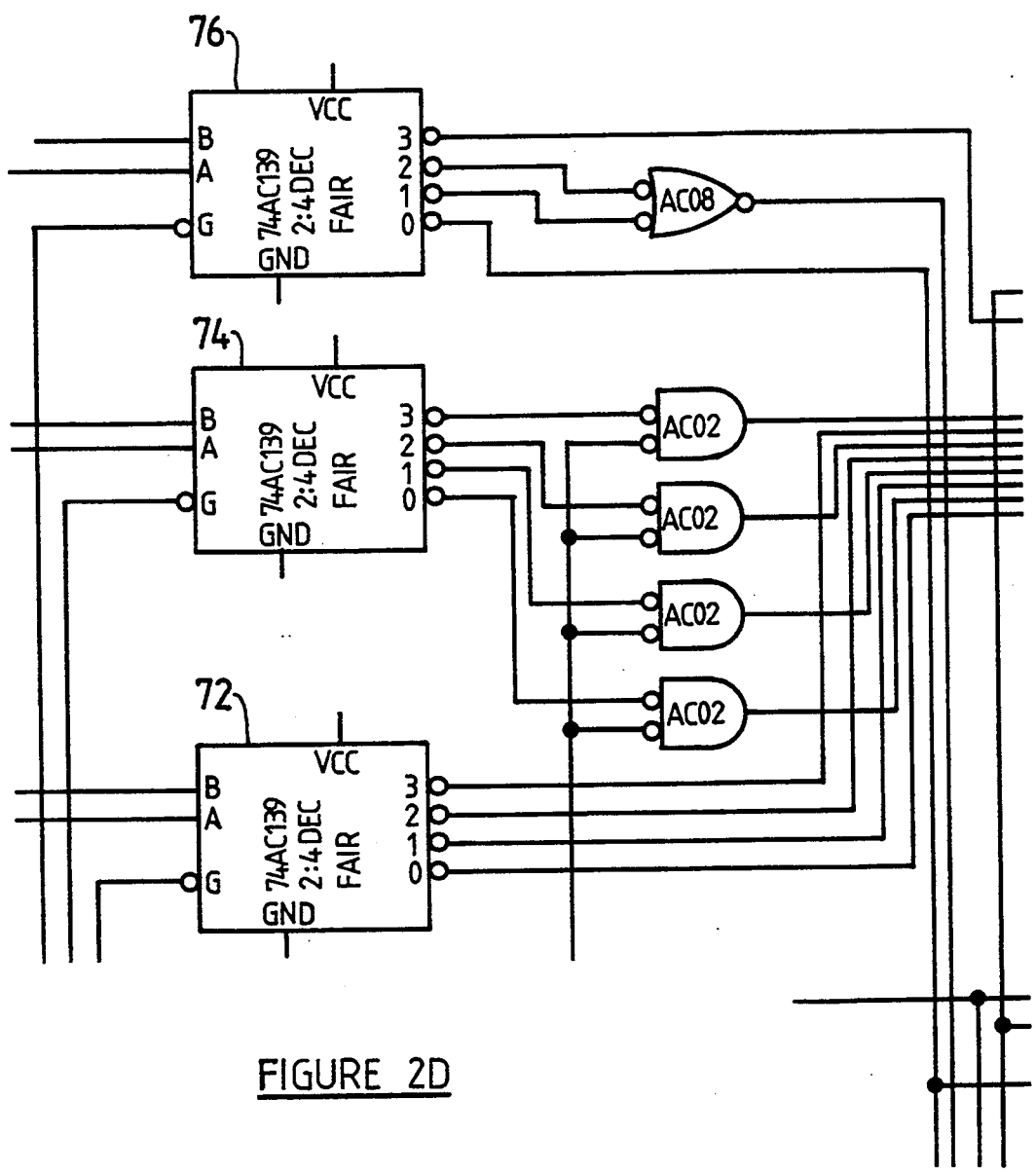
Figure 2E:
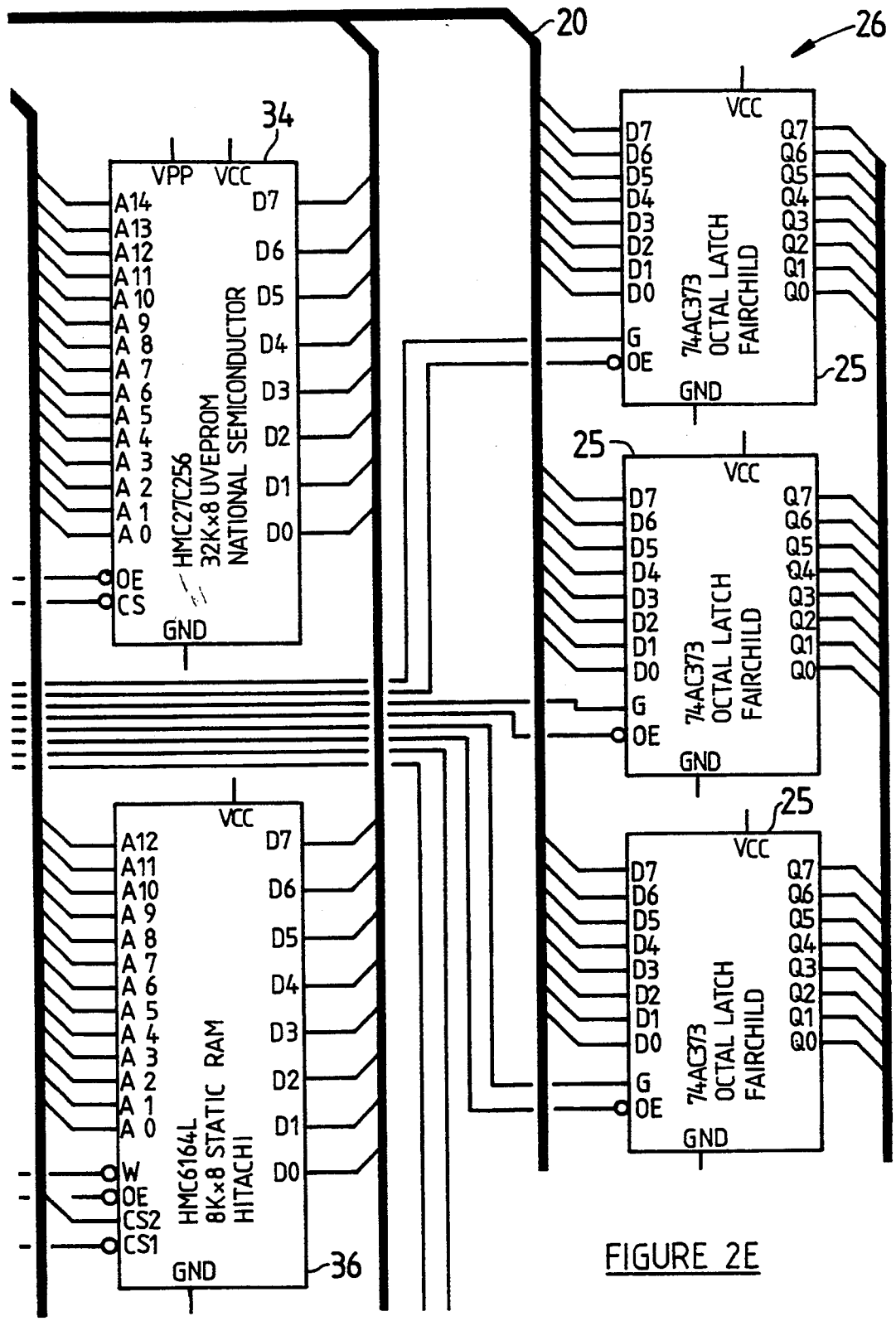
Figure 2F:
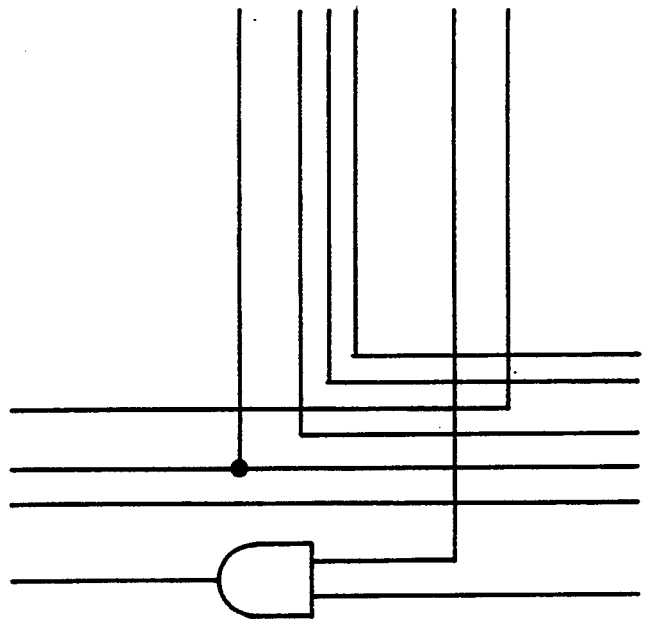
Figure 2G:
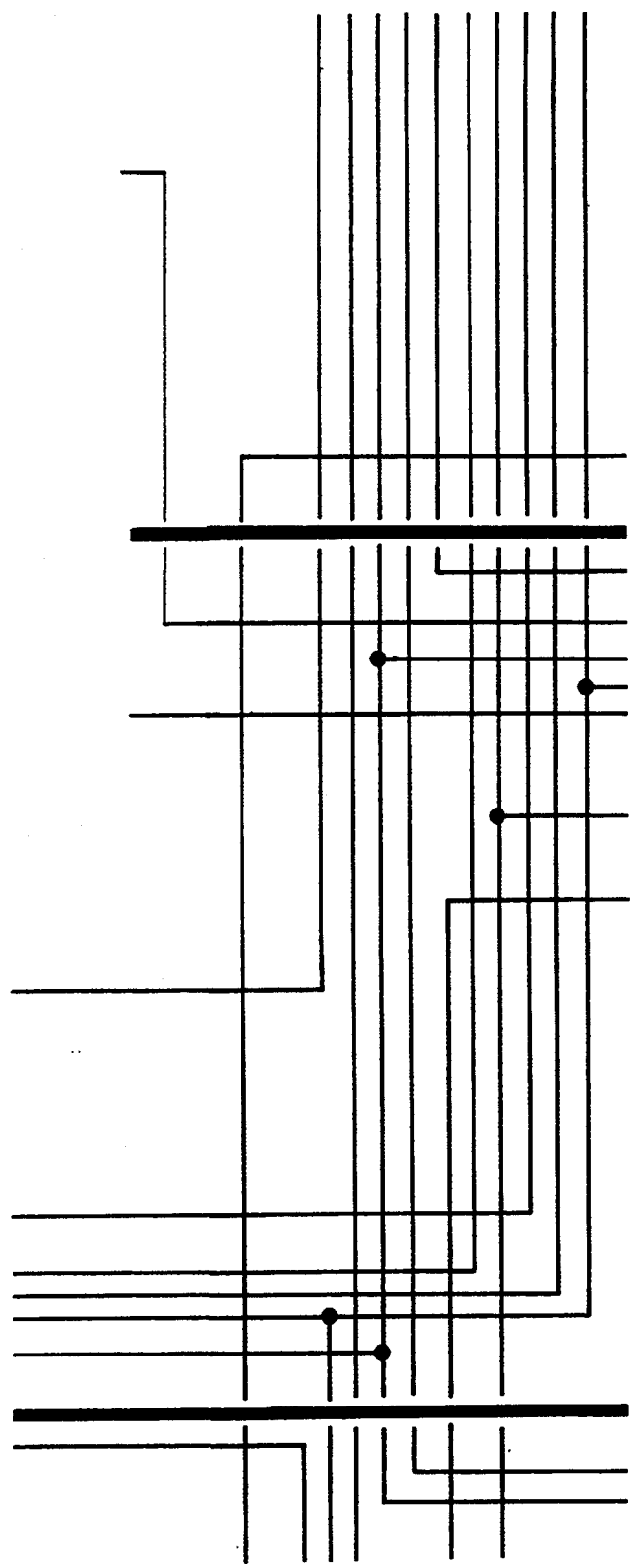
Figure 2H:
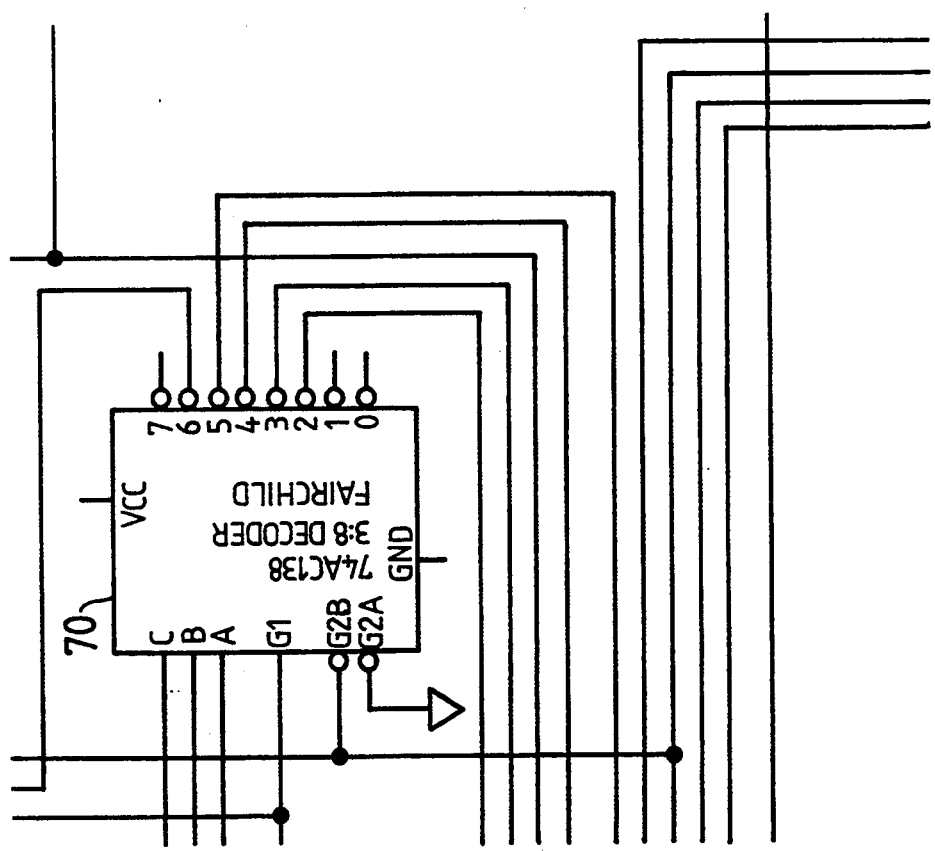
Figure 2I:
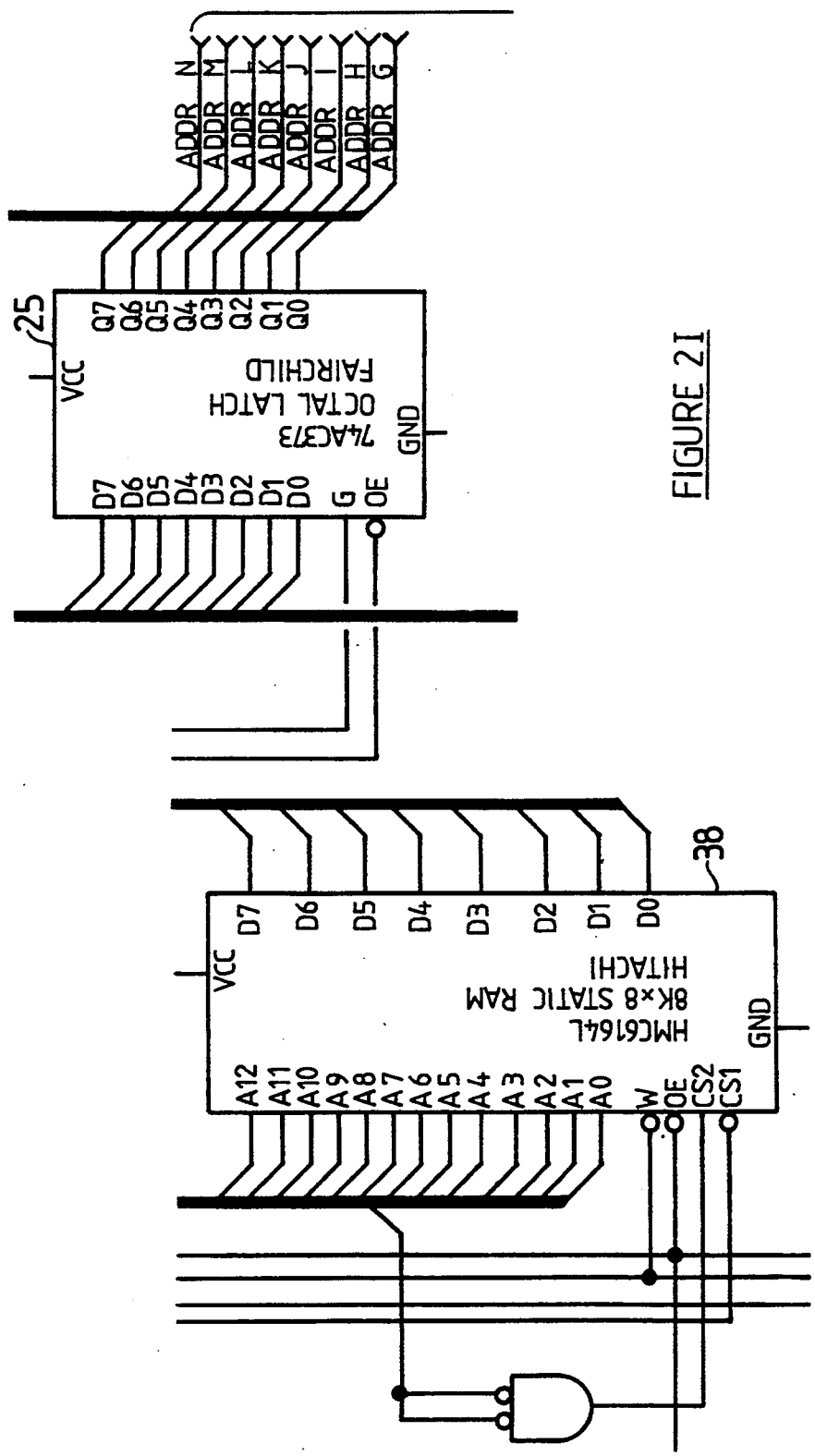
Figure 2J:
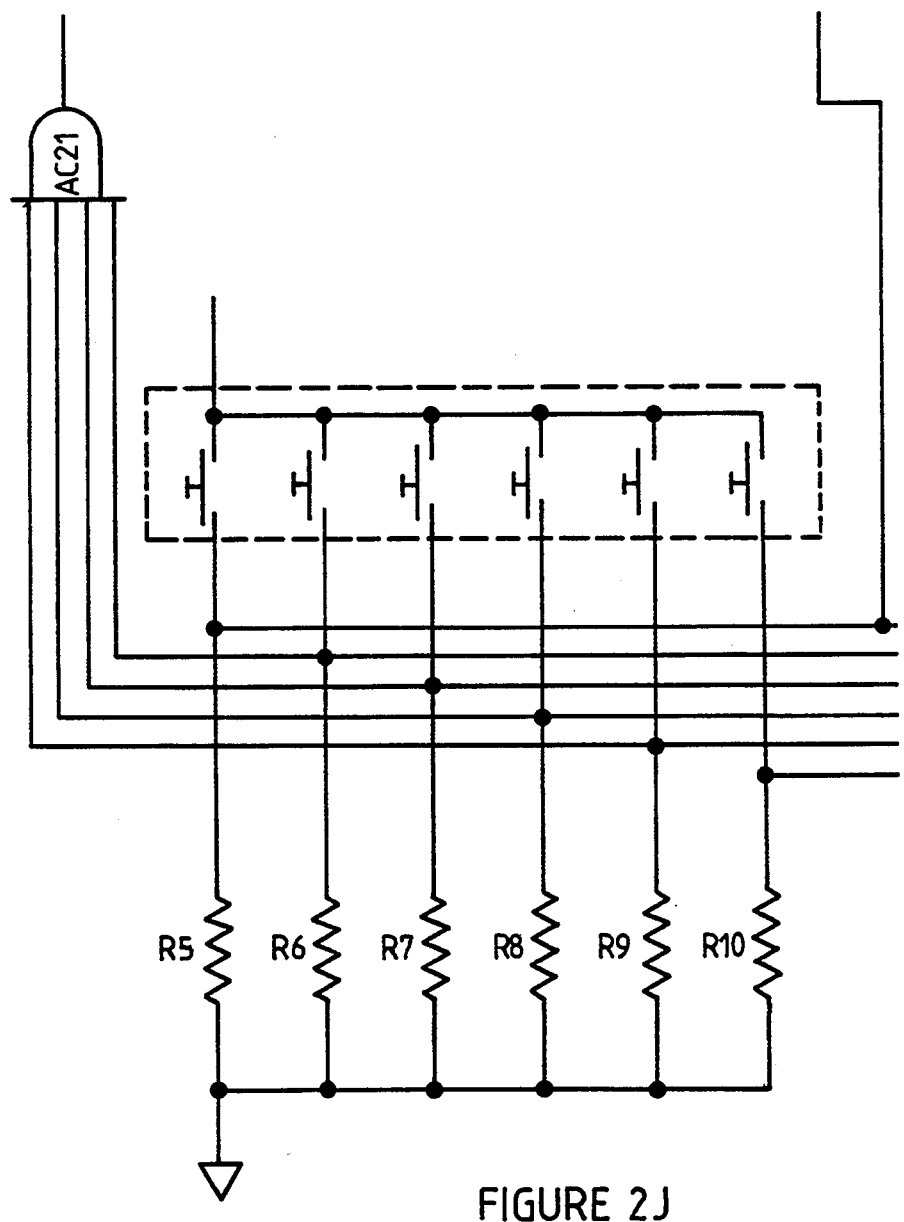
Figure 2K:
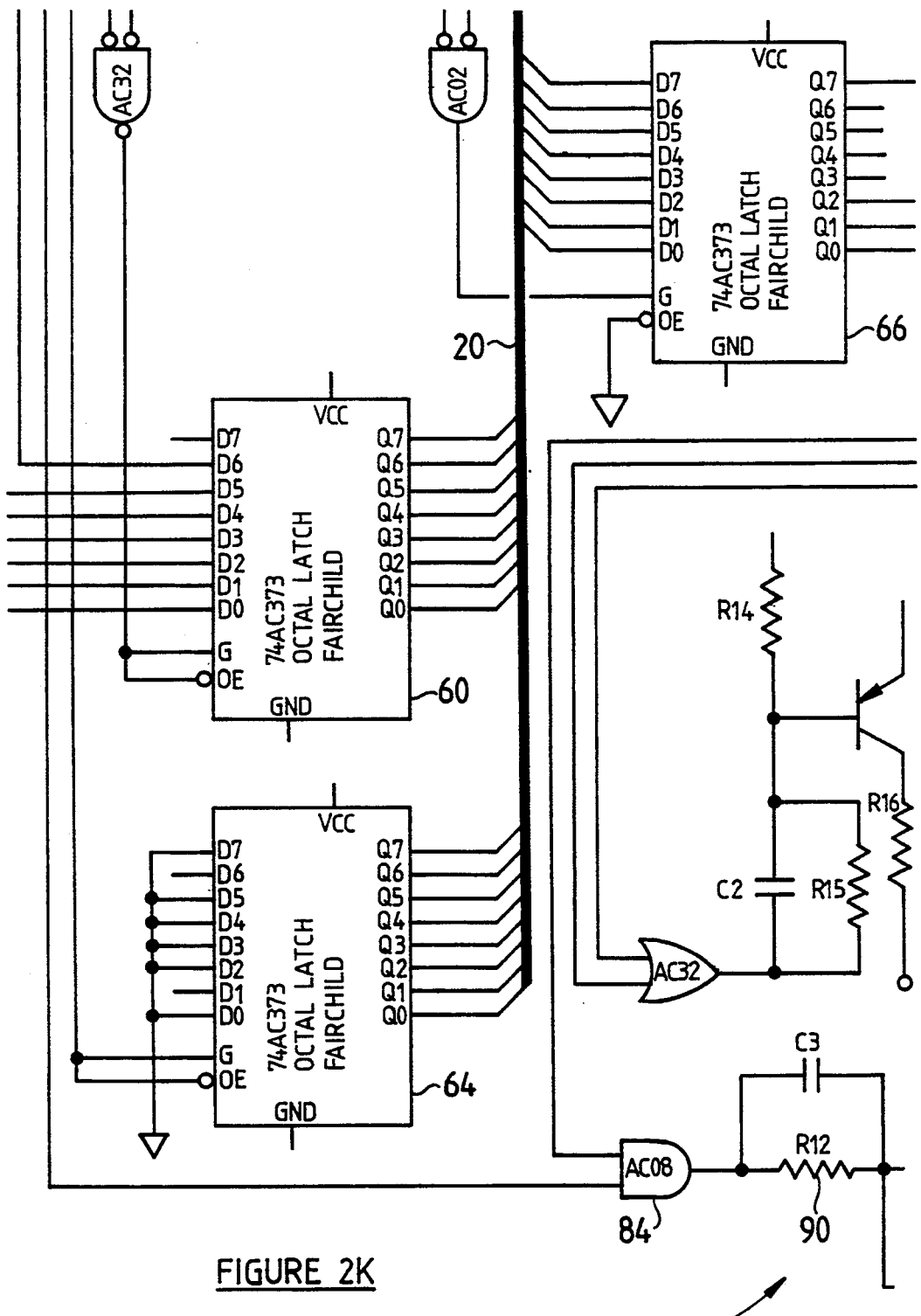
Figure 2L:
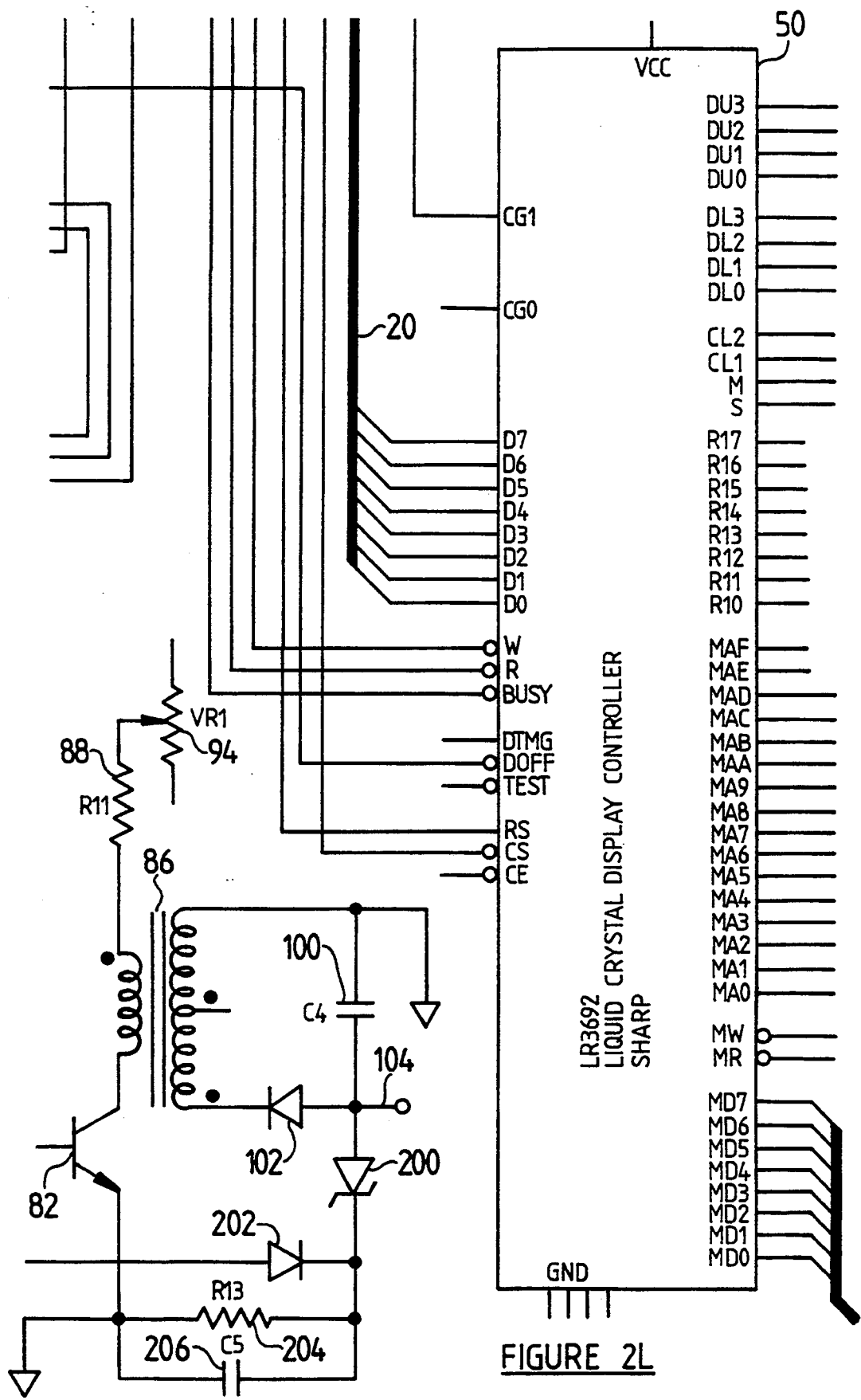
Figure 2M:
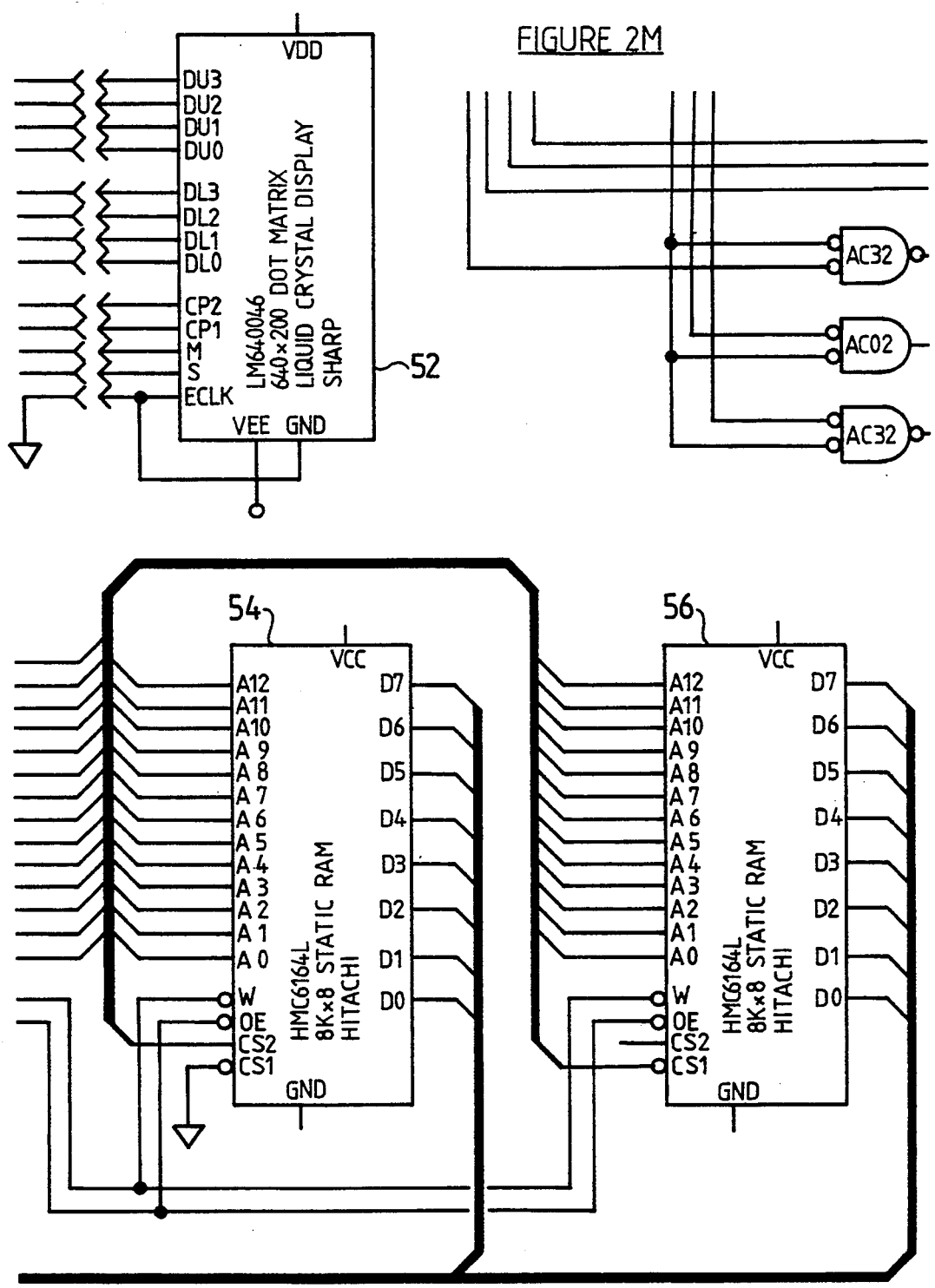
Figure 2N:
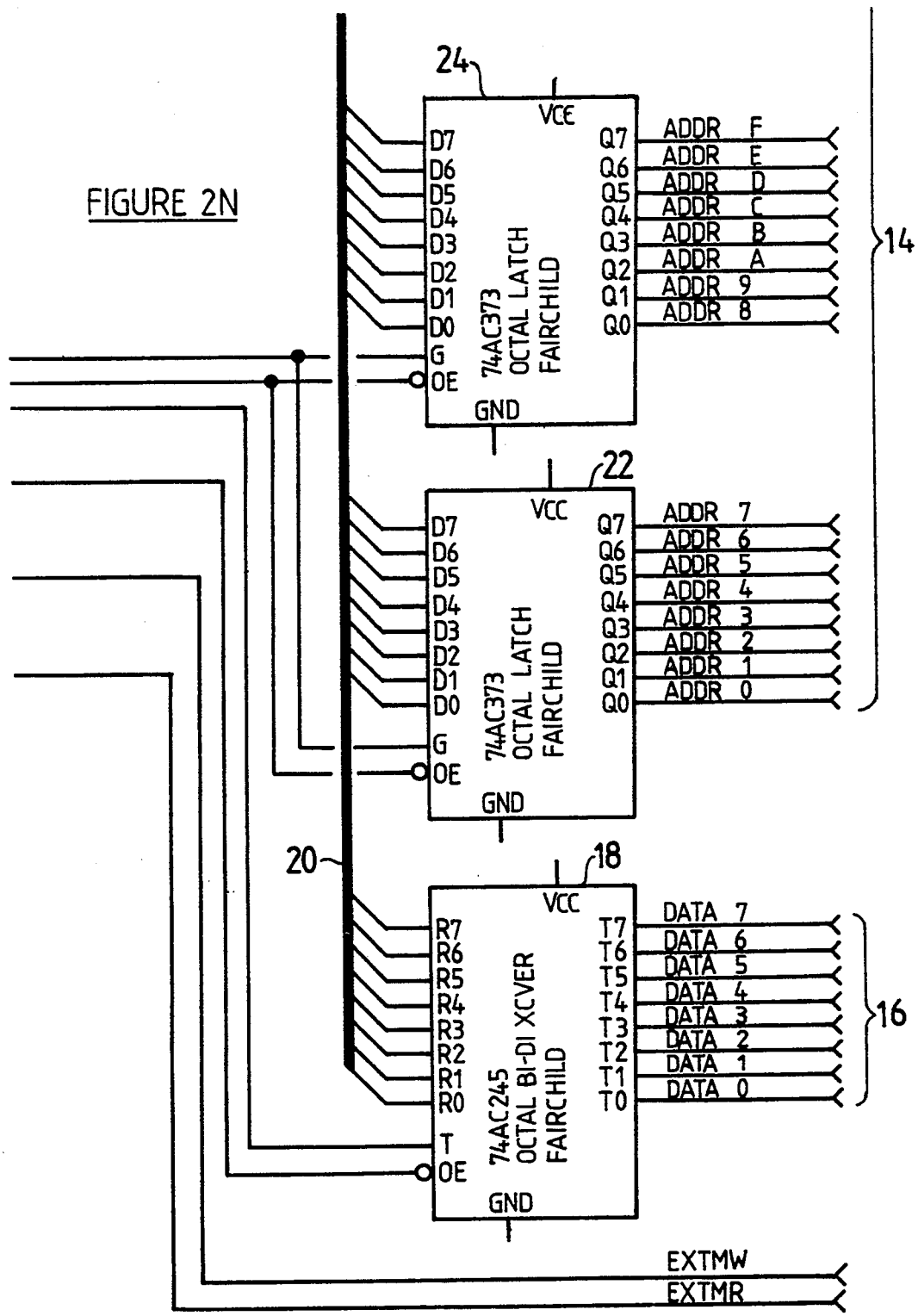
Figure 3:
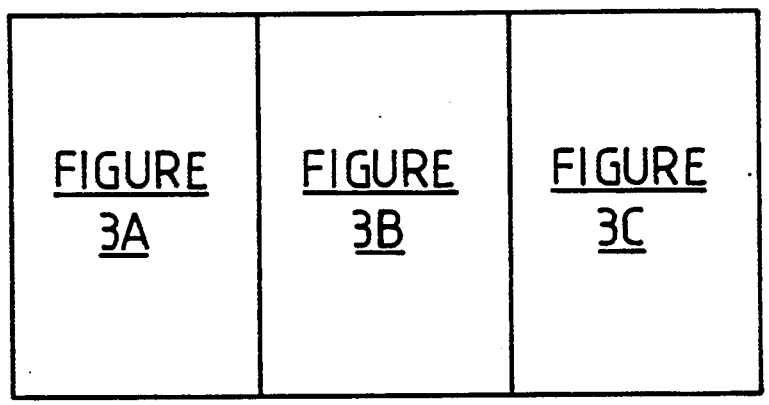
Figure 3A:
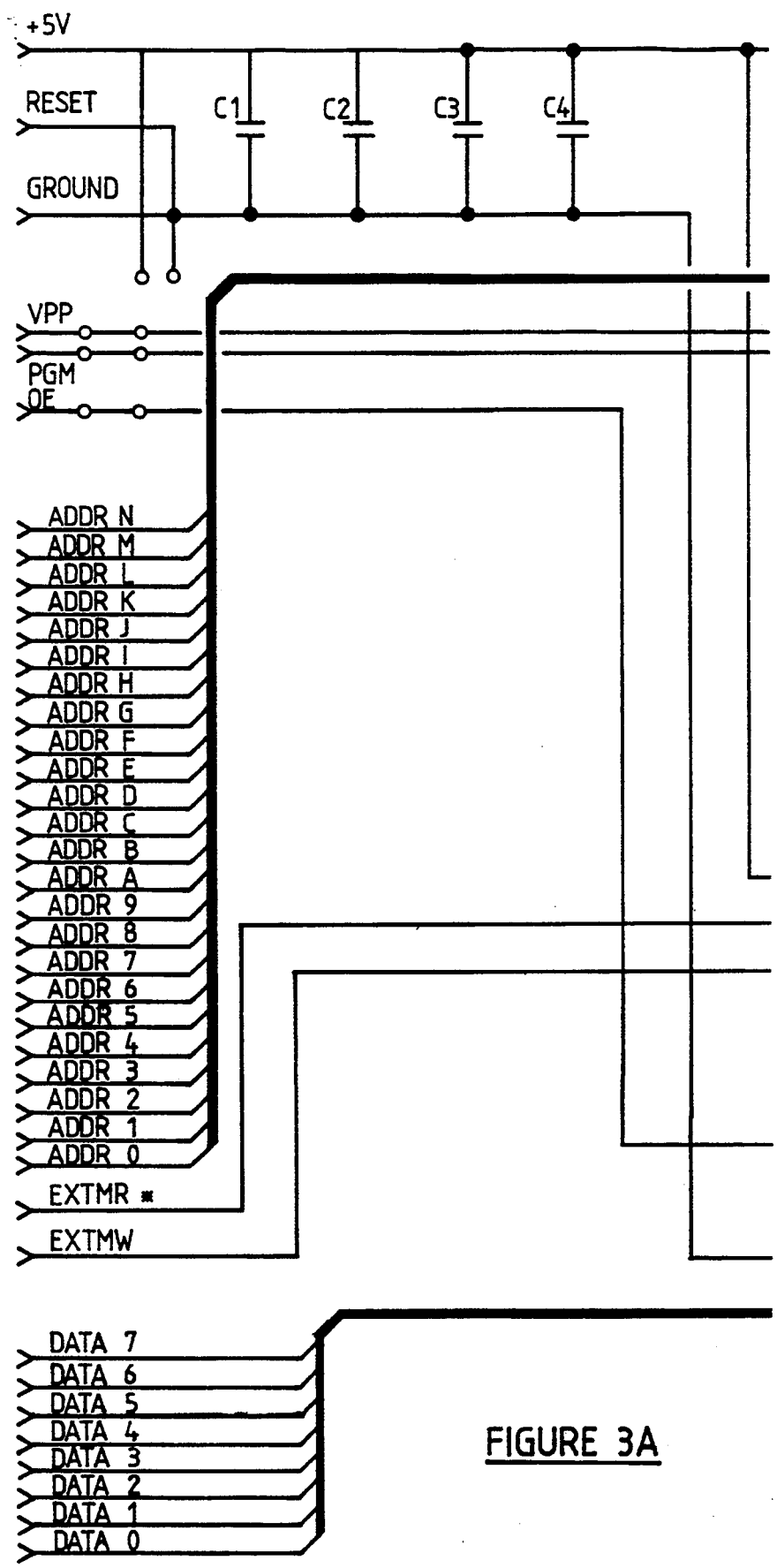
Figure 3B:
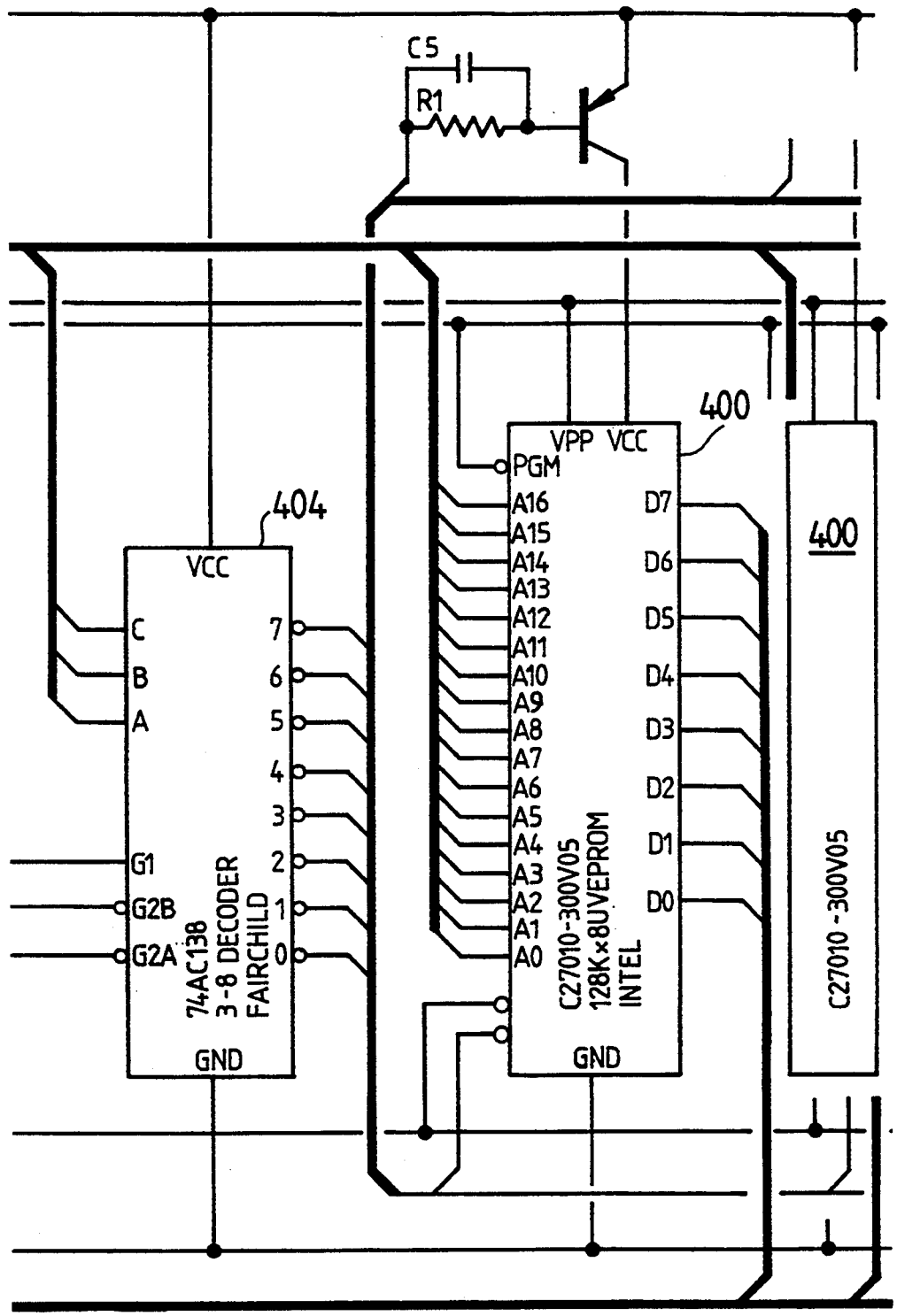
Figure 3C:
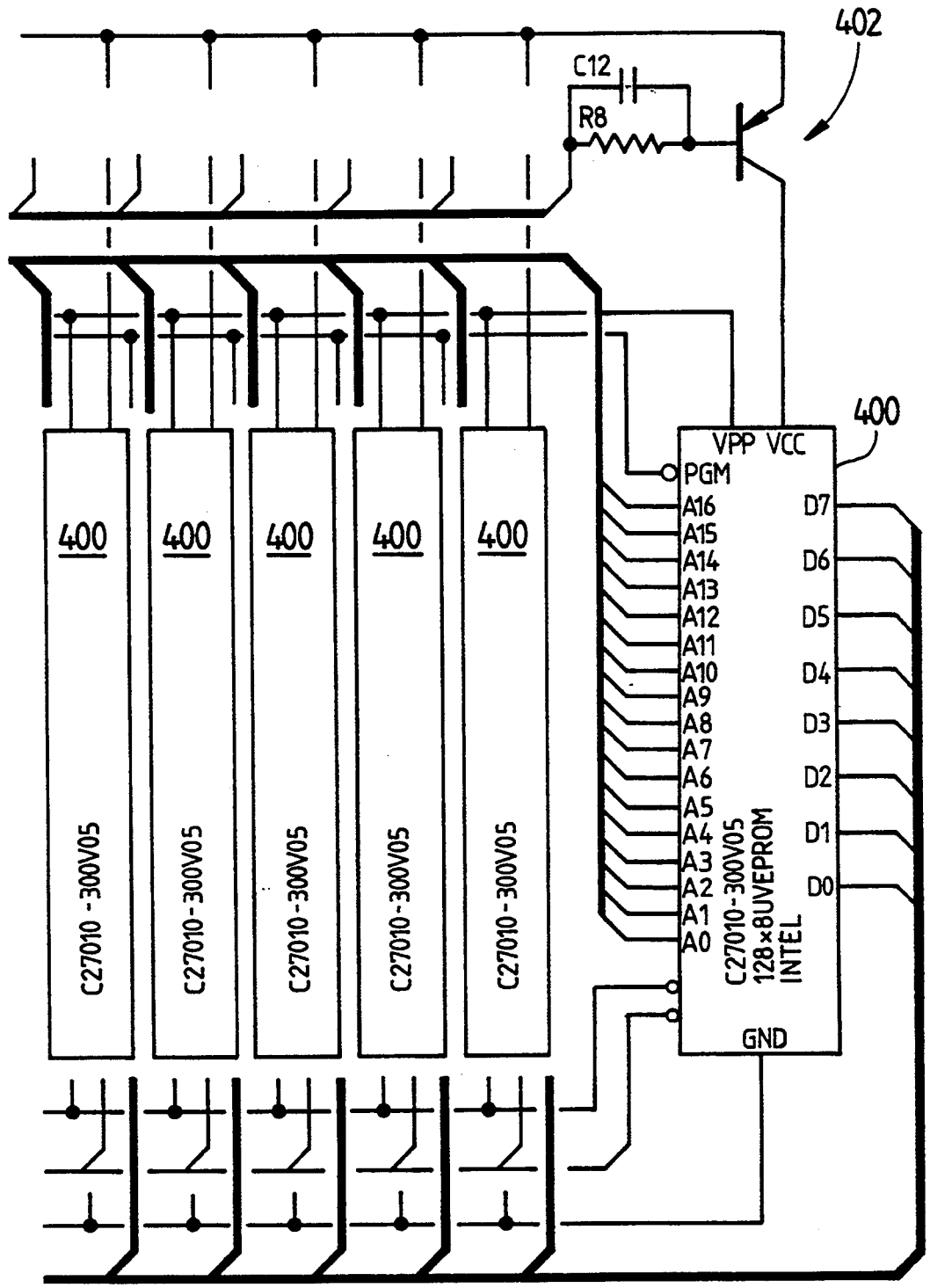

FIGS. 2A to 2N combine to form a circuit diagram of a text processing circuit;

FIG. 3 is a diagram illustrating how FIGS. 3A to 3C relate to one another;

FIGS. 3A to 3C combine to form a circuit diagram of a memory circuit.

Figures 4A, 4B:
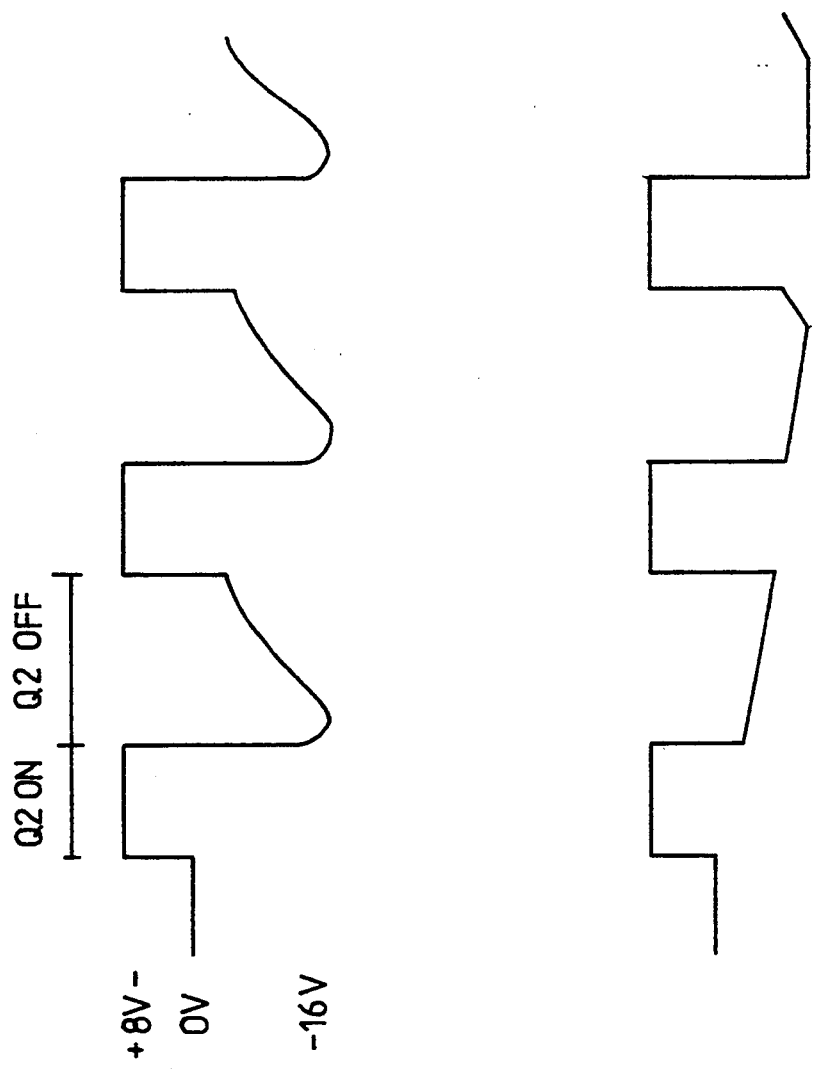

FIG. 4a is a first voltage waveform diagram;

FIG. 4b is a second voltage waveform diagram; and

Figure 5:
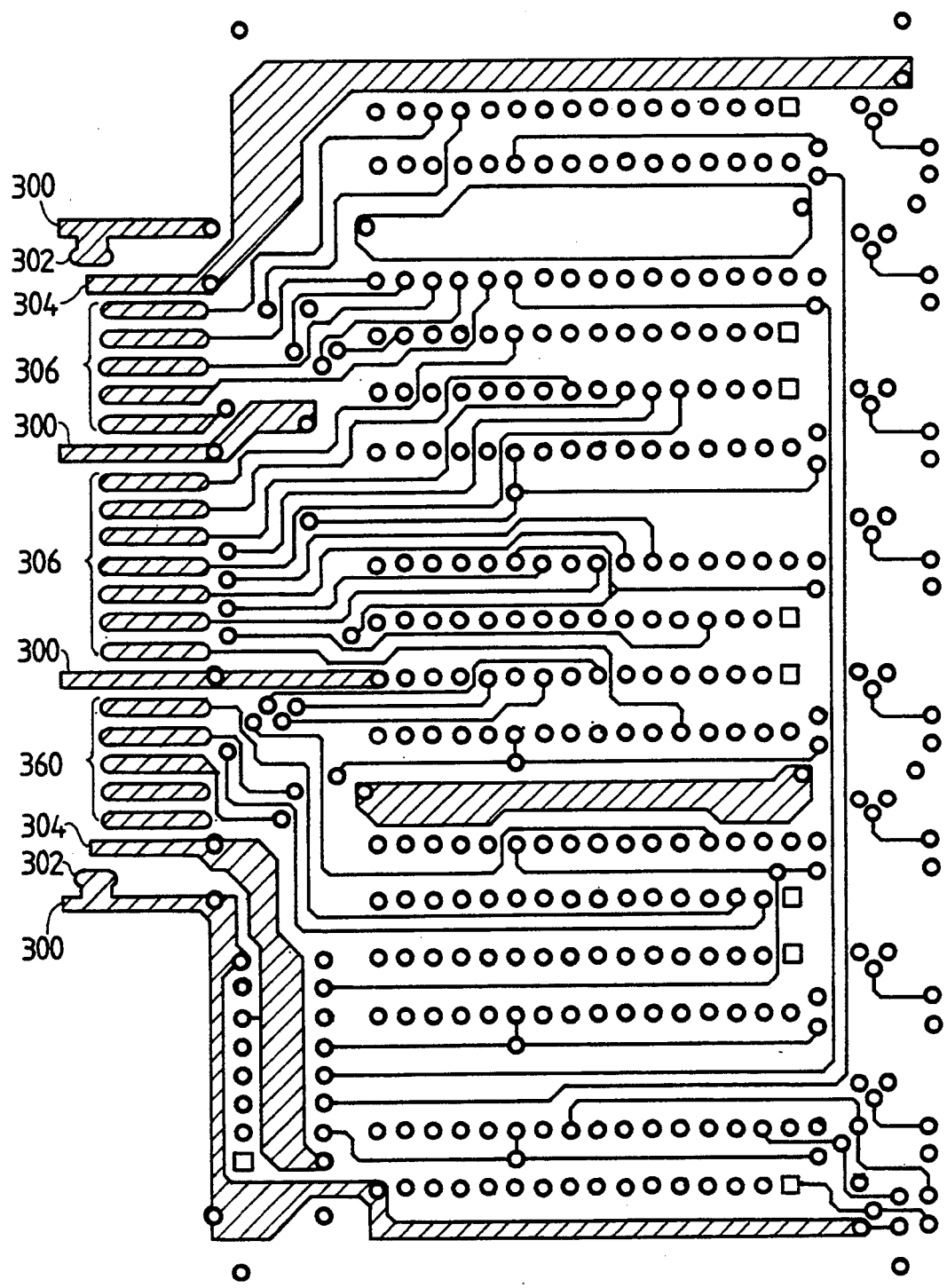

FIG. 5 is a plan view of part of the printed circuit layout of the memory circuit.

First, the basic features of a method of processing text in order to store the text in a relatively small amount of memory space, which is applicable to any text comprising words, is described and secondly an implementation of the method that has been specifically developed for compressing the King James version of the Bible is described.

The text to be processed or compressed is initially loaded or stored into a raw data file. The raw data file is then processed in order to produce a second raw data file which comprises an ordered list of the unique words (i.e. those which are distinctive) which occur in the text. The words are also grouped into the subsets of recognizable words (such as water, boat, pen, etc.) symbols (?, &, 3, etc.) and special action units (such as end of line, beginning of paragraph, etc.).

The second raw data file is processed and each unique word is allocated a two byte binary code known as a "token". The tokens comprise "printable tokens" (e.g. recognizable words, characters, symbols), "control tokens" (e.g. end of line, end of paragraph) used to control the display format, and "mode tokens" (e.g. next recognizable word starts with an upper case character) which affect the meaning of following tokens. Other types could also be included, for instance a token which means "call subroutine 22" which may be a display subroutine.

A dictionary file is created which matches tokens with the standard binary character code representation of their respective word. The text is then processed to replace the standard binary character code representation of each word in the text with their respective token, thereby creating a "token stream" which represents the text.

For example, applying the steps of the method to the passage "A horse! a horse! my kingdom for a horse!" would result in a token stream and dictionary file as follows (the decimal equivalent of the binary codes being shown).

|    |         | 61 2 19 | 50 2 19 50 | 10 8 | 15 2 19 50 63           |
|----|---------|---------|------------|------|-------------------------|
| 2  | a       | 15      | for        | 61·  | next char is a capital  |
| 8  | kingdom | 19      | horse      | 63   | end of line             |
| 10 | my      | 50      | !          |      |                         |

Preferably each printable token represents a respective word plus a space which occurs before the word. This eliminates the need for a token representative of the space character and as most printable words in a text have a space before the word, this represents a substantial saving in memory space in itself. If necessary a token may be included which represents "do not place a space before the next word".

Segment pointers may also be included in the token stream in order to point to selected positions in the text such as the beginning of a chapter. If segment pointers are included particular attention should be paid to them in order to ensure they still point to a desired area of text after the token stream is manipulated.

The token stream representation of the text is further compressed by replacing pairs of adjacent tokens which occur a predetermined number of times in the stream with a representative "phrase token". A record of which pair of tokens a given phrase token corresponds to is stored in a phrase table file. Each phrase token actually represents a particular phrase of words. A phrase token once inserted into the token stream may then be combined with adjacent word or phrase tokens and become a candidate for further reduction.

Assuming a token stream comprises n tokens, n being an integer, the number of two token phrases or adjacent token pairs in the stream is n−1. If a two token phrase occurs t times in the token stream then by replacing the two token phrase with a single phrase token represents a memory space saving of t tokens, however, two tokens will need to be stored in memory space in the phrase table file, provided the binary code for the new phrase token is used as an index to the phrase table. This produces a memory space saving of t−2 tokens. Hence, to produce further memory space savings only two token phrases which occur more than two times in the token stream are reduced to a single phrase token.

The process of reducing two token phrases to single phrase tokens also requires further considerations because all the phrases overlap and reducing a two token phrase affects the tally of adjacent overlapping phrases. For example with the sub-phrase "my kingdom for a", which has the token representation 10 8 15 2, if the two word phrase "my kingdom" is reduced to a single token phrase representation then this would reduce the tally of occurrences of the phrase "kingdom for" by one. Also if the "my kingdom" phrase occurs say 3 times in a stream and the phrase "kingdom for" occurs 15 times and the "my kingdom" phrase is reduced before the "kingdom for" phrase, then the memory space savings achieved by reducing the "kingdom for" phrase would be decreased.

To save as much memory space as possible when reducing two token phrases it is preferable to first obtain a tally of the number of occurrences of each two token phrase in the stream and then successively allocate phrase tokens to pairs of tokens starting from the pairs which occur most to the pairs which occur least, whilst ensuring that any two tokens which "clash" with previous two token phrases of higher tallies are not reduced. A two token phrase is said to clash with another two token phrase if the first token of the first phrase is the last token of the second phrase or if the last token of the first phrase is the first token of the second phrase.

In order to achieve the above, following generation of the word token stream, a hash table is created by hashing the two token binary code for each phrase in the stream and then storing, at the location of the hash table indicated by the hashing operation, the first token and second token of the phrase and a tally of the number of times the phrase has been hashed on processing the stream. For every phrase in the table which has a tally less than three, the tally is set to zero. All the phrases having tallies greater than two are then allocated a respective "phrase index".

The token stream is processed once the phrase indices have been allocated in order to produce a "phrase index stream" which is used in determining which phrases should be reduced and allocated a single token. In the phase index stream all phrases having tallies less than 3 are represented by a 0 and the remainder are represented by their allocated phrase index. Referring to our previous example A horse! a horse! my kingdom for a horse!

produces the standard token stream:

61 2 19 50 2 19 50 10 8 15 2 19 50 63

The phrase indices and tallies are as follows

| PHRASE | TALLY | PHRASE INDEX ALLOCATED |
|--------|-------|------------------------|
| 61 2   | 1     | 0                      |
| 2 19   | 3     | 1                      |
| 19 50  | 3     | 2                      |
| 50 2   | 1     | 0                      |
| 10 8   | 1     | 0                      |
| 8 15   | 1     | 0                      |
| 15 2   | 1     | 0                      |
| 50 63  | 1     | 0                      |

This produces a phrase index stream as follows 61 2 19 50 2 19 50 10 8 15 2 19 50 63
 0 1 2 0 1 2 0 0 0 0 1 2 0

As zero phrase indices are not of interest, multiple zeros can be collapsed down to 1 zero, making the phrase index stream 0 1 2 0 1 2 0 1 2 0

Each phrase index in the phrase index stream represents a two token phrase of interest.

A phrase tally file is created with the index to each record designated by a phrase index and each record contains the respective phrase, tally and "action field". The action field is used to indicate whether a phrase should be allocated a single phrase token, left untouched or removed because its tally has become less than three. The hash table is now no longer required. An ordered phrase index file is also created which comprises a successively ordered list of the phrase indices starting from the phrase index representing the phrase which occurs most down to the phrase index representing the phrase which occurs least. Using the ordered phrase index file, the action fields of each of the phrases in the phrase tally file are accessed and adjusted so as to indicate "leave it untouched" if the respective phrase clashes with a phrase occurring more frequently or "to reduce it" if the phrase does not clash with another phrase or "remove it" if the tally of the respective phrase has become less than three.

The phrase table file is created and phrase tokens are generated by performing the following steps:
1. Accessing the ordered phrase index file to obtain a phrase index (starting from the phrase index representing the phrase which occurs the most). Alternatively a phrase index is accessed by sequentially processing the phrase index stream as described hereinafter with reference to the previous example.
2. Accessing a record of the phrase tally file on the basis of the phrase index.
3.(a) If the action field for the accessed phrase of the record is "leave it untouched" then no processing takes place.
   (b) If the action field indicates that the phrase is to be reduced then the following happens:
      (i). The phrase index of the phrase is deleted from the phrase index stream and an entry is made in the phrase table which allocates binary code, or a phrase token, to the two tokens of the phrase.
      (ii). The neighbouring phrases in the stream have their tally decremented by one and if the decrement causes a tally to become less than three then the respective neighbouring phrase is marked for deletion by setting its action field to "remove it".

(iii). The first token of the phrase occurring before the accessed phrase in the stream together with the newly allocated phrase token form a new phrase. The newly allocated phrase token together with the second token of the succeeding phrase also form a new phrase. The new phrases are hashed into a small hash table in order to see if they have been found previously in the stream. If it is an entirely new phrase, it is placed in the phrase tally file and given a tally of one and if it has been found before then its tally in the phrase tally file is incremented. If any one of the neighbouring phrases is zero then no new phrases are created.

(iv). The phrase indices of the new phrases are inserted into the phrase index stream.

(c). If the action field indicates that the accessed phrase is to be removed the respective phrases indices in the stream are set to zero.

4. The small hash table is processed and all the new phrases having tallies less than three are removed.

5. The ordered phrase index file is then updated and is resorted so that the file indicates the correct phrase tally order.

6. If the ordered phrase index list still contains phrase indices then the process is repeated started from step one, yet if the phrase index stream is merely zero the the process is completed.

Once the above process has been completed the token stream is processed by replacing all of the two token phrases stored in the phrase table file with their respective phrase tokens. To avoid clashing the tokens should be replaced in the order in which they were allocated new phrases tokens or entered onto the phrase table file.

The process is continued until all of the phrases occurring more than twice have been reduced, or all of the available number of phrases indices have been allocated or all of the available memory space or tokens have been allocated.

In order to conserve phrase indices, whenever a two token phrase is removed or reduced its respective index is placed on a list which allows the index to be reused.

Following on from our previous example.
The phrase tally file is:

| Phrase index | Phrase | Tally |
|---|---|---|
| 1 | 2 19 | 3 |
| 2 | 19 50 | 3 |

The phrase index stream is:

0 1 2 0 1 2 0 1 2 0

The action fields would become:

| Phrase Index | Action |
|---|---|
| 1 | Reduce |
| 2 | Do nothing |

(The phrase of phrase index 2 cannot be reduced as it "clashes" with the phrase of phrase index 1)

The phrase 2 19 is to be reduced and a new token 101 is allocated to replace the phrase 2 19. As the phrase index field is being processed the following would happen.

| OUTPUT PHRASE INDEX STREAM | CURRENT PHRASE | INPUT PHRASE INDEX STREAM | ACTION | COMMENT |
|---|---|---|---|---|
|  | 0 | 1 2 0 1 2 0 1 2 0 |  | Zero is just copied |
| 0 | 1 | 2 0 1 2 0 1 2 0 | Reduce | * |
| 0 | 3 | 0 1 2 0 1 2 0 | Do nothing | Index 3 is do nothing so just copy it. |
| 03 | 0 | 1 2 0 1 2 0 |  | Copy zero. |
| 030 | 1 | 2 0 1 2 0 | Reduce | Ditto as above except we find index 3 = 101, 50 already exists so increment tally. |
| 030 | 3 | 0 1 2 0 | Do Nothing | Copy. |
| 0303 | 0 | 1 2 0 |  | Copy. |
| 03030 | 1 | 2 0 | Reduce | As Above. |
| 03030 | 3 | 0 |  | Copy. |
| 030303 | 0 |  |  | Copy. |
| 0303030 |  |  |  | Finished. |

*Its neighbors are 0 & 2. 0 is ignored. 2's tally is decremented to 2 and is therefore marked for deletion. A new phrase is created and allocated the index 3 = 101,50 with tally = 1. Phrase 1 is deleted and since the previous phrase is zero no output occurs.

The phrase index stream is now:

0 3 0 3 0 3 0

The phrase tally file is:

| Phrase index | Phrase | Tally |
|---|---|---|
| 3 | 101,50 | 3 |

The next iteration would see the phrase index stream as just: 0

The phrase tally file is empty and one more new token of say 102 would replace the phrase 101,50.

The resultant token stream representation of the passage would be:

61 102 102 10 8 15 102 63

Once the above process has been completed further compression of the token stream may be achieved by replacing the most common 16 bit phrase tokens by 8 bit tokens if token memory space is still unused. For every block of 256 unused tokens with a common most significant byte a common token may be represented by the byte which would otherwise signify one of the group, if the tokens were two byte tokens.

If this further compression step is employed consideration is required when decompressing the token stream as some of the tokens in the stream will be 8 bit and the remainder will be 16 bit.

The dictionary file may also be further compressed by sorting the binary code representation of the words in the dictionary file into lexicographic order and not storing the common prefixes of the words. All of the binary character code of the suffixes is appended and stored in one large array and each word in the dictionary file is represented by three fields, preferably of 5 bits each, which represent the length of the word, the length of the suffix and an offset which indicates the characters which must be retrieved from the array of suffixes in order to make up the prefix of the word.

An example of such a dictionary file is shown below.

| WORD | LENGTH | SUFFIX LENGTH | BACKWARDS POINTS |
|---|---|---|---|
| A | 1 | 1 | 0 |
| AND | 3 | 2 | 1 |
| ANY | 3 | 1 | 1 |
| ANYBODY | 7 | 4 | 1 |
| ANYONE | 6 | 3 | 2 |
| BE | 2 | 2 | 0 |
| BEAT | 4 | 2 | 1 |
| BEATNIK | 7 | 3 | 1 |
| BEATNIKS | 8 | 1 | 1 |
| BEATS | 5 | 1 | 3 |
| BEE | 3 | 1 | 5 |
| BEFORE | 6 | 4 | 6 |
| BEG | 3 | 1 | 7 |
| BEGGING | 7 | 4 | 1 |
| BEGIN | 5 | 2 | 2 |
| BEGINNING | 9 | 4 | 1 |
| BELL | 4 | 2 | 11 |
| BELT | 4 | 1 | 1 |
| BOAT | 4 | 3 | 13 |

The suffix array would be:
ANDYBODYONEBEATNIKSSEFOREGGINGINNINGLLTOAT
|                                         |
1                                         2

Characters of a word are obtained by first adding all of the suffix lengths of the previous words in order to indicate the position in the array where the suffix of the word is stored and then chaining back down the array as far as possible using the offset, or backwards points, field in order to obtain characters, from which the prefix of the word is determined using the length field of the word.

In order to decompress or expand the token stream representation of the text until suitable binary code is obtained for displaying characters of the text, each token to be decompressed is used as an index into the phrase table file thereby obtaining the two tokens that make up the token indexing the file. These tokens are used to recursively access the phrase table file until a token representing a word is found. The word token is then used to access the dictionary file so as to obtain a suitable binary code which can be used to display the word.

When a word or phrase is searched for in the compressed token stream the phrase table file and/or the dictionary file are accessed in order to determine all of the tokens which represent the word or phrase. These tokens are then searched for in the stream and each location in the stream is marked so that each corresponding part of the text can be decompressed and displayed as desired by a user.

If 8 bit tokens are used then decompression must start from a position known to be the start of the token and cannot be done in the reverse direction (i.e. is the previous byte an 8 bit token or the second half of a 16 bit token). To decompress in reverse, a known starting position in the reverse direction must be used and forward decompression started from there until the position of interest is reached.

When the text is converted into a compressed token stream format all formatting information is lost (i.e. multiple spaces, end of lines, page breaks, tabs, nicely laid out tables of information, etc.) unless a user explicitly defines tokens for these formatting characters. If tokens are defined then the text should be able to be compressed and decompressed back to its original form. The problem with formatting information is that it can add significantly to the size of a token stream which means that the compression will not be as great. One solution is to leave this formatting information out, which will allow good compression and to reformat the file during decompression using a predetermined format. The output file, however, will not be a duplicate file. Decompression will be specific to the type of formatting which is selected. A compromise between memory space and functionality has to be decided upon.

When two level variable byte encoding is used (i.e. 8 bit and 16 bit tokens) segment pointers should be included in the token stream as they assist in decompression by supplying reliable offsets into the token stream where forward decompression may start.

The above methods have been used to compress the King James version of the Bible with a compression ratio of 4.2:1.

The following describes a specific embodiment which compresses the King James version of the bible. The steps are performed by a number of programs, which are shown encased in "bubbles" in FIG. 1.

Figure 1:
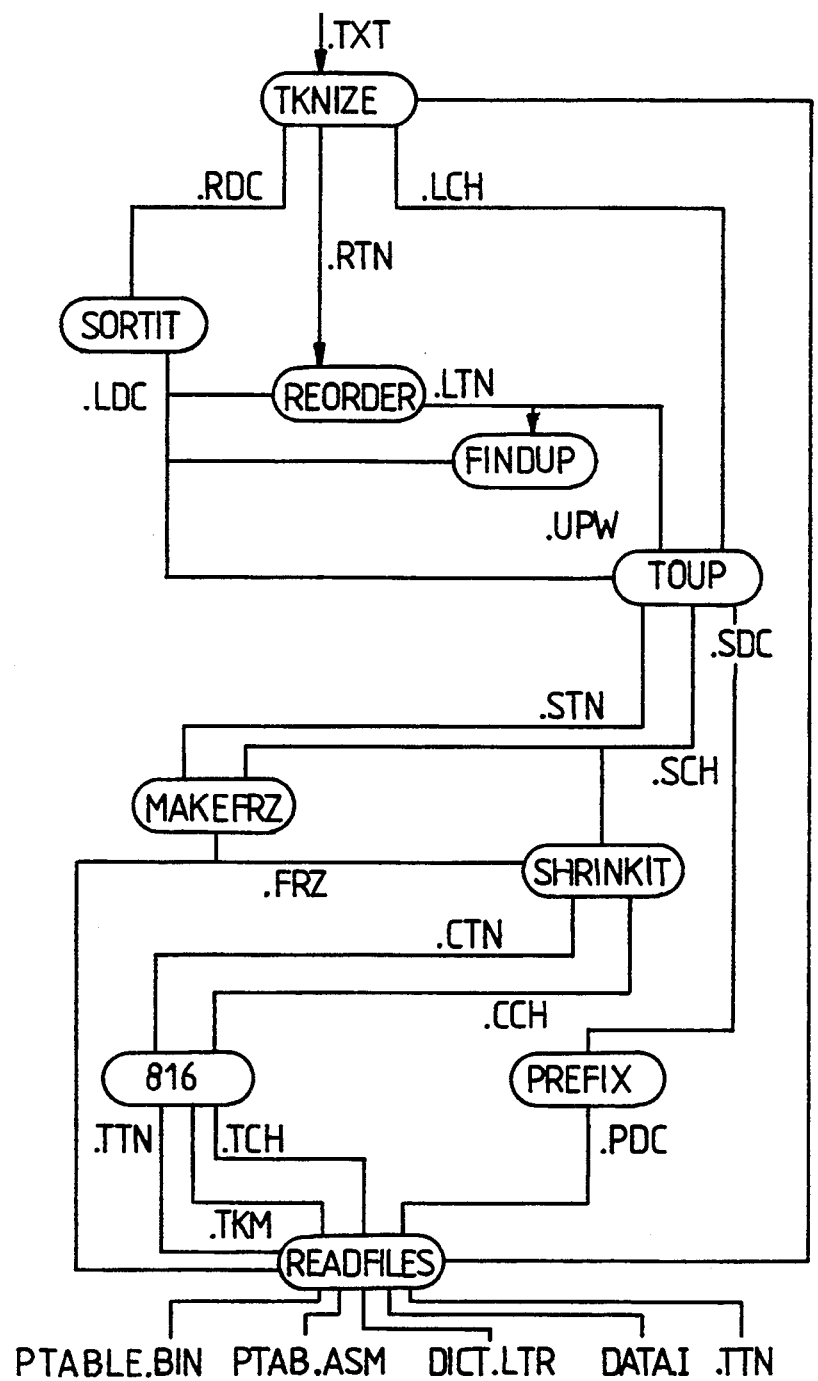
FIG. 1 is a flow diagram of a method of processing text/according to the present invention.

The files referred to in FIG. 1 are as follows:

| | |
|---|---|
| .TXT- | raw text |
| .RTN- | raw tokens (i.e. a token for each word in the text) |
| .RDC- | randomly ordered dictionary (maps tokens to words) |
| .LCH- | segment pointers (offset into .RTN of chapter headings) |
| .LDC- | mapping of new tokens to old after the dictionary is sorted. |
| .LTN | output produced from using .LDC to translate .RTN. |
| .UPW- | list of words that never have a lower case first character. |
| .STN- | .LTN with upshifts removed from before words mentioned in .UPW. |
| .SDC- | new dictionary adding a case field made from .LDC and .UPW. |
| .SCH | new segment pointers after applying .UPW. |
| .FRZ- | phrase table |
| .CTN- | compressed token file (now contains phrase and word tokens) |
| .CHH- | new segment pointers after phrase compression. |
| .TTN- | compressed token file after optimisation using "two level variable byte encoding" algorithm. |
| .TCH- | new segment pointers after optimisation compression. |
| .TKM- | list of 16 bit tokens corresponding to the 8 bit replacements. |
| .PDC- | compressed dictionary. |
| PTABLE.BIN- | binary phrase table. |

| | -continued |
|---|---|
| PTAB.ASM- | phrase table in assembly code form. |
| DICT.LTR- | suffix array of dictionary. |
| DATA.I- | other dictionary information and segment pointers. |

For the bible the units of information are considered to be English words, printable symbols (such as full stops, question marks, etc.) and three special mode tokens for "next character is upper case", "next word is upper case" and "next word does not begin with a space". Five "control tokens" are also used to mark "the beginning of a verse", "the beginning of a chapter", "the beginning of a book", "the position of a required space", and "the position of a required line break". Spaces and other type setting information (such as end of line) are not allocated tokens as the reformating programme is assumed to re-typeset text, add spaces before words and count and convert "verse marks" and "chapter marks" into text of an appropriate format.

The program TKNIZE.C converts the text to a word token stream or a "standard format" token file. It also produces a randomly ordered dictionary file, a list of pointers to chapter headings and a list of pointers to book headings. The dictionary is then sorted into lexicographic order by a program SORTIT.C which also allocates new tokens to the previously generated tokens once the dictionary has been sorted. The token stream is then translated from the old tokens to the new tokens by a program REORDER.C.

Program FINDUP.C scans the token stream or file for occurrences of word tokens that are always preceded by a "next character is upper case" token. A program TOUP.C uses this to adjust these words in the dictionary so that they are discernable from those which do not have upper case first letters, thereby removing the need for the "next character is upper case" tokens.

Compression of the token stream word file, as described previously is performed by two programs. The first program MAKEFRZ.C produces a phrase table file and a second program SHRINKIT.C performs the final internative reduction passes over the standard token stream in order to produce the compressed token stream.

Two level variable byte encoding is used and implemented by a program 816.C. The dictionary is also compressed, as described previously using a program PREFIX.C.

Decompression of the compressed text is performed as described previously. The first token of every chapter is stored in an array to provide starting points for decompression. If a user wishes to move backwards, decompression is started from the previous chapter boundary. A cache of pointers to tokens on line boundaries is kept so as to facilitate decompression. Formatting information is not included in the token stream and the decompression program reformats the text before displaying it. This allows a user to change the display format from single screen to split screen format without altering the stored compressed text.

All of the above mentioned programs recompute segment pointers whenever the token stream is manipulated and the program READFILES.C reads in most of the files created by the above programs and produces C code and binary files for compiling and burning into read only memory (ROM).

The source code for the text compression programs described above, together with a COMMON.H definition file, is detailed in pages 39 to 100.

A text processing circuit, as shown in FIG. 2 FIGS. 2A, to 2N), for decompressing, searching, processing and displaying text comprises a M80C88 microprocessor 10 for running decompressing, searching and display programs. The processor 10 has a 20 bit address and 8 bit data bus 12 with the data bus sharing the lower lines of the address bus.

The compressed text, dictionary file and phrase table file are stored, together with a program for decompressing and processing the text, in eight 128 kbyte $\times 8$ C27010-300V05 UVEPROM's 400, as shown in FIGS. 3A to 3C, which are housed in a module which can be connected and disconnected from the text processing circuit. The module comprises a memory circuit 402, as shown in FIGS. 3A to 3C. External memory housed in the module is accessed using a 74AC138 3/8 decoder 404 illustrated in FIG. 3B.

The module is connectable to the text processing circuit via the 24 bit address bus 14 and 8 bit data bus 16, shown in FIG. 2N.

The eight data lines 16 are connected to a 74AC245 octal bidirectional transmitter receiver 18 which is also connected to a main address and data bus 20 connected to, inter alia, the address and data bus 12 of the microprocessor 10. The least significant bytes of the address lines 14 are connected to two respective 74AC373 8 bit latches 22 and 24 which in turn are also connected to the main bus 20.

The most significant byte of the address lines 14 is connected in parallel to four 74AC373 8 bit latches 25 which form a bank register file 26 that enables bank switching to be performed with respect to the external memory contained in the module. During execution of code stored in the external memory, each register or latch 25 in the bank register file 26 contains a different upper address byte and the processor 10 can select as desired a respective register 25 and jump to the corresponding area of external memory. The external memory is divided up into four areas, one containing the compressed text, the second containing the dictionary file, the third containing the phrase table file and the fourth containing the code for executing the display and processing programs. The bank register file 26 allows the processor 10 to move from one area of memory to the next whilst retaining an indication of the position at which the processor 10 left the first area of memory. The bank register file 26 also allows the 20 bit address of microprocessor 10 to address an external memory space of 16 million memory locations, wherein preferably each location is capable of storing 8 bits, i.e. a byte. The processor 10 includes four segment registers which may correspond to a respective one of the 8 bit registers 25 in the bank register file 26.

The text processing circuit also comprises a reset circuit 30, as shown in FIG. 2A, which is configured so that whenever the module, containing the external memory, is plugged into or connected to the text processing circuit power is supplied to the text processing circuit and the microprocessor 10 is reset. A M82C84A clock generator 32 is provided to supply a continuous clock signal to the processor 10, together with reset signal when the reset circuit 30 detects connection of the module.

Once reset, the processor 10 accesses a diagnostic and initialisation program which is stored in an NMC27C256 UVEPROM 34. Upon completing the diagnostic and initialisation program the processor 10 then accesses the external memory and begins running the decompressing, searching and display program stored in the external memory.

The text processing circuit also includes two HMC6164L static RAMs 36 and 38 for storing any volatile variables which are used during execution of the program stored in the external memory. The variables include pointers to pieces of text and information which needs to be stored in stacks and queues.

The EPROM 34 and the RAMs 36 and 38 are accessed by the processor 10 via a sub-address bus 40 which is connected to three 74AC373 8 bit latches 42, 44 and 46 which are used to store the current address outputted by the processor 10 whilst the main bus 20 is carrying data.

To display a selected piece of text the processor 10 accesses the compressed text stored in the external memory and decompresses the compressed text using instructions received from the compression program. Once the text is decompressed the processor 10 accesses a text font, which is also housed in the module, so as to obtain the dot matrix pattern for each character in the decompressed text. The processor 10 then outputs the dot matrix pattern for each character of the text to a LR3692 liquid crystal display controller 50 and instructs the controller 50 to display the piece of text on a LM640046 liquid crystal display 52.

The text processing circuit also includes two further HMC6164L static RAMs 54 and 56 connected to the liquid crystal display controller 50 which act as image memories. The image memories 54 and 56 store the dot matrix pattern being displayed by the liquid crystal display 52 so that the display 52 can be continually refreshed whilst the processor 10 accesses the external memory or other units of the text processing circuit.

The formatting of the display on the LCD 52 is controlled by the controller 50 and the microprocessor 10.

Control of the display by a user is effected using the switches S0-S5, shown in FIG. 2J. When the processor 10 executes the program in the external memory the display generated by the LCD 52 includes a number of menu items which represent commands by which a user may control the display of text. A cursor appears on the display and switches S1-S4 allow a user to move the cursor so as to select a desired menu item or a passage or word in the displayed text. The switch S0 when depressed instructs the processor to execute the program option represented by selected menu item and switch S5 when depressed halts the execution of any program option selected and allows the user to select a new option. The menu items represent all display, searching and text marking options which the program stored in the external memory allows.

The text processing circuit also includes a 74AC373 button register, or latch, 60 which stores the status of the switches S0-S5 and is connected to the processor 10 via the main bus 20. The button register 60 allows the processor 10 to determine the status of the switches S0-S5 desired without being affected by instantaneous changes in the switch states. The text processing circuit also has a MC146818 real time clock circuit 62 which controls all events which are time dependent. These events include turning off the power to high power consumption units, such as the LCD controller 50 and the external memory, when none of the switches S0-S5 are depressed for five minutes, and instructing the button register 60 to read in the status of the switches every one fifth of a second. The real time clock circuit 62 effectively saves power by allowing the processor 10 to enter an idle mode when the circuit 62 is monitoring time dependent events, instead of the processor 10 executing a series of program loops to determine the expiration of time.

An 74AC373 interrupt register, or latch, 64 is provided to pass a predetermined code to the processor 10 whenever the real time clock 62 interrupts the processor 10 so that the processor 10 is aware that the real time clock circuit 62 has instructed the interruption. A 74AC373 power switch register, or latch, 66 is also included in the text processing circuit to store and output the instructions which cut power to the high power consumption units. The power switch register 66 is connected to the main bus 20 and receives instructions from the processor 10 in response to interruptions by the real time clock circuit 62.

So the processor 10 can access the various areas of memory in the text processing circuit and in the module, together with the various I/O devices, the text processing circuit includes a 74AC138 3/8 decoder 70 and three 74AC139 2/4 decoders 72, 74 and 76 as shown in FIG. 2D and 2H. All of the memory associated with the text processing circuit is divided into four parts as follows. The first quarter is allocated to the EPROM 34 containing the diagnostic and initilization programs. The next two quarters are allocated to the external memory in the module and the last quarter is allocated to the RAMs 36 and 38 for storing volatile variables. The three 2/4 decoders 72, 74 and 76 are used to select one of the quadrants of memory and select one of the four registers 25 of the bank register file 26 when the external memory is selected. The remaining 3/8 decoder 70 is used to select I/O devices accessed by processor 10, such as the real time clock circuit 62, the LCD controller 50, the button register 60 and the registers 25 of the bank register file 26 when data is written to the registers 25.

The text processing circuit also includes a DC to DC converter 80 which converts a +5 volt DC supply to a −12 volt DC voltage for supply to the liquid crystal display 52. The converter 80 is configured so that the LCD 52 only draws a load current of 1 to 2 mA from the converter 80.

The converter 80 comprises a transistor 82 which has its base current supplied from the output of an AND gate 84 and has the primary of a transformer 86 and a resistor 88, connected in series, as its load. The AND gate 84 receives a clock pulse from the clock generator 32 and passes the clock pulse through a resistor 90 to the base of the transistor 82 whenever the other input of the AND gate 84 is high. The other input of the AND gate 84 is connected to an output of the power switch register 66 and this input only goes low when power is to be cut to all high power consumption units of the text processing circuit. High clock pulses passed to the transistor 82 turn the transistor on and low pulses turn the transistor 82 off. A capacitor 92 connected in parallel with the resistor 90 is provided to increase the switching speed of the transistor 82 by increasing the base drive of the transistor 82. An important parameter is the speed with which the transistor 82 turns off, which will come apparent from the following. As a result, the transistor 82 is chosen to have a low storage time and a fast turn off time. It is also chosen to have a high gain. Given a minimum $\beta$, resistor 90 is chosen to keep the transistor 82 at the edge of saturation when the transistor 82 is on. The capacitor 92 is also chosen so that the RC time constant of the capacitor 92 and resistor 90 is such that the current of the capacitor 92 decays to almost zero at the end of positive or negative clock pulses. The time constant is chosen to be approximately 86 nanoseconds.

When the transistor 82 is turned on, current is drawn through the primary winding of the transformer 86, which induces a magnetic field in the primary inductance. The induced magnetic field effectively represents a current i as governed by the equation $E = L.di/dt$, where L represents the inductance of the primary and E represents the voltage drop across the primary. The voltage E also varies with time in accordance with the voltage drop which occurs across the resistor 88 and a potentiometer 94, which is connected to a 5 volt supply and has its wiper connected to the resistor 88.

When the transistor 82 is suddenly switched off the current effectively stored in the transformer 86 produces a large negative voltage pulse on the secondary winding of the transformer 86. FIG. 2L shows a 2:1 transformer, however, a 3:1 transformer may be used. With no load on the secondary winding the secondary voltage would have a waveform as shown in FIG. 4a.

However, a capacitor 100 and a diode 102 are connected to the secondary winding, as shown in FIG. 2L. The negative pulses generated on the secondary winding cause the diode 102 to conduct thereby charging the capacitor 100 towards a negative voltage. The capacitor 100 is selected as a large capacitor due to the transient nature of the load drawn by the LCD 52, which is connected to the converter 80 at the point of connection 104 of the capacitor 100 and the diode 102. As a result, the negative pulses on the secondary winding of the transformer 86 are "clipped", with the portion of the current which would have produced a negative peak being used instead to charge the capacitor 100. Therefore the waveform produced is as shown in FIG. 4b. An equilibrium is reached when the peaks of the negative pulses supply the total current required by the LCD 52. This ensures that the capacitor 100 is continually charged at approximately −12 volts. The actual voltage may be varied by adjusting the potentiometer 94, which controls the contrast and brightness of the LCD 52. The resistor 88 is included to limit the current through the transistor 82 in the event that the potentiometer 94 is inadvertently adjusted so as to present a resistance of zero ohms.

As a negative voltage greater than −15 volts would result in damage of the LCD 52, zener diode 200, a diode 202, a resistance 204 and a capacitance 206, connected as shown in FIG. 2c, have been included in the converter 80 so as to limit the range of the negative voltage. This limitation could be achieved by some form of clamping circuit which would shunt the excess voltage stored in capacitor 100 to ground, however, this would result in the converter 80 having a higher power consumption. The configuration shown in FIG. 2c was selected to minimize power consumption, in particular the current drawn by the converter 80.

During the time that the transistor 82 is turned on, a small component of the current through the resistor 90 and capacitor 92 is diverted through the diode 202. This is used to charge the capacitor 206 to a slight positive voltage, approximately 0.2 volts. The resistor 204 passes some of this voltage to ground, however, the resistor 204 and the capacitor 206 are chosen so as to have a long time constant (approximately 1.5 ms) so that there is minimal change in the voltage generated across the capacitor 100. When the secondary winding of the transformer 86 generates a large negative pulse and the voltage across the capacitor 100 approaches −15 volts, the zener diode 200 begins to conduct. The zener diode 200 is a 15 volt breakdown zener diode, which means the diode 200 conducts when the voltage at the point 104 exceeds −14.8 volts, because the voltage across the capacitance 206 is approximately 0.2 volts.

The current through the diode 200 causes the voltage across the capacitance 206 to become negative, so that when the base current of the transistor 82 is trying to turn the transistor 82 on, a larger percentage of the base current is diverted through the diode 202. This reduces the base current applied to the transistor 82 which reduces the transistor's collector current when it turns on and allows the transistor 82 to move out of saturation near the end of its on cycle. This in turn reduces the voltage across the primary of the transformer 86 while the transistor 82 is on, with an accompanying reduction in the current generated in the primary of the transformer 86. An equilibrium voltage is thereby maintained at the point 104 of approximately −15 volts, without the need for a clamp circuit which would waste power.

The printed circuit board of the interconnecting module, part of which is shown in FIG. 5, is configured so that when the module interconnects with the text processing circuit predetermined pins are connected prior to other pins in order to ensure the circuitry of the module and the processing circuit are not damaged by static discharge and that a particular connection sequence occurs upon interconnection.

The desired sequence is firstly the module is connected to ground, secondly all reset signals are grounded so as to disable all of the tri-state logic outputs of the module and reset the microprocessor 10, which disables the output ports 18, 22, 24 and 26 of the data processing system, thirdly power is applied to the module, fourthly all of the signal lines are connected and finally the ground to all of the reset lines is removed so as to enable the output ports of the module and the data processing system and initialise operation of the microprocessor 10. This is achieved by preferably extending the interconnecting pin tracks, as shown in FIG. 5, so that whenever the module is connected to the text processing circuit certain pin tracks connect prior to others, regardless of the angle at which the module is introduced into the connecting portion of the processing circuit. The first connection that is made is to the ground pin tracks 300 and then the reset pin tracks 302 are connected, which results in resetting the microprocessor 10 and disabling the tri-state outputs of the module. Next the power supply pin tracks 304 are connected thereby powering up the module and then the signal tracks 306 are connected. Finally the reset pin tracks 302, which, as shown in FIG. 5 are relatively small tabs parallel and affixed to the ground tracks 300, are disconnected from the reset signal lines thereby enabling the microprocessor 10 to operate and enabling the output ports of the module and the data processing system.

Many modifications will be apparent to those skilled in the art without departing from the scope of the invention as hereinbefore described with reference to the accompanying drawings and claimed in the following claims.

```
/* 816.c
#define tok89
#define new_text
#define ALLOCATE
#undef TokCode
define Tok8(n)      (freqs[n].fmap < toks8 ? First8tok + freqs[n].fmap : NO_TOK)/**/ include "common.h"

FILE *ichf, *ochf, *itf, *otf, *ptf;
unsigned long addr;
unsigned long o_addr = 0;   /* output address */ define TSPACE (1<<16)
struct freq {
    int ftally;
    int findex;
    int fmap;
} freqs[TSPACE];
token tok89tab[256];

int hightok = 0;
define toks8       Num8toks       /* (254 - ((hightok+1)>>8)) /**/ int freqcmp(p, q)
    struct freq *p, *q;
{
    /* put highest tally first */
    return q->ftally - p->ftally;
} int findexcmp(p, q)
    struct freq *p, *q;
{
    /* put lowest index first */
    return p->findex - q->findex;
} report816()
{
    int cum, i;

for (i=0; i < TSPACE; i++)
    freqs[i].findex = i;
    qsort(freqs, (sizeof freqs)/(sizeof *freqs), sizeof *freqs, freqcmp);
    for (cum=i=0; i < toks8; i++) {
    cum += freqs[i].ftally;
    tok89tab[i] = freqs[i].findex;
    fprintf(ptf, " d,\n", tok89tab[i]);
    fprintf(stderr, " d:  dth saves  d bytes (total  d)\n",
        freqs[i].findex, i+1, freqs[i].ftally, cum);
    }
    fprintf(stderr, "8/16 bit replacement of  d toks saves  d bytes\n",
        toks8, cum);

for (i=0; i < TSPACE; i++)
    freqs[i].fmap = i;
    qsort(freqs, (sizeof freqs)/(sizeof *freqs), sizeof *freqs, findexcmp);
} outb(t)
    tok t;
{
```

```
    o_addr++;
    /*fprintf(otf, " x c", t, o_addr    16 ? ',' : '\n');    /* .ctn fmt */
    /*fprintf(otf, " d c", t, o_addr    16 ? ',' : '\n');    /* .asm fmt */
    putc(t, otf);
} emit(n)
    token n;
{
    if (TwoToken(n)) {
    outb(TokB1(n));
    outb(TokB2(n));
    } else
    outb(TokB(n));

if (SegByte <= 255 && o_addr   ROMPAGE >= ROMPAGE - 5) {
    while (o_addr   ROMPAGE)
        outb(SegByte);
    }
} char fbuf[100];
define fext(s, ext)        strcat(strcpy(fbuf, s), ext)
main(c, v)
    char **v;
{
    unsigned long blk = (c>2) ? 512*atoi(v[2]) : -1;
    int t;
    int verses = 0;
    int phrasedone = 0;
    unsigned long chapt;
    unsigned int word_in_phrase;
    int nf;

itf = fopen(fext(v[1], ".ctn"), "r");
    ptf = fopen(fext(v[1], ".tkn"), "w");

addr = 0;
    while (fscanf(itf, " x", &t) == 1 && addr++ < blk) {
    if (t > hightok)
        hightok = t;
    freqs[t].ftally++;
    }
    rewind(itf);

report816();

ichf = fopen(fext(v[1], ".cch"), "r");
    ochf = fopen(fext(v[1], ".tch"), "w");
    otf = fopen(fext(v[1], ".ttn"), "w");

{
    char buf[100];
    fgets(buf, sizeof buf, ichf);
    fputs(buf, ochf);
    } nf = fscanf(ichf, " lx x", &chapt, &word_in_phrase);
    /*printf("first chapter got d:  lx, x,\n", nf, chapt, word_in_phrase);*/
    for (addr=0; addr<blk; addr++) {
    while (chapt <= addr) {
        fprintf(ochf, " lx x\n", o_addr, word_in_phrase);
```

```
        if ((nf = fscanf(ichf, " lx x", &chapt, &word_in_phrase)) != 2)
            chapt = -1;
        /*printf("chapter got  d:  lx,  x,\n", nf, chapt, word_in_phrase);*/

}
    if (fscanf(itf, " x", &t) != 1)
        blk = 0;
    emit(t);
    }
    fprintf(stderr, "wrote  ld toks\n", (long)o_addr);
    /*fprintf(ochf, " lx  x\n", o_addr, word_in_phrase);*/
    fclose(ochf);

exit(0);
} ignore()()

/* common.h:

/* common definitions of types, variables, etc. */ include <setjmp.h>

/* some macros to enable initialised variables to be declared in one place:
** When included by common.c, ALLOCATE is defined, and the full definitions
** are seen; otherwise just the extern type declaration is seen.
** some linkers require precisely one definition of objects (even uninitialised
** (or BSS) variables).
**
** typical use is:
**   Ext int thing Val(37);
**   Bss unsigned short thung;
*/
#ifdef ALLOCATE
# define     Ext     /* nix */
# define     Bss     /* nix */
# define     Val(x)  = (x)
#else
# define     Ext     extern
# define     Bss     extern
# define     Val(x)  /* nix */
endif ifdef DEBUG
define Static     /*nix*/
#else IDEBUG
# define Static static
endif IDEBUG /* an obsolete, pre-phrase text form is old_text: no longer supported */
define new_text ifdef new_text
define tok89              /* top 89 tok byte values are 8 bit tokens */
    /* include the parameters generated by dictionary and phrase-table software,
    ** and brought together through the readfiles.c program.
    */
# include "data.h"
endif new_text /* describe environment in which book runs:
** some of this is triggered by command-line defines like -Dproto,
** other symbols like 'unix', 'MSDOS', 'M_I86', 'elxsi', 'vax' are
```

```
** defined automatically by the compilers to reflect environment.
**
** each different environment must define a processor (M_186, elxsi, vax),
** an operating system (stand_alone, msdos, unix, embos) and an output
** device (vt100_screen, pc_screen, lcd_screen).
** Memory mapping functions are also defined (often to a trivial zero result).
*/
#ifdef proto
# undef msdos
# undef MSDOS
# define stand_alone
# define really_stand_alone
# define lcd_screen
# define FirstPtableByte    0
int setpage();
int chkpage();
# define known
Ext __proto;
endif ifdef barepc
define stand_alone
# undef MSDOS
# define pc_screen
# define FirstPtableByte    0
# define setpage(w,p)       0    /* must have a value: used with "," */
# define chkpage(w,p)       0    /* must have a value: used with "," */
# define known
Ext __barepc;
endif ifdef MSDOS
define msdos
# define FirstPtableByte    0
# define setpage(w,p)       0    /* must have a value: used with "," */
# define chkpage(w,p)       0    /* must have a value: used with "," */
# define known
Ext __msdos;
endif MSDOS ifdef M_186
ifndef lcd_screen
#  define pc_screen
# endif !lcd_screen
# define known
endif ifdef elxsi
/* unix or embos defined */
# define vt100_screen
# define big_endian            /* most significant byte first */
# define FirstPtableByte    0
# define known
Ext __elxsi;
endif ifndef known
    SNARK!! must define environment on command line
        one of 'proto', 'barepc', 'msdos', 'elxsi' should be defined.
endif /* diagnostic output: list is a parenthesisised printf() arg string, so the
** calls to Dprintf are doubly parenthesised -- Dprintf(("x= d\n", x));
*/
```

```
#ifdef DEBUG
# define Dprintf(list)      dprintf list
#else !DEBUG
# define Dprintf(list)      /* nothing */
endif /* standard definitions: types and functions defined for each environment.
** uchar, ushort     unsigned (if possible) char and short
** i4                a 4 byte integer (not necessarily long!)
**                   (note that these should always be cast to long in
**                    diagnostic printing, as on (say) an elxsi, they are
**                    smaller than longs)
** u4                similar, but unsigned.
** big_endian        defined iff the first byte of an int is the most
**                   significant byte. True for elxsi, M_68000.
** near, far         adjectives modfiying pointer size in MicroSoft C
**                   if not applicable to an environment, define to empty.
** const             adjective modifying storage allocation: used when an
**                   object will not be written to, and can reside in ROM.
**                   defined to far in msCv3, to empty if not implementable.
**                   some compilers implement the const or readonly class.
** cpstruct(d,s)     structure assignment primitive: for those compilers
**                   which can't cope with assignment of structures.
**                   for any reasonable compiler define as ((d)=(s)).
** memcpy(dest, src, nbytes), memset(dest, value, nbytes)
**                   standard ATT memory copy and fill functions.
** noint(S)          should execute the statement S with interrupts disabled
**                   this can be done by masking them off, evaluating S, and
**                   setting interrupt mask back to original value.
** atoi(s)           ascii-decimal to binary conversion (for debug command
**                   line parsing only).
** void              the generic valueless type. if a compiler won't handle
**                   it correctly, define it to int. Pointers to void should
**                   be valid (they are the ideal type for memory alloc!),
**                   but no dereferencing should be possible until cast to
**                   another pointer type. Microsoft C (V3) does it wrong!
*/ ifdef M_I86       /* Microsoft generic name for 8086 family */
include <dos.h>         /* FP_SEG() and FP_OFF() macros for far pointers */
  typedef unsigned int token;
  typedef long i4;
# define abort()                    exit(1)
  /* note the trailing else to soak up trailing ';' */
define noint(S)    if(1){int _savf = savint(); S; restint(_savf);}else ifdef msCv2          /* MicroSoft C version 2 */ typedef char uchar;
  typedef short ushort;
  typedef /*unsigned*/ i4 u4;
  typedef int void;
# define near     /**/
# define far      /**/
# define const    /**/
# define _fmalloc malloc
# define nmalloc malloc
# define cpstruct(dest, src)     memcpy(&(dest), &(src), sizeof(dest))
# define memcpy(dest, src, n)    movmem(src, dest, n)
  extern char far* getml();
# define atoi(s)         (stcd_i(s, &stcd_i), stcd_i)
  Bss int stcd_i;
# define memset(p, val, n)        setmem(p, n, val)
```

```c
endif msCv2 ifdef msCv3           /* MicroSoft C version 3 */
include <signal.h>
    typedef unsigned char uchar;
    typedef unsigned short ushort;
    typedef unsigned i4 u4;
#  define cpstruct(dest, src)    ((dest) = (src))
#  define O_RAW                  O_BINARY
define const           far    /* do nothing special with these yet ... */ endif msCv3
endif M_I86 ifdef elxsi
include <signal.h>
    typedef unsigned char uchar;
    typedef unsigned short ushort;
    typedef ushort token;
    typedef int i4;
    typedef /*unsigned*/ i4 u4;
#  define setpage(w,p)       0   /* must have a value: used with "," */
#  define chkpage(w,p)       0   /* must have a value: used with "," */
#  define near    /**/
#  define far     /**/
#  define const   /**/
#  define _fmalloc malloc
#  define nmalloc  malloc
#  define cpstruct(dest, src)    ((dest) = (src))
#  define noint(S)               (S)
#  define O_RAW                  0
#  undef  LCDEBUG
#  define ASSERT
endif elxsi /* useful macros, not always predefined */
ifndef max
#define max(a,b)    ((a)>(b) ? (a) : (b))
#define min(a,b)    ((a)<(b) ? (a) : (b))
endif !max /* 8086 small memory model only ... */
ifndef M_I86SM
# define _fmalloc malloc
endif M_I86SM typedef int statustype;
extern char far*  _fmalloc();
extern char near* _nmalloc();
/* for those times when a structure-valued-expression just won't do! */
/*#define cpst(d, s)   ((void)cpstruct(d, s)) */
#define cpst(d, s)     ((int)&cpstruct(d, s))

/* return statuses */
#define INTERRUPTED 2   /* for searches */
#define GOOD 1
#define BAD  (-1)

#define TRUE  1
#define FALSE 0

Ext int redraw Val(TRUE); /* signals redraw screen for continue2() */

/* page and scroll speed definitions */
```

```
#define LINERATE 1
#define VERSERATE 2
#define PAGERATE 3
#define CHAPTERRATE 4
#define BOOKRATE 5

Ext int pagespeed Val(PAGERATE), scrollspeed Val(LINERATE);

#include "tokens.h"

/* book pointers and book name definitions */
/* NUMBOOKS may be replaced by a #define whenever known.
** leaving it as a variable allows extra books such as 'help' to be easily
** added w/o recompiling simulator.
*/
/* books.c contains the allocations and is compiled separately*/
define PSALMS   18    /* the book of psalms --- has PSALM  d, not CHAPTER  d */ ifdef proto
define NUMBOOKS 66    /* no need for variable number of books ... */
endif proto extern int const books[];
ifndef NUMBOOKS
extern int const NUMBOOKS;
#endif !NUMBOOKS
extern char *booknames[];

/* dictionary */
/* maximum kjb word 'Mahershalalhashbaz' is 18 letters, so */
#define MAXWORDLEN   20    /* > maximum length of dictionary word */
extern token nextword();
extern token prevword();
extern token getindx();
extern char * indxstr();
extern int setindx(), lengthofword();
extern int clearword(), addtoword(), truncword(), dsearch();
extern char * dictn();
extern int dictl();

/* letter definitions for dsearch(), index.c, enter.c */
#define MinLet   'A'       /* minimum letter */
#define EOW    ('Z' + 1)   /* End Of Word */
define MaxLet   EOW /* once upon a time tokens were not sorted in dictionary order, so mappings
** to and from a sorted numbering are defined.
** dictionary order does seem to be the best way to order tokens, but these
** functions are still used in case a better ordering appears:
** Tosort(t)      returns the number of text token t in dictionary ordering.
** Sortdict(t)    returns the dictionary number corresponding to the word number
**        t as it occurs in the text stream.
** one possible mapping which would improve search speed is to reverse
** the bytes of 16-bit tokens. Currently these are stored most-signficant byte
** first in the text, but BBtok() reverses the bytes on 8086. If BBtok() just
** did a word fetch, Tosort() and Sortdict() would have to swap bytes ...
*/
#ifdef new_text
  /* trivial mappings */
# define Tosort(t)    (t)
# define Sortdict(t)  (t)
#else !new_text
  /* for simulator's unsorted dictionary only ... */
```

```
    extern token far* sortdict;
    extern token far* tosort;
# define Sortdict(t)    sortdict[t]
# define Tosort(t)      tosort[t]
    /* ... end of simulator only */
endif !new_text ifndef stand_alone
include <stdio.h>
# include <fcntl.h>
    extern char textfile[];     /* name of token file */
    extern char compdict[];     /* name of dictionary */
    extern char *getenv();
endif !stand_alone include "ref.h"            /* reference type defns */ include "chapp.h"          /* beginning-of-chapter table */ include "menu.h"           /* menuing system */ include "queue.h"          /* event queue */ include "screen.h"         /* display screen definitions */

/* search definitions */
Ext token searchword Val(NO_TOK);   /* token to search for */
Bss textpointer cursrch;            /* current occurence */
extern textpointer prvsrch;         /* previous occurrence */
extern textpointer nxtsrch;         /* next occurrence */
/* states of the search word display at top right */
typedef enum {
    s_idle, s_set, s_cancel,
    s_fwd, s_back,
    s_no_fwd, s_no_back,
} s_enum;
Ext s_enum searching Val(s_idle);
/* count of searches to skip: 'Searching for next "baldness" but 7' */
Bss int skipsearch;

Ext int init_done Val(0);           /* stops boredom() when immature */

/* testing */
/* Note the 'if(B) S; else' to catch the semicolon in 'assert(B);' */
#ifdef ASSERT
#define assert(B) if(!(B)){Dprintf(("\nIassert: B\n"));die(Horribly);}else
#else !ASSERT
#define assert(B) /* do nothing */
endif ASSERT /* ways to die() */
define Peacefully SIGINT
#ifdef SIGQUIT
#define Horribly SIGQUIT
#else
#define Horribly Peacefully
endif !SIGQUIT /* display functions */
extern char *refstring();
#define leadinglit(t)   ((t)==V_TOK || (t)==BRK_TOK || (t)=='(' || (t)=='"')

/* display emboldening on token or position */
extern textpointer emphpos;         /* token address to emphasise */
Ext token emphtok Val(NO_TOK);      /* token to emphasise */
```

```
/* flags for turning on debug output, etc */
#ifdef DEBUG
Ext int dedebug      Val(0);
Ext int refdebug Val(0);
Ext int kbdebug Val(2);
Ext int srchdebug Val(0);
Ext int tokdebug Val(0);
Ext int symdebflg Val(0);
Ext unsigned catchoflo Val(0);
#else IDEBUG
# define dedebug    1
# define refdebug 0
# define kbdebug 2
# define srchdebug 0
# define tokdebug 0
# define symdebflg 0
# define catchoflo 0
endif IDEBUG /* with Microsoft C, can do a primitive type cross-check */
/* see msdos file lint.bat for details */
#ifdef msCv3
# ifdef LINT_ARGS
#  include "types.h"
# endif LINT_ARGS
endif msCv3 include <stdio.h>
define DICTNAME "kjbible.ldc"
#define TKNNAME "kjbible.ltn"
            /*
                this is the new token stream ie. after its
                addresses haves been updated to match
                the 'test.dsort' file.
            */
#define FNAME "kjbible.upw"
#define MAX 0x10000
#define UP_TKN "UPCHR_TKN"

FILE *fp, *tknfile, *dictfile;
int  rec_len, total;
unsigned short up_address, search_array[MAX];
char up_table[MAX], low_table[MAX];
unsigned short find_up_tkn();
short unsigned make_up_table();
char *find_word();

main()
{
    int i;
    char str[20];

dictfile=fopen(DICTNAME,"r");
    up_address=find_up_tkn();

tknfile=fopen(TKNNAME,"r");
    total=make_up_table();
    fclose(tknfile);

printf("total is  d\n",total);
    total=search_tables();
```

```
    printf("total is  d\n",total);
    printf("\n\n");
    fp=fopen(FNAME,"w");
    for (i=1;i<=total; ) {
    str[0]='\0';
    strcpy(str,find_word(search_array[i]));
    fprintf(fp," 4.4hx  s\n", search_array[i], str);
    i++;
    }
    fclose(dictfile);
    fclose(fp);

} char *find_word(tkn)
short unsigned tkn;

{   char str[20];

fseek(dictfile, (long)((tkn-1)*rec_len), 0);
    fscanf(dictfile, " *d  s  *hx *d", str);
    return(str);
} unsigned short find_up_tkn()

{
    unsigned short i;
    char str2[80], str[20];

/* We know that all special tokens are at the top of the sorted
       dictionary file so the sequential search for the upper case
       token or any such token is fast....   */ rec_len=strlen(fgets(str2, sizeof(str2)-1, dictfile));

i=1;
    fseek(dictfile,0L,0);
    while (fscanf(dictfile, " *d  s  *hx *d", str) != EOF) {
    if (strcmp(str, UP_TKN)==0)
        break;
    i++;
    } return(i);
} short unsigned make_up_table()
{
    int j=0;
    short unsigned token, largest;

largest=0;
    printf("\nMaking upper and lower token arrays....\n");
    while (fscanf(tknfile, " hx", &token) != EOF) {
        print_tab(j,10000);
    if (token > largest)
        largest=token;
    j++;
    if (token==up_address) {
        fscanf(tknfile, " hx", &token);
```

```
                if (token > largest)
                    largest=token;
                up_table[token]='1';
                print_tab(j,10000);
                j++;
        } else
            low_table[token]='1';

}
        return(largest);
} print_tab(val,step)
int val,step;

{
    if ((val step) == 0)
        printf (" 7d \n", val);
} search_tables()

{
    int j, tally;

tally=0;
    printf("\n\n in search tables\n");
    for (j=1;j<=total; ) {
        print_tab(j,10000);
        if (up_table[j]>low_table[j]) {
            tally++;
            search_array[tally]=j;
        }
        j++;
    }
    return(tally);
}

Refer to /user/pk/doco/technique.doc for a description of the algorithm
used here.
*/

/****************
*** constants ***
****************/
#define MAXNAME 40      /* maximum file name size excluding extensions */
                        /* ensure scanf argument in main() corresponds */
#define GROWFACTOR 1.5  /* the factor by which the phrase tally list grows
                           when it overflows */
#define LIMITFACTOR 0.95        /* factor to calculate hash table too full */
#define FUDGEFACTOR 1.5 /* used to calculate iteration hash table size */
#define RILSIZE 1000    /* maximum number of reduction phrases per iteration */
/* STREAMSIZE is the maximum number of tokens in input stream */
/* STREAMSIZE can be commented out if calloc() can handle the huge requests */
#define STREAMSIZE 2200000
/* HASHTBLSIZE is the maximum size of hash table, <=STREAMSIZE */
/* HASHTBLSIZE can be commented out if calloc() can handle the huge requests */
/*#define HASHTBLSIZE STREAMSIZE /**/
#define FALSE   0
#define TRUE    1
/* the following are possible actions */
#define DO_NOTHING      0       /* set by calloc to 0 */
#define REPLACE         1
#define DELETE          2
```

```c
#define DEF_THRESHOLD 3 /* minimum tally for which a phrase is justified*/

/************************
 *** hash function ***
 ************************/
#define hash(a,b)      (((a)+6283)*((b)+1234) hashsize)

/************************
 *** macro definitions ***
 ************************/

/* note hashp does not have its address passed since it is
a register.
if porting this program to another machine replacing findhashp explicitly
is recommended.
*/

/* hashp is (hashentry *), fst & scnd are (tokentype) */
#define findhashp(hashp, fst, scnd)                                     \
if(1){                                                                  \
    register tokentype fsttkn, scndtkn;                                 \
    int infloop;         /* check for infinite loop */                  \
                                                                        \
    hashp = hashtbl + hash((fsttkn = (fst)), (scndtkn = (scnd)));       \
    infloop = FALSE;                                                    \
/* following loop must terminate since entry has been placed */         \
    while ((hashp->first != fsttkn) || (hashp->second != scndtkn))      \
            if (--hashp < hashtbl) {                                    \
                hashp = hashtbl + hashsize - 1;                         \
                if (infloop) {                                          \
                    printf("Software error - infinite loop looking for\ \
[ 4.4x, 4.4x] - aborting\7\n", (int) fsttkn, (int) scndtkn);            \
                    exit(1);                                            \
                } else                                                  \
                    infloop = TRUE;                                     \
            }                                                           \
}else    /* Note: the if(1){....}else will swallow a trailing ';' */

/************************************
 *** standard C definitions ***
 ************************************/
#include <stdio.h>
char *calloc();

/************************
 *** type definitions ***
 ************************/
/* tokentype is a 16 bit type, used for large arrays */
typedef unsigned int tokentype;

/* phrasetype is a 32 bit type but if <65536 phrases with tally>=threshold
expected then 16 bits will suffice, only large array is the phrase stream */
typedef unsigned int phrasetype;

/* tallytype is 16 bits but if a tally>65536 is required 32 bits can be used,
used for large arrays */
typedef unsigned short tallytype;
define TALLYFIX 0xdfff /* frzptype is the same as phrasetype but may become a pointer */
typedef unsigned int frzptype;

/* segindex is a segment pointer */
typedef unsigned int segindex;
```

```
/* tknfrz is a union of tokentype and phrasetype */
typedef union {
    tokentype tkn;
    phrasetype frz;
} tknfrz;

/* tlyfrz is a union of tallytype and phrasetype */
typedef union {
    tallytype tly;
    phrasetype frz;
} tlyfrz;

/* hashentry is a hash table element */
typedef struct {
    tokentype first, second;
    tlyfrz tf;
} hashentry;

/* ptlentry is a phrase tally list element */
typedef struct {
    tokentype fst, scnd;
    union {
        tallytype tly;
        tokentype newtkn;
    } tt;
    char action;
} ptlentry;

/************************
*** global variables ***
************************/
FILE *stnfp,      /* standard token stream file pointer, input */
     *chpfp,      /* segment pointer list file pointer, input */
     *frzfp;      /* phrase compression list file pointer, output */
char filename[MAXNAME+5],    /* base file name (excluding extension) */
     *fnextp;     /* pointer to end of filename (beginning of extension) */
segindex *segs;   /* array list of segment offsets (from .sch file) */
int numsegs,      /* number of segments */
    nocasb,       /* false if compression across segment boundaries allowed */
    maxstream,    /* size of stream array */
    stmstat,      /* theoretical size of compressed token stream */
    hashsize,     /* hash table size */
    hashlimit,    /* hashsize*LIMITFACTOR, used to trigger rebuildhashtbl() */
    ptlsize,      /* phrase tally list size */
    maxril,       /* number of reduction phrases */
    freeptl,      /* index to free list within ptlist */
    threshold,    /* minimum tally on which to compress */
    numentries,   /* number of hash table entries */
    numphrases,   /* number of phrases with tally >= threshold */
    lastrate,     /* number of new phrases per replacement phrase */
    iteration=1,  /* iteration count */
    sumtally;     /* sum of the tallys of phrases of interest */
tknfrz *stream;   /* array containing standard tokens initially then phrases */
tokentype maxhex, /* maximum hex value + 1 */
    frzhex;       /* initial phrase hex value */
hashentry *hashtbl,   /* hash table array */
    *lasthashp;   /* used to watch for triplets etc in sweep and
                     hashtally */
ptlentry *ptlist; /* phrase tally list */
phrasetype *opilist;  /* ordered phrase index list */
frzptype rilist[RILSIZE];    /* reduction index list */
#ifdef HASHTBLSIZE
hashentry *tblhash;
endif
```

```
/**********
*** code ***
**********/ main()
{
    FILE *openext();
    char answer[2];
    int hashpercent, compar()   /*, oldnf*/ ;
#ifdef STREAMSIZE
    tknfrz streamarray[STREAMSIZE];
#endif
ifdef HASHTBLSIZE
    hashentry hashtblarray[HASHTBLSIZE];          /* hash table array */
    hashentry *hashp, *hashend;
endif ifdef STREAMSIZE
    stream = streamarray;
#endif
ifdef HASHTBLSIZE
    tblhash = hashtblarray;    /* used in rebuildhashtbl() */
#endif
    printf("Base name of file to be compressed? ");
    scanf(" 40s", filename);   /* 40 should correspond with MAXNAME */
/* find end of filename */
    fnextp = filename - 1;
    while (*++fnextp)
        ;
    if ((stnfp = openext(".stn", "r")) == NULL) {
        printf("Can't open  s.stn\7\n", filename);
        exit(1);
    }
    if ((chpfp = openext(".sch", "r")) == NULL) {
        printf("Can't open  s.sch\7\n", filename);
        exit(1);
    }
    if ((frzfp = openext(".frz", "w")) == NULL) {
        printf("Can't open  s.frz - aborting\7\n", filename);
        exit(1);
    }
    printf("Compress across boundaries (y/n)? ");
    scanf(" 1s", answer);
    nocasb = (*answer == 'n') || (*answer == 'N');
    fputs((nocasb ? "n " : "y "), frzfp);
    printf("Hash table size as   of source size (30 to 110)? ");
    scanf(" d", &hashpercent);
    if (hashpercent < 30)
        printf("Too small!! - making  d \7\n", hashpercent = 30);
    else if (hashpercent > 110)
        printf("Too big!! - making  d \7\n", hashpercent = 110);
    printf("Initial new phrase rate (>99)? ");
    scanf(" d", &lastrate);
    printf("Threshold tally (least tally on which to compresss)? ");
    if (scanf(" d", &threshold) != 1)
        threshold = DEF_THRESHOLD;
    if (lastrate < 100)
        printf("Too small!! - making  d\7\n", lastrate = 100);
    printf("\nReading segment pointers\n");
    readinseg();
    fclose(chpfp);
    hashsize = ((maxstream - 3) * hashpercent + 99) / 100;
    hashlimit = hashsize * LIMITFACTOR;
    printf("Reading in standard token stream,  d tokens expected\n",
           maxstream - 3);
```

```
    readintkn();
    fclose(stnfp);
    printf("Building hash table\n");
#ifdef HASHTBLSIZE
    hashtbl = hashtblarray;
#endif
    buildhash();          /* allocates hash table */
    printf("Building phrase tally list\n");
    buildptl();
    printf("Building phrase index stream\n");
    buildpis();
    cfree(segs);
    segs = NULL;
#ifndef HASHTBLSIZE
    cfree(hashtbl);       /* finished with hash table */
#endif
    hashtbl = NULL;
    printf("Creating ordered phrase index list\n");
    createopil();
    fprintf(frzfp, " x\n", (unsigned int) maxhex);
    while (TRUE) {
        qsort((char *) (opilist+1), numphrases-1, sizeof(*opilist), compar);
        while (ptlist[opilist[numphrases-1]].tt.tly == 0)
            if (--numphrases == 1)
                goto finished;
/*      checkit();         */
        while (ptlist[opilist[numphrases-1]].tt.tly < threshold) {
            if (--numphrases == 1)
                goto finished;
            ptlist[opilist[numphrases]].action = DELETE;
        }
        printf("Iteration  d, maxtally =  d, stream =  d, phrases =  d\n",
                iteration++, ptlist[opilist[1]].tt.tly, maxstream-3,
                numphrases-1);
        printf("Next hex value is ' -4x'\n", maxhex);
        findril();
        hashsize = maxril * lastrate * FUDGEFACTOR;
        hashlimit = hashsize * LIMITFACTOR;
        if (hashsize < 200)
            hashsize = 200;
        printf("Reducing  d phrases\n", maxril);
        printf("Hash table size is  d\n", hashsize);
#ifdef HASHTBLSIZE
        if (hashsize > HASHTBLSIZE) {
            printf("Hashsize to big - reducing to  d\n",
                    (hashsize = HASHTBLSIZE));
            hashlimit = hashsize * LIMITFACTOR;
        }
/* clear hash table tallys */
        hashtbl = hashtblarray;
        for (hashend = (hashp = hashtbl) + hashsize; hashp < hashend;)
            hashp++->tf.tly = 0;
#else
/* allocate hash table */
        if ((hashtbl = (hashentry *) calloc(hashsize, sizeof(hashentry))) == NULL) { printf("Cannot allocate  d bytes for hash table - aborting\n",
                    hashsize * sizeof(hashentry));
            exit(1);
        }
#endif
        numentries = 0;
        sweep();
        lastrate = (numentries + maxril - 1) / maxril;
        printf("Hash table  d  full with  d entries\n",
```

```
                        numentries*100/hashsize, numentries);
/*      oldnf = numphrases;       */
        addnewfrzs();
/*      printf(" d new phrases added\n", numphrases - oldnf);   */
        reduce();
#ifndef HASHTBLSIZE
        cfree(hashtbl);
#endif
        hashtbl = NULL;
        tidyup();
        if (numphrases <= 1)
            break;
    }
finished:
    printf("Finished -  d compressed tokens,  d phrases\7\7\n",
            stmstat, maxhex-frzhex);
    printf(" d tokens overall\n", stmstat + 2*(maxhex-frzhex));
    exit(0);
}

FILE *openext(ext, mode)
char *ext, *mode;
{
    char *s;
    FILE *retval;

s = fnextp;
    while (*s++ = *ext++)
        ;
    retval = fopen(filename, mode);
    *fnextp = '\0';
    return retval;
} readinseg()
{
    int val, i, hex;

/* skip initial 0 */
    val = fscanf(chpfp, " x", &hex);
    if (val == EOF || val == 0) {
        printf("Error reading first value of  s.sch - aborting\7\n", filename);
        exit(1);
    } else if (hex) {
        printf("Error, first value of  s.sch should be 0 - aborting\7\n",
                filename);
        exit(1);
    }
/* find the number of segments */
    numsegs = -1;
    do {
        val = fscanf(chpfp, " x", &hex);
        numsegs++;
    } while (val != EOF && val);
    if (val == 0) {
        printf("Error reading  s.sch at value  d - aborting\7\n", filename,
                numsegs+1);
        exit(1);
    }
    if (numsegs < 1) {
        printf("Require at least 0 and number of tokens in  s.sch - aborting\n",
                filename);
        exit(1);
    }
```

```
/* rewind, lseek(chpfp->??, OL, 0) could be used */
    close(chpfp);
    chpfp = openext(".sch", "r");
    fscanf(chpfp, " *x");   /* skip initial 0 */
    segs = (segindex *) calloc(numsegs, sizeof(segindex));
    for (i=0; i<numsegs; i++) {
        fscanf(chpfp, " x", &hex);
        segs[i] = hex;
    }
    printf(" 8d segment pointers read\n", numsegs+1); /* +1 includes initial
                                                        0 */
    maxstream = segs[numsegs-1] + 3;
} readintkn()
{
    register tknfrz *tp, *endp;
    int hex;
    register int count, val;

/* Elxsi C allocation has problems beyond 5Mbyte hence a compile time
value can be used instead */
#ifdef STREAMSIZE
    if (STREAMSIZE < maxstream) {
        printf("Compile time variable 'STREAMSIZE' is only  d which is smaller\
than\nthe expected number of tokens - aborting\n", STREAMSIZE);
        exit(1);
    }
else
/* allocate stream array */
    if ((stream = (tknfrz *) calloc(maxstream, sizeof(tknfrz)))
            == NULL) {
        printf("Cannot allocate  d bytes for stream array - aborting\n",
                maxstream * sizeof(tknfrz));
        exit(1);
    }
#endif
/* read in tokens */
    maxhex = count = 0;
    tp = stream + 1;
    endp = tp + maxstream - 3;
    while (tp < endp) {
        val = fscanf(stnfp, " x", &hex);
        if (val == EOF) {
            printf("Unexpected end of file in s.stn,  d tokens read so far,\n\
 d expected - aborting\n", filename, tp-stream-1, maxstream - 3);
            exit(1);
        } else if (val == 0) {
            printf("Error reading  s.stn at value  d - aborting\7\n", filename,
                    tp-stream);
            exit(1);
        }
        if (maxhex < (tp++->tkn = hex))
            maxhex = hex;
        if (hex)
            stmstat++;
        if (++count 10000 == 0)
            printf("\015 8d", count);
    }
/* check if no more left */
    if (fscanf(stnfp, " *x") != EOF)
        printf("\015More tokens found after last segment pointer - \
ignoring!\7\n");
    printf("\015 8d standard tokens read, maximum hex value is  x\n",
            maxstream - 3, maxhex++);
```

```
    frzhex = maxhex;    /* remember initial value */
} buildhash()    /* builds the hash table */
{
    register tknfrz *first, *second;
    register hashentry *hashp, *lasthashp;
    register tknfrz *endp;
    register int count;
    tknfrz *segbound;          ,  segment boundary */
    segindex *seg;

/* Elxsi C allocation has problems beyond 5Mbyte hence a compile time
value can be used instead */
#ifdef HASHTBLSIZE
    if (HASHTBLSIZE < hashsize) {
        printf("Compile time variable 'HASHTBLSIZE' is only  d which is\n\
smaller than the required size of  d - aborting\n", HASHTBLSIZE, hashsize);
        exit(1);
    }
    {
        register hashentry *hashend;

for (hashend = (hashp = hashtbl) + hashsize; hashp < hashend;)
            hashp++->tf.tly = 0;
    }
else
/* allocate hash table */
    if ((hashtbl = (hashentry *) calloc(hashsize, sizeof(hashentry))) == NULL) { printf("Cannot allocate  d bytes for hash table - aborting\n",
            hashsize * sizeof(hashentry));
        exit(1);
    }
#endif
/* initialise variables */
    numentries = 0;
    count = 1;
    second = (first = stream + 1) + 1;
    endp = first + maxstream - 3;
    if (first->tkn == 0) {
        while (first->tkn == 0) {
            if (second >= endp) {
                printf("Error - all 0 tokens - aborting\7\n");
                exit(1);
            }
            first++;
            second++;
        }
        printf("Warning - first token is 0!\7\n");
    }
    if (nocasb) {     /* if compress across boundaries inhibited */
        seg = segs;     /* then assign seg and segbound to discover */
        segbound = stream + 1 + =(seg++);        /* boundaries */
    } else
        segbound = NULL;       /* else ignore segbound */
    lasthashp = NULL;
    printf(" count    full   entries (max  d)\n", hashsize);
    while (second < endp) {
        if (++count 10000 == 0) {
            printf("\015 8d    3d    8d", count, numentries*100/hashsize,
                numentries);
            fflush(stdout);
        }
```

```
            if (second == segbound) {
                segbound = stream + 1 + *(seg++);
            } else if (second->tkn) {
/* following code is written explicitly for speed - similar code is found in
hashtally() */
                hashp = hashtbl + hash(first->tkn, second->tkn);
                while (hashp->tf.tly) {
                    if ((hashp->first == first->tkn) &&
                        hashp->second == second->tkn)) {
                        if (lasthashp != hashp) {   /* watch for triplets */
                            if (++((lasthashp = hashp)->tf.tly) == 0) {
                                printf("\7Software error - tallytype overflow\
, making tally d\n", TALLYFIX);
                                hashp->tf.tly = TALLYFIX;
                            }
                        } else
                            lasthashp = NULL;       /* clear for quadriplets etc */
                        goto next;
                    }
                    if (--hashp < hashtbl)
                        hashp = hashtbl + hashsize - 1;
                }
                (lasthashp = hashp)->first = first->tkn;
                hashp->second = second->tkn;
                hashp->tf.tly = 1;
                if (++numentries >= hashlimit)
                    rebuildhashtbl();
            } else {           /* ignore 0 token */
                if (++count 10000 == 0) {
                    printf("\015 8d   3d   8d", count, numentries*100/hashsize,
                        numentries);
                    fflush(stdout);
                }
                first++;
                second++;
            }
next:   first++;
        second++;
    }
    printf("\n 8d tokens processed, hash table  d   full which corresponds\n\
to  d  of the source size,  d unique phrase pairs\n", count,
        numentries*100/hashsize, numentries*100/(maxstream-3),
        numentries);
} buildptl()
{
    register hashentry *hp, *endp;
    register ptlentry *ptlp;
    register unsigned int regnumphrases, regfreeptl, regsumtally;

/* find the number of relevant phrases */
    regnumphrases = 1;
    for ((hp=hashtbl),(endp=hashtbl+hashsize); hp<endp;)
        if (hp++->tf.tly >= threshold)
            regnumphrases++;              /* uses register for speed */
    numphrases = regnumphrases;
/* allocate ptlist */
    ptlsize = numphrases * GROWFACTOR;
    ptlp = (ptlist = (ptlentry *) calloc(ptlsize, sizeof(ptlentry))) + 1;
    if (ptlist == NULL) {
        printf("Cannot allocate  d bytes for phrase tally list - aborting\n",
            ptlsize * sizeof(ptlentry));
        exit(1);
    }
```

```
        regfreeptl = 1;              /* corrseponds to index of ptlp */
        regsumtally = 0;
/* assign ptlist (see addnewfrzs) */
        for (endp = (hp = hashtbl) + hashsize; hp<endp;)
            if (hp->tf.tly >= threshold) {
/*              ptlp->action = DO_NOTHING; */
                ptlp->fst = hp->first;
                ptlp->scnd = hp->second;
                regsumtally += (ptlp++->tt.tly = hp->tf.tly);
                hp++->tf.frz = regfreeptl++;       /* uses register for speed */
            } else
                hp++->tf.frz = 0;
        freeptl = regfreeptl;
        sumtally = regsumtally;
        printf(
            " 8d entries with tally less than  d leaving  d phrases of interest\n",
            numentries-numphrases-1, threshold, numphrases-1);
        printf("Maximum saving is  d tokens\n", sumtally - 2 * (freeptl - 1));
} buildpis()
{
    tknfrz *segbound;              /* segment boundary */
    segindex *seg;
    register tknfrz *first, *second, *sp;
    register hashentry *hashp;
    register tknfrz *endp;

/* pass through stream changing token pairs to a phrase number */
    second = (first = stream + 1) + 1;
    endp = first + maxstream - 3;
    while (first->tkn == 0) {
        first++;
        second++;
    }
    sp = stream;
    sp->frz = 0;                   /* place boundary 0 */
    if (nocasb) {
        seg = segs;
        segbound = stream + 1 + *(seg++);
    } else
        segbound = NULL;
    while (second < endp) {
        if (second == segbound) {
            segbound = stream + 1 + *(seg++);
            if (sp->frz)           /* reduce multiple 0s to one 0 */
                (++sp)->frz = 0;   /* inhibit compression */
        } else if (second->tkn) {
            findhashp(hashp, first->tkn, second->tkn);
            if (hashp->tf.frz || sp->frz)
                (++sp)->frz = hashp->tf.frz;
        } else {                   /* ignore 0 token */
            if (sp->frz)
                (++sp)->frz = 0;
            first++;
            second++;
        }
        first++;
        second++;
    }
    if (sp->frz)                   /* place boundary 0 */
        (++sp)->frz = 0;
    (++sp)->frz = 0;               /* place second end 0 */
    maxstream = sp - stream + 1;
```

)

```
createopil()
{
    register int i;
    register phrasetype *opilp;

opilp = opilist = (phrasetype *) calloc(ptlsize, sizeof(phrasetype));
    if (opilp == NULL) {
        printf("Cannot allocate  d bytes for ordered phrase index list -\
aborting\n", ptlsize * sizeof(ptlentry *));
        exit(1);
    }
    for (i=0; i < ptlsize;)
        *opilp++ = (phrasetype) i++;
}
/*      int cpcount=0;  */ int compar(a,b)         /* comparison function for qsort */
phrasetype *a, *b;
{
/*
    if (++cpcount 100 == 0)
        printf("\015 8d", cpcount);
    if ((a < opilist) || (a > opilist+numphrases)) {
        printf("compar has bad \"a\" parameter, is  x, limits  x: x\n",
                a, opilist, opilist+numphrases);
        printf("\015 8d", cpcount);
        exit(1);
    }
    if ((b < opilist) || (b > opilist+numphrases)) {
        printf("compar has bad \"b\" parameter, is  x, limits  x: x\n",
                b, opilist, opilist+numphrases);
        printf("\015 8d", cpcount);
        exit(1);
    }
*/
    return ptlist[*b].tt.tly - ptlist[*a].tt.tly;
} findril()
{
    register phrasetype *opilp, *endp;
    register ptlentry *ptlp;
    register int numfrzout;
    char *prevfst, *prevscnd;

if (maxhex == 0) {
        printf("maxhex overflow - aborting\7\n");
        exit(1);
    }
/* allocate prevfst and prevscnd arrays - note they are zeroed by calloc */
    if ((prevfst = calloc(maxhex-1, sizeof(char))) == NULL) {
        printf("Cannot allocate  d bytes for prevfst array - aborting\7\n",
                maxhex-1);
        exit(1);
    }
    if ((prevscnd = calloc(maxhex-1, sizeof(char))) == NULL) {
        printf("Cannot allocate  d bytes for prevscnd array - aborting\7\n",
                maxhex-1);
        exit(1);
    }
    maxril = 0;
    numfrzout = 0;
```

```
    opilp = opilist + 1;
    endp = opilist + numphrases;
    while (opilp < endp) {
        ptlp = &ptlist[*opilp];
        if (!prevscnd[ptlp->fst] && !prevfst[ptlp->scnd]) {
            ptlp->action = REPLACE;
            stmstat -= ptlp->tt.tly;
            if ((ptlp->tt.newtkn = maxhex++) == 0) {
                printf("maxhex overflow!! - returning");
                break;
            }
            if (++numfrzout 8)
                fprintf(frzfp, " x  x ", (unsigned int) ptlp->fst,
                        (unsigned int) ptlp->scnd);
            else
                fprintf(frzfp, " x  x\n", (unsigned int) ptlp->fst,
                        (unsigned int) ptlp->scnd);
            rilist[maxril++] = opilp - opilist;
            if (maxril >= RILSIZE) {
                printf("Reduction index list full with  d entries\7\n,\
 d phrases checked out of  d\n", RILSIZE, opilp-opilist+1, numphrases-1);
                break;
            }
        }
        prevfst[ptlp->fst] = TRUE;
        prevscnd[ptlp->scnd] = TRUE;
        opilp++;
    }
    cfree(prevfst);
    cfree(prevscnd);
    if (numfrzout 8)
        putc('\n', frzfp);
    putc('\n', frzfp);
    fflush(frzfp);
} sweep()      /* deletes unnecessary phrases and finds new phrases of interest */
{
    register tknfrz *oldstm, *endstm;

if (ptlist[0].action != DO_NOTHING) {
        printf("Error ptlist[0].action is not DO_NOTHING!!\7\n");
        ptlist[0].action = DO_NOTHING;
    }
    oldstm = stream + 1;
    endstm = stream + maxstream - 2;
    if (ptlist[oldstm->frz].action == DELETE)
        oldstm->frz = 0;
    while (oldstm < endstm) {
/* next check if phrase to be replaced */
        if (ptlist[oldstm->frz].action == REPLACE) {
            if ((oldstm-1)->frz)                    /* tally new phrase formed */
                hashtally(ptlist[(oldstm-1)->frz].fst,
                        ptlist[oldstm->frz].tt.newtkn);
/* check if phrase ahead to be deleted */
            if (ptlist[(oldstm+1)->frz].action == DELETE)
                (oldstm+1)->frz = 0;
            else if ((oldstm+1)->frz) {
/* tally new phrase formed, first see if next token part of another
replacement. Following code requires two 0s at end of stream for termination */ while (ptlist[(oldstm+2)->frz].action == REPLACE) {
                    hashtally(ptlist[oldstm->frz].tt.newtkn,
                            ptlist[(oldstm+2)->frz].tt.newtkn);
                    oldstm += 2;
```

```c
/* check if phrase ahead to be deleted */
                if ((oldstm+1)->frz == 0) {
                    oldstm++;
                    goto next;          /* no new phrase */
                } else if (ptlist[(oldstm+1)->frz].action == DELETE) {
                    (++oldstm)->frz = 0;
                    goto next;
                }
            }
            hashtally(ptlist[oldstm->frz].tt.newtkn,
                    ptlist[(oldstm+1)->frz].scnd);
        }
        oldstm++;
    } else if (ptlist[oldstm->frz].action == DELETE)
            oldstm->frz = 0;
next:   oldstm++;
        lasthashp = NULL;
    }
} reduce()
{
    register tknfrz *newstm, *oldstm, *endstm;
    register hashentry *hashp;
    register ptlentry *ptlp;
    int pfst;

oldstm = (newstm = stream) + 1;
    endstm = stream + maxstream - 2;
    while (oldstm < endstm) {
/* check if phrase to be replaced, phrase 0 will also work ok */
        if ((ptlp = ptlist + oldstm->frz)->action == REPLACE) {
            if (newstm->frz) {
/* decrement previous phrase tally */
                if (ptlist[newstm->frz].tt.tly-- == 0)
                    ptlist[newstm->frz].tt.tly = 0; /* this should only
                                                       occur after overflow */
/* replace previous phrase with new phrase index */
                findhashp(hashp, ptlist[newstm->frz].fst,
                        ptlist[oldstm->frz].tt.newtkn);
                newstm->frz = hashp->tf.frz;    /* may produce multiple 0s */
            }
            while (ptlist[(oldstm+2)->frz].action == REPLACE) {
                if ((oldstm+1)->frz == 0)
                    break;      /* no new phrase */
                if (ptlist[(oldstm+1)->frz].action != REPLACE)  /* check for
                                                                   triplets */
                    ptlist[(oldstm+1)->frz].tt.tly--;
                else if ((oldstm+1)->frz != oldstm->frz)
                    printf("Software error - expected triplet\7\n");
                findhashp(hashp, ptlp->tt.newtkn,
                        ptlist[(oldstm+2)->frz].tt.newtkn);
                if (hashp->tf.frz || newstm->frz)
                    (++newstm)->frz = hashp->tf.frz;
                ptlp = ptlist + (oldstm += 2)->frz;
            }
            if ((oldstm+1)->frz) {
/* decrement next phrase tally - check for triplets */
                if (ptlist[(oldstm+1)->frz].action != REPLACE) {
                    if (ptlist[(oldstm+1)->frz].tt.tly-- == 0)
                        printf("\7Software error - phrase  xx tally less\
than 0!!\n", (int) (oldstm+1)->frz);
                    findhashp(hashp, ptlp->tt.newtkn,
                            ptlist[(oldstm+1)->frz].scnd);
```

```
            if (hashp->tf.frz || newstm->frz)
                (++newstm)->frz = hashp->tf.frz;
        ) else if ((oldstm+1)->frz != oldstm->frz)
            printf("Software error - expected triplet\7\n");
        else {
            findhashp(hashp, ptlp->tt.newtkn,
                    ptlist[(oldstm+1)->frz].scnd);
            if (hashp->tf.frz || newstm->frz)
                (++newstm)->frz = hashp->tf.frz;
            }
        ) else if (newstm->frz)
            (++newstm)->frz = 0;
        oldstm++;
    ) else if (newstm->frz || oldstm->frz)
        (++newstm)->frz = oldstm->frz;
    oldstm++;
    }
    if (newstm->frz)
        (++newstm)->frz = 0;
    (++newstm)->frz = 0;              /* place second ending 0 */
    maxstream = newstm - stream + 1;
    printf("reduced stream size by  d\n", oldstm - newstm + 1);
} addnewfrzs()
{
    register hashentry *hashp, *hashend;
    register ptlentry *ptlp;

hashend = (hashp = hashtbl) + hashsize;
    while (hashp < hashend) {
        if (hashp->tf.tly >= threshold) {
            if (numphrases >= ptlsize)
                extendptl();
            ptlp = &ptlist[opilist[numphrases]];
            ptlp->action = DO_NOTHING;
            ptlp->fst = hashp->first;
            ptlp->scnd = hashp->second;
            ptlp->tt.tly = hashp->tf.tly;
/*          regsumtally += (ptlp++->tly = hashp->tf.tly);        */
            hashp++->tf.frz = opilist[numphrases++];
        } else
            hashp++->tf.frz = 0;
    }
} hashtally(ftkn, stkn)
tokentype ftkn, stkn;
{
    register hashentry *hashp;
    register tokentype fsttkn, scndtkn;

hashp = hashtbl + hash((fsttkn = ftkn), (scndtkn = stkn));
    while (hashp->tf.tly) {
        if ((hashp->first == fsttkn) &&
                (hashp->second == scndtkn)) {
            if (hashp != lasthashp)    /* watch for triplets */
                (lasthashp = hashp)->tf.tly++;
            else
                lasthashp = NULL;
            return;
        }
        if (--hashp < hashtbl)
            hashp = hashtbl + hashsize - 1;
```

```
    }
    (lasthashp = hashp)->first = fsttkn;
    hashp->second = scndtkn;
    hashp->tf.tly = 1;
    if (++numentries >= hashlimit)
        rebuildhashtbl();
} extendptl()
{
    int oldptlsize = ptlsize;
    ptlsize = ptlsize * GROWFACTOR;
    printf("Extending phrase tally list to  d\n", ptlsize);
    ptlist = (ptlentry *) realloc(ptlist,
        ptlsize*sizeof(ptlentry));
    opilist = (phrasetype *) realloc(opilist,
        ptlsize*sizeof(phrasetype));                            /*swine*/
    memset((char *)&ptlist[oldptlsize], 0,
        (char *)&ptlist[ptlsize] - (char *)&ptlist[oldptlsize]);  /* swine*/
    memset((char *)&opilist[oldptlsize], 0,
        (char *)&opilist[ptlsize] - (char *)&opilist[oldptlsize]);  /* swine*/ if (ptlist == NULL) {
        printf("Cannot allocate  d bytes for ptlist - aborting\7\n",
                ptlsize*sizeof(ptlentry));
        exit(1);
    }
    if (opilist == NULL) {                                      /* swine */
        printf("Cannot allocate  d bytes for opilist - aborting\7\n",
                ptlsize*sizeof(phrasetype));
        exit(1);
    }
} rebuildhashtbl()
{
/*
to rebuild the hash table:
if it is dynamic (HASHTBLSIZE undefined) request a larger array, rehash the
current contents and cfree the old hash table.
If the hash table is static see if the current hash table only takes up
a small amount of room - if so rehash into a larger segment
*/
    register hashentry *hp, *endp, *hashp;
#ifndef HASHTBLSIZE
    hashentry *oldhashtbl;
endif ifdef HASHTBLSIZE
    if (hashsize * 2 >= HASHTBLSIZE) {
        printf("Cannot rehash to larger than  d - aborting\7\n", HASHTBLSIZE/2);

exit(1);
    }
    hp = (endp = hashtbl) + hashsize;           /* set loop variables now */
    if (hashsize * (GROWFACTOR + 1) > HASHTBLSIZE)
        hashlimit = LIMITFACTOR * (hashsize = HASHTBLSIZE - hashsize);
    else {
        hashsize = hashsize * GROWFACTOR;
        hashlimit = LIMITFACTOR * hashsize;
    }
#ifdef obscure
    if (hashtbl == tblhash)
        hashtbl = tlbhash + HASHTBLSIZE - newhs;         /* at end */
```

```
        else
#endif obscure
        hashtbl = tblhash;        /* at beginning */
/* zero new hash table tallies */
    endp = (hashp = hashtbl) + hashsize;
    while (hashp < endp)
        hashp++->tf.tly = 0;
#else
    hp = (endp = (oldhashtbl = hashtbl)) + hashsize;
    hashsize = hashsize * GROWFACTOR;
    hashlimit = LIMITFACTOR * hashsize;
    if ((hashtbl = (hashentry *) calloc(hashsize, sizeof(hashentry))) == NULL) { printf("Cannot allocate  d bytes to rehash hashtbl - aborting\7\n",
                hashsize*sizeof(hashentry));
        exit(1);
    }
#endif
    printf("Rebuilding hash table to  d\n", hashsize);
/* rehash old entries into new table */
    while (--hp >= endp) {        /* backwards to mimic hashp */
        if (hp->tf.tly) {
            hashp = hashtbl + hash(hp->first, hp->second);
            while (hashp->tf.tly)
                if (--hashp < hashtbl)
                    hashp = hashtbl + hashsize - 1;
            *hashp = *hp;
        }
    }
#ifndef HASHTBLSIZE
    cfree(oldhashtbl);
#endif
} tidyup()
{
    register phrasetype *rilp, *rilend, temp;
    rilp = (rilend = rilist) + maxril;
    while (--rilp >= rilend) {
        temp = opilist[*rilp];
        opilist[*rilp] = opilist[--numphrases];
        opilist[numphrases] = temp;
    }
}

/************************************************************************
checkit()
{
    tallytype *tallies;
    tknfrz *p, *endp;
    unsigned int i, frzno;

if ((tallies = (tallytype *) calloc(ptlsize, sizeof(tallytype))) == NULL) {
        printf("Cannot allocate  d bytes to check - returning\7\n",
                numphrases*sizeof(tallytype));
        return;
    }
    endp = (p = stream) + maxstream - 2;
    while (p < endp) {
        if ((++p)->frz)
            if (p->frz >= ptlsize)
                printf("Phrase  d to big\7\n", p->frz);
            else
                tallies[p->frz]++;
```

```
            }
            for (i=1; i<numphrases; i++) {
                frzno = opilist[i];
                if (tallies[frzno] != ptlist[frzno].tt.tly)
                    printf("tallies[ 4d]= 4d, ptlist= 4d\7\n", frzno, tallies[frzno],
                        ptlist[frzno].tt.tly);
                if (ptlist[frzno].action != DO_NOTHING)
                    printf("ptlist[ 4d].action is  s\7\n", frzno,
                        (ptlist[frzno].action == REPLACE ? "REPLACE" : "DELETE"));
                tallies[frzno] = 0;
            }
            for (i=1; i<ptlsize; i++)
                if (tallies[i])
                    printf("tallies[ d]= d\7\n", i, tallies[i]);
            cfree(tallies);
        }
/*******************************************************************/
#include <stdio.h>
include <string.h> define PR_STR   (copy(pref_table[j], 4, strlen(pref_table[j]) - 4))
define NO_OF_TOKENS 9
#define DICTNAME "kjbible.sdc"
#define NEWDICT "kjbible.pdc"
#define TEMPFILE "temp1"
define OFFSET_MAX 31 char *get_prefix();
char pref_table [OFFSET_MAX+1][24];
char *copy();
FILE *df, *ndf,*tf;
int incnt, point_distance;

main()
{
    char prefix[24],str[24];
    int suff_large, off_large, pref_large, offset, l_case;

df = fopen(DICTNAME, "r");
    tf = fopen(TEMPFILE, "w");
    ndf = fopen(NEWDICT, "w");

special_tokens();
    prefix[0]='\0';
    point_distance = suff_large =  off_large = pref_large = 0;
    while (fscanf(df, " *d  s  *hx *d", str) != EOF) {
        l_case = c_change(str);
        incnt++;
        point_distance++;

strcpy(prefix,get_prefix(prefix,str));

if ((offset = incnt - pref_address(prefix)) == 0)
            point_distance = 0;

if ((point_distance   (OFFSET_MAX+1)) == 0) {
        offset = point_distance = 0;
        prefix[0]='\0';
        } push_stack(str);

fprintf(tf, " s",
```

```
      copy(str, diff_pos(str, prefix), strlen(str)-strlen(prefix)));
   fprintf(ndf, " 1d  2d  2d  3d  s\n", l_case, strlen(prefix),
      strlen(str) - strlen(prefix), offset,
      copy(str, diff_pos(str, prefix), strlen(str)-strlen(prefix)));

if (strlen(str) - strlen(prefix) > suff_large)
   suff_large=strlen(str) - strlen(prefix);
   if (strlen(prefix) > pref_large)
   pref_large=strlen(prefix);
   if (offset > off_large)
   off_large = offset;
 strcpy(prefix, str);
)
   fclose(df);
   fclose(tf);
   fclose(ndf);

printf("Largest offset  =  d\n",off_large);
   printf("Largest suffix  =  d\n",suff_large);
   printf("Largest prefix  =  d\n",pref_large);

)

c_change(str)
char *str;

(
  if (str[0] > 'Z')
     return(0);
  else (
     str[0]=tolower(str[0]);
     return(1);
  )

)

char *copy(str, start, chars)
char *str;
int start, chars;

(
   static char copystr[255];
   int j=0;

for (j=0; j<chars; ) (
      copystr[j]=str[start+j];
      j++;
   )

copystr[j]='\0';
   return(copystr);
)

special_tokens()

( char str [20];

for (incnt=0; incnt < NO_OF_TOKENS; ) (
   fscanf(df, " *d  s  *hx  *d", str);
```

```
         fprintf(ndf, "0  0  0   0  s\n",str);
      incnt++;
      }

} char *get_prefix(str1, str2)
char *str1, *str2;

{
    static char prefstr[24];
    int i = 0;
    char s1[2], s2[2];
    s1[0] = str1[0];
    s2[0] = str2[0];
    s1[1] = s2[1] = '\0';
    while (strcmp(s1,s2) == 0) {
    prefstr[i] = str1[i];
    i++;
    s1[0] = str1[i];
    s2[0] = str2[i];

}
    prefstr[i] = '\0';
    /*printf("* s* * s* * s*   \n",str1, str2, prefstr);*/
    return(prefstr);
} push_stack(str)
char *str;

{   int j;
    char temp[24];

for (j=1; j <= OFFSET_MAX; j++)
       strcpy(pref_table[j-1], pref_table[j]);
    sprintf(temp," 4.4hx s", incnt, str);
    strcpy(pref_table[OFFSET_MAX], temp);
    return;
} pop_stack(rec_no)
int rec_no;

{
    char temp[4];
    short unsigned val;

strncpy(temp,pref_table[rec_no], 4);
    sscanf(temp," 4hx", &val);
    return(val);

} pref_address(pref)
char *pref;

{
    int j, size, temp, dict_loc=0;

for (j=(OFFSET_MAX - point_distance + 1); j <= OFFSET_MAX; j++) {
     if ((size = diff_pos(PR_STR, pref)) > 0) {
```

```
            if (size == 9999) {      /* strings are equal   */
                if (strcmp(pref, "") != 0)
                    dict_loc = temp = j;
                break;
            }
            else
                if (size > dict_loc ) {
                    dict_loc = size;
                    temp = j;
                }
        }
    }
        if (dict_loc == 0)
            dict_loc = incnt;
        else
            dict_loc = pop_stack(temp);

/*      for (j=1; j<=(OFFSET_MAX); j++)
                printf(" d * s* * s* \n", j, pref_table[j], pref); */ return(dict_loc);
} diff_pos (str1,str2)
char *str1, *str2;

{
    int len, j;

if (strcmp(str1, str2) == 0) /* this value is OK to use in this   */
    j=9999;                      /* program but be carefull in other  */
                                 /* programs as if this value is used as */
                                 /*    an index in a string it is in fact */
                                 /* out of range.. */
    else {
    if (strlen(str1) > strlen(str2))
        len = strlen(str1);
    else len = strlen(str2);

for (j=0; j<len; ) {
        if (str1[j] != str2[j])
            break;
        j++;
    }
    } return(j);
} define CHUNKSIZE 16
include <stdio.h>

/* This program creates a C program which contains the initialisation for
   arrays associated with the phrase, chapter and dictionary files as
   well as creating another text file containing the reduced dictionary
   text, called "kjbible.dict". The C program created is called "data.c".
   (Output is in fact to standard output, it should be redirected to
   "data.c")
   The associated definitions (typedef's) and macro definitions for "data.c"
   are in a file called "kjdef.c"
*/
```

```
main()
{
    dictionary();
    chapters();
    phrases();
    /*books();
    tokens();*/
} books ()
{
    FILE *f;
    unsigned short val;
    int cnt=0;
    char str [22];

/*
        Note the book file is made up of
        strings each terminated by the
        line feed chararcter
    */
    f = fopen ("kjbible.bok", "r");
    printf ("reading book.. \n");
    while (fgets(str, 79, f) != NULL) {
        if ((cnt++   10) == 0)
        printf("............................. d\n", cnt-1);
        if (cnt < 10)
        printf(" s", str);
    }
    fclose (f);
    printf ("last line in file is below \n");
    printf(" s", str);
    printf("cnt =  d\n\n\n", cnt);
    return;
} chapters ()
{
    FILE *f;
    unsigned val;
    int val2, cnt=0;
    char str[22];

f = fopen ("kjbible.cch", "r");
    fgets(str, 79, f); /* this line wil be permanently discarded when
                      the binary conversion is done */
    printf("chapterpointer far _chap[] = {\n");
    while (fscanf(f, " x d", &val, &val2) != EOF)
    printf("ch( d, d),\n", val, val2);
    printf("last_ch( d, d)};\n", val, val2);
    fclose (f);
    return;
} phrases ()
{
    FILE *f;
    unsigned short val1, val2;
    int cnt=0;
    int largest=0;
    char ch ,str[22];
```

```
    f = fopen ("kjbible.frz", "r");
    fgets(str, 79, f); /* the first character in this line will be permanently
                          discarded when the binary conversion is done, the
                          other wil be written to the constant file..
                        */
    printf("phrasepointer _phrase[] = (\n");
    while (fscanf(f, " hx hx",&val1, &val2) != EOF) {
    printf("frz( d, d),\n", val1, val2,ch);
        /*if (val1>largest)
      largest = val1;
      else
      if (val2>largest)
         largest = val2;*/
    }
    fclose (f);
    printf("0);\n");
    /*printf ("largest value in file is  d \n", largest);*/
    return;
} tokens ()
{
    FILE *f;
    unsigned short val;
    int cnt=0;

f = fopen ("kjbible.ctn", "r");
    printf ("reading token file...\n\n\n");
    while (fscanf(f, " hx",&val) != EOF) {
        if ((cnt++   10000) == 0)
          printf("........................ d\n", cnt-1);
        if (cnt < 10)
          printf(" x\n", val);
    }
    fclose (f);
    printf ("last value in file is below \n");
    printf(" x\n", val);
    printf("cnt =  d\n\n\n", cnt);
    return;
} dictionary ()
{
    int i, l_case, prefix, offset, suffix, len, cnt=0;
    unsigned short ptr_array[12580];
    FILE *df, *f;
    char ch, str[22], dict[35947];
    f = fopen ("kjbible.pdc", "r");
    df = fopen ("kjbible.dict", "w");
    dict[35946]='\0';

/* to be written to definition files....

printf("typedef struct(\n");
    printf("             unsigned char pf_case:1;\n");
    printf("             unsigned char pf_length:5;\n");
    printf("             unsigned char pf_prefix:4;\n");
    printf("             unsigned char pf_suffix:4;\n");
    printf("             unsigned char pf_offset:5;\n");
    printf("             ) prefix;\n\n");
    */
    printf ("prefix far prefixes [] = (\n");
    i=0;
    while (fscanf(f, " 1d  2d  2d  3d  s",
```

```
                &l_case, &prefix, &suffix, &offset, str) != EOF) {
            if (suffix != 0) { /* ignore special tokens */
            if (strcmp(str, "zims") == 0)
                ch = ' ';
            else
                ch = ',';
            len = suffix + prefix;
            suffix--;
            if (suffix > 15) {
                suffix = 15;
                str[16] = '\0';
            } printf("pf( d, d, d, d, d) c\n",
                    l_case, len, prefix, suffix, offset, ch);
            strcat(&dict[cnt], str);
              ptr_array[i++]=cnt;
            cnt += strlen(str);
            }
        } printf(");\n");
    fprintf (df, " s", dict);
    fclose (f);
    fclose (df);
    printf("dictpointer far dictp[] = {\n");
    for (cnt=0; cnt<i; ) {
    printf("p_ d( d)\n", (cnt CHUNKSIZE),
            ptr_array[cnt++]);
    }
    printf("0);\n");   /* simplifies p_ macro in kjdef.c */
    return;
}
/* The purpoose of this program is to change the relative addresses stored in
   the token and phrase files according to the newly sorted dictionary file */ include <stdio.h>
define DICTFILE "amtg.sdc"
#define RECS 0x10000

FILE *fp, *newpoint, *dictpoint, *open_file();
unsigned short dict_array[RECS];
int ignore;

main(argc, argv)
int argc;
char *argv[];
{
    char fname[12];

if(argc<5)
    {
            fprintf(stderr, "usage : reorder <dictionary> <input stream> <ig
nore lines> <output stream>\n");
            exit(1);
    }
    if(argc >= 2)
        dictpoint = open_file(argv[1],"r");
    make_dict_array();
    close_file(dictpoint);

if(argc >=3)
```

```
    fp=open_file(argv[2],"r");
    if(argc >=4)
    ignore = atoi(argv[3]);
    else
    ignore = 0;

if(argc >= 5)
    newpoint=open_file(argv[4],"w");
    change_addresses();

close_file(fp);
    close_file(newpoint);
}

FILE *open_file(fname,mode)
    char *fname;
    char *mode;
{
    FILE *fp;

printf (" s: ",fname);
    fp = fopen(fname,mode);
    if (fp == NULL)
    printf("file NOT opened .......\n");
    else
    printf("file OPENED successfully ......\n");
    return(fp);
} close_file (fp)
FILE *fp ;
{
    fclose (fp);

} make_dict_array()
{
    unsigned short a;
    int i;

printf("\n\n\nFilling dictionary array......\n");

for (i=0;i<=RECS;i++)
    dict_array[i]=i;

i=1;
    while (fscanf(dictpoint," *d *s hx *d",&a) == 1) {
        dict_array[a]=i++;

if ((i 1000)==0)
            printf(" d \n",i);
        /*
        printf (" 4.4hx \n",a);
        */
    }
    printf("\n\n....\n\n");
    return;
} change_addresses()
```

```c
{   int i;
    unsigned short a;
    char str[80],b;

for (i = 0; i<ignore; i++)
        fputs (fgets(str,sizeof(str)-1,fp), newpoint);

i=1;
    printf("\n\nReplacing addresses in table...\n");
    while (fscanf(fp, " %hx", &a) != EOF) {
/*
    printf (" 4.4hx ---> ", a);
*/
    a=dict_array [a];
/*
    printf (" 4.4hx \n", a);
    */ if ((i 16)==0)
       b='\n';
    else
       b=' ';
    if ((i 10000)==0)
          printf(" d \n",i);

fprintf (newpoint, " 4.4hx c", a, b);

i++;
    }
    return;
}
```

Refer to /user/pk/doco/technique.doc for a description of the algorithm used here.
The analysis results in <filename>.frz are used to compress <filename>.stn to <filename>.ctn with the pointer list file <filename>.sch updated to <filename>.cch.
*/

```c
/*****************
*** constants ***
*****************/
#define MAXNAME 40    /* maximum file name size excluding extensions */
                      /* ensure scanf argument in main() corresponds */
#define GROWFACTOR 1.5    /* the factor by which the hash table grows
                             when it overflows */
#define LIMITFACTOR 0.7   /* factor to calculate hash table too full */
#define INITHASHSIZE 1000 /* initial hash table size */
/* STREAMSIZE is the maximum number of tokens in input stream */
/* STREAMSIZE can be commented out if calloc() can handle the huge requests */
#define STREAMSIZE 2200000
/* HASHTBLSIZE is the maximum size of hash table, <=STREAMSIZE */
/* HASHTBLSIZE can be commented out if calloc() can handle the huge requests */
/*   #define HASHTBLSIZE STREAMSIZE   */
#define FALSE    0
#define TRUE     1
/* indicators for frztbl[].ind */
#define TO_DO    0     /* assumed set by calloc */
#define DOING    1
#define DONE     2

/*********************
*** hash function ***
*********************/
#define hash(a,b)    (((a)+6283)*((b)+1234) hashsize)
```

```c
/*******************************
*** standard C definitions ***
*******************************/
#include <stdio.h>
char *calloc();

/**************************
*** type definitions ***
**************************/
/* tokentype is a 16 bit type, used for large arrays */
typedef unsigned short tokentype;

/* segindex is a segment pointer, addr is the token index, offset is the
decompressed phrase token number */
typedef struct {
    unsigned int addr, offset;
} segindex;

/* hashentry is a hash table element */
typedef struct {
    tokentype first, second, phrase;
} hashentry;

/* frzentry is a phrase table element */
typedef struct {
    tokentype fst, scnd;
    char ind;
} frzentry;
/**************************
*** global variables ***
**************************/
FILE *stnfp,    /* standard token stream file pointer, input */
    *chpfp,     /* segment pointer list file pointer, input */
    *frzfp,     /* phrase compression list file pointer, input */
    *ctnfp,     /* compressed phrase token stream file pointer, output */
    *cchfp;     /* compressed segment pointer list file pointer, output */
char filename[MAXNAME+5],   /* base file name (excluding extension) */
    *fnextp;    /* pointer to end of filename (beginning of extension) */
segindex *segtbl;   /* array list of segment offsets */
int numsegs,        /* number of segments */
    numfrzs,        /* number of phrases */
    numiters,       /* size of itertbl */
    numtodo,        /* number of phrases left to process */
    iteration,      /* iteration number */
    maxstream,      /* size of stream array */
    numzeros,       /* number of zeros found in token stream */
    nocasb,     /* false if compression across segment boundaries allowed */
    hashsize,       /* hash table size */
    hashlimit,      /* hashsize*LIMITFACTOR, used to trigger rebuildhashtbl() */
    numred;     /* number of reduction phrases */
tokentype *stream,  /* array containing token stream */
    maxtknval,      /* maximum token value + 1 */
    maxhex,     /* maximum hex value + 1 */
    frzhex;     /* initial phrase hex value */
frzentry *frztbl,   /* phrase table */
    **itertbl,      /* iteration table with pointers into frztbl */
    **iterp;        /* pointer into itertbl */
hashentry *hashtbl; /* hash table array */
#ifdef HASHTBLSIZE
hashentry *tblhash;
endif /************
* code *
************/
```

```
main()
{
    FILE *openext();
    static int iteration=0;
    int hex;
    char answer[2];
#ifdef STREAMSIZE
    tokentype streamarray[STREAMSIZE];
#endif
ifdef HASHTBLSIZE
    hashentry hashtblarray[HASHTBLSIZE];    /* hash table array */
endif ifdef STREAMSIZE
    stream = streamarray;
#endif
ifdef HASHTBLSIZE
    tblhash = hashtblarray; /* used in rebuildhashtbl() */
#endif
    printf("Base name of file to be compressed? ");
    scanf(" 40s", filename);        /* 40 should correspond with MAXNAME */
/* find end of filename */
    fnextp = filename - 1;
    while (*++fnextp)
        ;
    if ((stnfp = openext(".stn", "r")) == NULL) {
        printf("Can't open  s.stn\7\n", filename);
        exit(1);
    }
    if ((chpfp = openext(".sch", "r")) == NULL) {
        printf("Can't open  s.sch\7\n", filename);
        exit(1);
    }
    if ((frzfp = openext(".frz", "r")) == NULL) {
        printf("Can't open  s.frz - aborting\7\n", filename);
        exit(1);
    }
    if ((ctnfp = openext(".ctn", "w")) == NULL) {
        printf("Can't open  s.ctn - aborting\7\n", filename);
        exit(1);
    }
    if ((cchfp = openext(".cch", "w")) == NULL) {
        printf("Can't open  s.cch - aborting\7\n", filename);
        exit(1);
    }
    printf("\nReading segment pointers\n");
    readinseg();
    fclose(chpfp);
    maxstream = segtbl[numsegs-1].addr + 1;
    printf("Reading in phrase table\n");
    readinfrz();
    fclose(frzfp);
    maxknval = frzhex + numfrzs;
    hashsize = INITHASHSIZE;
    hashlimit = hashsize * LIMITFACTOR;
/* allocate hash table */
#ifdef HASHTBLSIZE
    hashtbl = hashtblarray;
#else
    if ((hashtbl = (hashentry *) calloc(hashsize, sizeof(hashentry))) == NULL) { printf("Cannot allocate  d bytes for hash table - aborting\n",
            hashsize * sizeof(hashentry));
        exit(1);
```

```
        )
#endif
    printf("Reading in standard token stream,  d tokens expected\n",
        segtbl[numsegs-1].addr);
    readintkn();
    fclose(stnfp);
    numtodo = numfrzs;
    iterp = itertbl;
    while (numtodo) {
    printf("Iteration  d, stream =  d, phrases =  d, analysis =   d\n",
            ++iteration, segtbl[numsegs-1].addr, numtodo, iterp-itertbl+1);
    setfrz();
    printf("Reducing  d phrases\n", numred);
/*  checkit();       */
    reduce();
    cleanup();
    numtodo -= numred;
    }
    if (numzeros)
    removezeros();
    printf(" d compressed tokens,  d phrases\n", segtbl[numsegs-1].addr,
        numfrzs);
    printf(" d tokens overall\n", segtbl[numsegs-1].addr + 2*numfrzs);
    printf("Writing  s.cch\n", filename);
    writecch();
    printf("Writing  s.ctn\n", filename);

printf("Finished\7\7\n");
    exit(0);
}

FILE *openext(ext, mode)
char *ext, *mode;
{
    char *s;
    FILE *retval;

s = fnextp;
    while (*s++ = *ext++)
    ;
    retval = fopen(filename, mode);
    *fnextp = '\0';
    return retval;
} readinseg()
{
    int val, hex;
    register segindex *segp, *endp;

/* skip initial 0, checked by analyse */
    fscanf(chpfp, " *x");
/* find the number of segments */
    numsegs = -1;
    do {
    val = fscanf(chpfp, " x", &hex);
    numsegs++;
    } while (val != EOF && val);
    if (val == 0) {
    printf("Error reading  s.sch at value  d - aborting\7\n", filename,
            numsegs+1);
    exit(1);
    }
    if (numsegs < 1) {
```

```
        printf("Require at least 0 and number of tokens in  s.sch - aborting\n", filename);
        exit(1);
        }
/* rewind, lseek(chpfp->??, 0L, 0) could be used */
        close(chpfp);
        chpfp = openext(".sch", "r");
        fscanf(chpfp, " *x");    /* skip initial 0 */
        if ((segtbl = (segindex *) calloc(numsegs, sizeof(segindex))) == NULL) {
        printf("Can't allocate  d bytes for segtbl - aborting\7\n",
                numsegs*sizeof(segindex));
        exit(0);
        }
        endp = (segp = segtbl) + numsegs;
        while (segp < endp) {
            fscanf(chpfp, " x", &hex);
            segp++->addr = hex;
/*          segp->offset = 0;   */
        }
        printf(" 8d segment pointers read\n", numsegs+1); /* +1 includes initial
                                                            0 */
} readinfrz()
{
    char answer[2];
    int val, hex, hex2;
    register frzentry *frzp, *endp;
    register char c;

/* read in "compress across boundaries?" and "next token hex value" */
    fscanf(frzfp, " 1s x", answer, &hex);
    nocasb = *answer == 'n';
    frzhex = hex;
    printf(" sompressing across segment boundaries,\
 first phrase value is ' x' hex\n", (nocasb ? "Not c" : "C"), hex);
/* find the number of phrases */
    numfrzs = -1;
    numiters = 0;
    do {
    val = fscanf(frzfp, " *x x", &hex);
    numfrzs++;
    while ((c = getc(frzfp)) == ' ')
        ;
    if (c == '\n')
        if ((c = getc(frzfp)) == '\n')
            numiters++;
        else
            ungetc(c, frzfp);
    else
        ungetc(c, frzfp);
    } while (val != EOF && val);
    if (val == 0) {
    printf("Error reading  s.frz at value  d - aborting\7\n", filename,
            numfrzs+1);
    exit(1);
    }
    if (numfrzs < 1) {
    printf("No phrases found in  s.frz - aborting\7\n", filename);
    exit(1);
    }
/* rewind, lseek(frzfp->??, 0L, 0) could be used */
    close(frzfp);
```

```
    frzfp = openext(".frz", "r");
    fscanf(frzfp, " *1s *x");              /* skip header */
    if ((frztbl = (frzentry *) calloc(numfrzs, sizeof(frzentry))) == NULL) {
    printf("Can't allocate  d bytes for frztbl - aborting\7\n",
            numfrzs *.sizeof(frzentry));
    exit(1);
    )
    itertbl = (frzentry **) calloc(numiters+1, sizeof(frzentry *));
    if ((iterp = itertbl) == NULL) {
    printf("Can't allocate  d bytes for itertbl - aborting\7\n",
            (numiters+1) * sizeof(frzentry *));
    exit(1);
    }
    endp = (*(iterp++) = frzp = frztbl) + numfrzs;
    while (frzp < endp) {
        fscanf(frzfp, " x  x", &hex, &hex2);
/*  frzp->ind = TO_DO;     */
        frzp->fst = hex;
        frzp++->scnd = hex2;
    while ((c = getc(frzfp)) == ' ')
        ;
    if (c == '\n')
        if ((c = getc(frzfp)) == '\n')
            *(iterp++) = frzp;
        else
            ungetc(c, frzfp);
    else
        ungetc(c, frzfp);
    }
    printf(" 8d phrases read,  d analysis iterations\n", numfrzs, numiters);
)

readintkn()
{
    register tokentype *tp, *endp;
    int hex;
    register int count, val;

/* Elxsi C allocation has problems beyond 5Mbyte hence a compile time
value can be used instead */
#ifdef STREAMSIZE
    if (STREAMSIZE < maxstream) {
    printf("Compile time variable 'STREAMSIZE' is only  d which is smaller\
than\nthe expected number of tokens - aborting\n", STREAMSIZE);
        exit(1);
    }
else
/* allocate stream array */
    if ((stream = (tokentype *) calloc(maxstream, sizeof(tokentype)))
        == NULL) {
    printf("Cannot allocate  d bytes for stream array - aborting\n",
            maxstream * sizeof(tokentype));
    exit(1);
    }
#endif
/* read in tokens */
    maxhex = count = 0;
    endp = (tp = stream) + segtbl[numsegs-1].addr;
    while (tp < endp) {
    val = fscanf(stnfp, " x", &hex);
    if (val == EOF) {
        printf("Unexpected end of file in s.stn,  d tokens read so far,\n\
 d expected - aborting\n", filename, tp-stream-1, maxstream - 3);
        exit(1);
```

```
    } else if (val == 0) {
        printf("Error reading  s.stn at value  d - aborting\7\n", filename,
            tp-stream);
        exit(1);
    }
    if (maxhex < (*(tp++) = hex))
        maxhex = hex;
    else if (hex == 0)
        numzeros++;
    if (++count 10000 == 0)
        printf("\015 8d", count);
    }
/* check if no more left */
    if (fscanf(stnfp, " *x") != EOF)
        printf("\015More tokens found after last segment pointer - \
ignoring!\7\n");
    *tp = 0;                  /* place extra 0 to satisfy boundary requirements */
    printf("\015 8d standard tokens read, maximum hex value is  x\n",
        maxstream - 1, (unsigned int) maxhex++);
    if (maxhex != frzhex) {
        printf("Inconsistant values - maximum hex value ' x' should be one\n\
 less than phrase table base value ' x' - aborting\7\n",
            (unsigned int) maxhex-1, (unsigned int) frzhex);
        exit(1);
    }
}
setfrz()    /* sets the next phrase reductions */
/* hash table is assumed clean (0 frzs), the next set of phrases are placed
in the hash table then any allowable following phrases */
{
    register hashentry *hashp;
    register frzentry *frzp, *endp;
    int nonefound;
    tokentype maxhex2, base;
    char *prevfst, *todoprevscnd, *notmade;

/* allocate prevfst, todoprevscnd and notmade arrays - note they are
zeroed by calloc */
    if ((prevfst = calloc(maxtknval, sizeof(char))) == NULL) {
        printf("Cannot allocate  d bytes for prevfst array - aborting\7\n",
            maxtknval);
        exit(1);
    }
    if ((todoprevscnd = calloc(maxtknval, sizeof(char))) == NULL) {
        printf("Cannot allocate  d bytes for todoprevscnd array - aborting\7\n",
            maxtknval);
        exit(1);
    }
    if ((notmade = calloc(maxtknval, sizeof(char))) == NULL) {
        printf("Cannot allocate  d bytes for notmade array - aborting\7\n",
            maxtknval);
        exit(1);
    }
/* initialise variables */
    numred = 0;
    nonefound = TRUE;
    frzp = *iterp;
    while (nonefound) {
        endp = *++iterp;
    frzp--;
        while (++frzp < endp) {
        if (frzp->ind == TO_DO) {
                if (nonefound) {
```

```
                base = maxhex;
                nonefound = FALSE;
            }
            hashp = hashtbl + hash(frzp->fst, frzp->scnd);
            while (hashp->phrase) {
                if (--hashp < hashtbl)
                    hashp = hashtbl + hashsize - 1;
            }
            hashp->first = frzp->fst;
            hashp->second = frzp->scnd;
            hashp->phrase = maxhex++;
            prevfst[frzp->fst] = TRUE;
/*          frzp->ind = DOING;       needn't set it */
            if (++numred >= hashlimit)
                rebuildhashtbl();
            } else {
            frzp->ind = DONE;
            maxhex++;
        }
    }
    }
    maxhex2 = maxhex-1;                /* must leave maxhex alone */
    while (++maxhex2 < maxtknval) {
    if (frzp->ind == TO_DO) {
        if ((!todoprevscnd[frzp->fst]) && (!notmade[frzp->fst]) &&
            (!prevfst[frzp->scnd]) && ((frzp->scnd < base) ? TRUE :
            (frztbl[frzp->scnd-frzhex].ind == DONE))) {
            hashp = hashtbl + hash(frzp->fst, frzp->scnd);
            while (hashp->phrase) {
                if (--hashp < hashtbl)
                    hashp = hashtbl + hashsize - 1;
            }
            hashp->first = frzp->fst;
            hashp->second = frzp->scnd;
            hashp->phrase = maxhex2;
            frzp->ind = DOING;
            if (++numred >= hashlimit)
                rebuildhashtbl();
        } else
            todoprevscnd[frzp->scnd] = notmade[maxhex2] = TRUE;
        prevfst[frzp->fst] = TRUE;
        } else
        frzp->ind = DONE;
    frzp++;
    }
    cfree(prevfst);
    cfree(todoprevscnd);
    cfree(notmade);
} reduce()
{
    register tckentype first, second, *oldstm, *newstm, *endstm;
    register hashentry *hashp;
    register segindex *seg, *endseg;

/* pass through stream replacing token pairs for a new token */
    endseg = (seg = segtbl) + numsegs;
    newstm = oldstm = stream;
    second = *(oldstm++);
    while (seg < endseg) {
    endstm = stream + seg->addr;
skip:      while (oldstm < endstm) {
        first = second;
```

```
        hashp = hashtbl + hash(first, (second = *(oldstm++)));
        while (hashp->phrase) {
            if ((first == hashp->first) && (second == hashp->second)) {
                second = hashp->phrase;
                goto skip;
            }
            if (--hashp < hashtbl)
                hashp = hashtbl + hashsize - 1;
        }
        *(newstm++) = first;
    }
    if (nocasb) {
        *(newstm++) = second;
        seg->addr = newstm - stream;
        second = *(oldstm++);
    } else {
        first = second;
        hashp = hashtbl + hash(first, (second = *oldstm++));
        while (hashp->phrase) {
            if ((first == hashp->first) && (second == hashp->second)) {
                seg->addr = newstm - stream;
                seg->offset += density(first);
                second = hashp->phrase;
                goto segend;
            }
            if (--hashp < hashtbl)
                hashp = hashtbl + hashsize - 1;
        }
        *(newstm++) = first;
        seg->addr = newstm - stream;
    }
segend:    seg++;
    }
} removezeros()
{
    register tokentype tkn, *oldstm, *newstm, *endstm;
    register segindex *seg, *endseg;

/* pass through stream deleting zeros */
    endseg = (seg = segtbl) + numsegs;
    newstm = oldstm = stream;
    while (seg < endseg) {
    endstm = stream + seg->addr;
    while (oldstm < endstm) {
        if (tkn = *(oldstm++))
            *(newstm++) = tkn;
    }
    seg->addr = newstm - stream;
        seg++;
    }
} rebuildhashtbl()
{
/*
to rebuild the hash table:
if it is dynamic (HASHTBLSIZE undefined) request a larger array, rehash the
current contents and cfree the old hash table.
If the hash table is static see if the current hash table only takes up
a small amount of room - if so rehash into a larger segment
*/
    register hashentry *hp, *endp, *hashp;
```

```
#ifndef HASHTBLSIZE
    hashentry *oldhashtbl;
endif ifdef HASHTBLSIZE
    if (hashsize * 2 >= HASHTBLSIZE) {
    printf("Cannot rehash to larger than  d - aborting\7\n", HASHTBLSIZE/2);

exit(1);
    }
    hp = (endp = hashtbl) + hashsize;           /* set loop variables now */
    if (hashsize * (GROWFACTOR + 1) > HASHTBLSIZE)
    hashlimit = LIMITFACTOR * (hashsize = HASHTBLSIZE - hashsize);
    else {
    hashsize = hashsize * GROWFACTOR;
    hashlimit = LIMITFACTOR * hashsize;
    }
    if (hashtbl == tblhash)
    hashtbl = tblhash + HASHTBLSIZE - newhs;    /* at end */
    else
    hashtbl = tblhash;       /* at beginning */
/* zero new hash table phrases */
    endhashp = (hashp = hashtbl) + hashsize;
    while (hashp < endhashp)
    hashp->phrase = 0;
#else
    hp = (endp = (oldhashtbl = hashtbl)) + hashsize;
    hashsize = hashsize * GROWFACTOR;
    hashlimit = LIMITFACTOR * hashsize;
    if ((hashtbl = (hashentry *) calloc(hashsize, sizeof(hashentry))) == NULL) { printf("Cannot allocate  d bytes to rehash hashtbl - aborting\7\n",
            hashsize*sizeof(hashentry));
    exit(1);
    }
#endif
    printf("Rebuilding hash table to  d\n", hashsize);
/* rehash old entries into new table */
    while (--hp >= endp) { /* backwards to mimic hashp */
    if (hp->phrase) {
        hashp = hashtbl + hash(hp->first, hp->second);
        while (hashp->phrase)
            if (--hashp < hashtbl)
                hashp = hashtbl + hashsize - 1;
        *hashp = *hp;
    }
    }
#ifndef HASHTBLSIZE
    cfree(oldhashtbl);
#endif
} cleanup()
{
    register hashentry *hashp, *hashend;

hashend = (hashp = hashtbl) + hashsize;
    while (hashp < hashend)
    hashp++->phrase = 0;
} writecch()
{
    register segindex *segp, *endp;
    register int count;
```

```
        fprintf(cchfp, " c  d segments\n", (nocasb ? 'n' : 'y'), numsegs);
        count = 0;
        endp = (segp = segtbl) + numsegs;
        if (nocasb)
            while (segp < endp)
            if (++count 16 != 0)
                fprintf(cchfp, " x ", (segp++)->addr);
            else
                fprintf(cchfp, " x\n", (segp++)->addr);
        else
            while (segp < endp) {
            if (++count 8 != 0)
                fprintf(cchfp, " x  x ", segp->addr, segp->offset);
            else
                fprintf(cchfp, " x  x\n", segp->addr, segp->offset);
            segp++;
            }
} writectn()
{
    register tokentype *stmp, *endp;
    register int count;
    count = 0;
    endp = (stmp = stream) + segtbl[numsegs-1].addr;
    while (stmp < endp) {
    if (++count 16 != 0)
        fprintf(ctnfp, " x ", (unsigned int) *(stmp++));
    else
        fprintf(ctnfp, " x\n", (unsigned int) *(stmp++));
    if (count 10000 == 0)
        printf("\015 8d", count);
    }
    printf("\015 8d tokens written\n", count);
} int density(tkn)
tokentype tkn;
{
    frzentry *frzp;

if (tkn < frzhex)
    return 1;
    frzp = frztbl + tkn - frzhex;
    return density(frzp->fst) + density(frzp->scnd);
}
/************************************************************************
checkit()
{
    register int count;
    register hashentry *hashp, *endp;

count = 0;
    endp = (hashp = hashtbl) + hashsize;
    hashp--;
    while (++hashp < endp)
    if (hashp->phrase) {
        count++;
        printf(" x  x  x\n", (unsigned int) hashp->first,
            (unsigned int) hashp->second, (unsigned int) hashp->phrase);

}
    printf("Checked - d phrases found\n", count);
}
************************************************************************/
```

```
if [ -z "$1" ]
then        bib=kjbible
else        bib=$1
fi (grep _TKN $bib.rdc; grep -v _TKN $bib.rdc | sort +1bdf) >$bib.ldc
```

$

```
/*
tknize.c

This program processes the input file to create a standard token stream and
a dictionary file.

Words are considered as a string of lower case alphabetic characters only.

Words beginning with a capital have the capital replaced with
next_character_uppercase and the lower case form of the character.

Words which are all capitals are replaced with next_word_uppercase and
the lowercase form of the word.

Words which are a mixture of upper and lower case have the uppercase
characters preceded by the next_character_uppercase token.  A warning
message is also printed.

The dictionary file has each word to a line including any special characters
except the null character.  Special characters are assigned a token value
as are words when they are encountered for the first time.

*/

/****************
*** constants ***
****************/
#define BOOK1_TKN  0x0001
#define BOOK2_TKN  0x0002
#define CHAPT_TKN  0x0003
#define LNBRK_TKN  0x0004
#define NOSPC_TKN  0x0005
#define SPACE_TKN  0x0006
#define UPCHR_TKN  0x0007
#define UPWRD_TKN  0x0008
define VERSE_TKN  0x0009 define FIRSTWORD_TKN 0x000a define MAXWORDLENGTH 40   /* maximum word length */
define MAXNAME 40  /* maximum file name size excluding extensions */
                    /* ensure scanf argument in main() corresponds */
#define GROWFACTOR 1.5     /* the factor by which the phrase tally list grows
                              when it overflows */
#define LIMITFACTOR 0.95   /* factor to calculate hash table too full */
#define DEFAULTHASHSIZE    25000  /* default hash table size */
#define REPORTVAL    1000  /* reported interval of lineno */
#define FALSE       0
#define TRUE        1

/********************************
*** standard C definitions ***
********************************/
#include <stdio.h>
#include <ctype.h>
char *calloc();
```

```c
/***********************
*** type definitions ***
***********************/
/* tokentype is a 16 bit type, used for large arrays */
typedef unsigned short tokentype;
/* tallytype is 16 bits but if a tally>65536 is required 32 bits can be used,
used for large arrays */
typedef unsigned short tallytype;

typedef unsigned char lengthtype;

/* hashentry is a hash table element */
typedef struct {
    char *wordp;
    lengthtype length;
    tokentype wrdtkn;
    tallytype tally;
} hashentry;

typedef short boolean;

/***********************
*** global variables ***
***********************/
FILE *txtfp,        /* raw input text */
    *rtnfp,         /* standard token stream file pointer, output */
    *lchfp,         /* chapter pointer list file pointer, output */
    *bokfp,         /* book pointer list file pointer, output */
    *rdcfp;         /* phrase compression list file pointer, output */
char filename[MAXNAME+7],   /* base file name (excluding extension) */
    *fnextp,        /* pointer to end of filename (beginning of extension) */
    word[MAXWORDLENGTH],    /* current word */
    *endword;       /* end of word */
int numtkns = 0,    /* number of tokens written to .rtn file */
    numwords = 0,   /* number of distinct words */
    numpunct = 0,   /* number of punctuation characters */
    numbooks = 0,   /* number of books */
    numchaps = 0,   /* number of chapters */
    numverses = 0,  /* number of verses */
    maxlength = 0,  /* maximum word length found */
    lineno = 1,     /* input file line number */
    nospctly = 0,   /* NOSPC_TKN tally */
    spacetly = 0,   /* SPACE_TKN tally */
    upchrtly = 0,   /* UPCHR_TKN tally */
    upwrdtly = 0,   /* UPWRD_TKN tally */
    hashsize,       /* hash table size */
    hashlimit,      /* hashsize*LIMITFACTOR, used to trigger rebuildhashtbl() */
    numentries = 0; /* number of hash table entries */
tokentype nexttkn = FIRSTWORD_TKN;  /* maximum hex value + 1 */
hashentry *hashtbl; /* hash table array */

/************
* code *
************/ main()
{
    FILE *openext();
    char c;
    int val;

setbuf(stdout, (char *) 0);             /* unbuffered output */
    printf("Base name of file to be compressed? ");
    gets(filename); /* 40 should correspond with MAXNAME */
/* find end of filename */
```

```
    fnextp = filename - 1;
    while (*++fnextp)
        ;
    if ((fnextp - filename) > MAXNAME - 1) {
        printf("Filename too long - maximum is  d characters\7\n", MAXNAME);
        exit(1);
    }
    if ((txtfp = openext(".txt", "r")) == NULL) {
        printf("Can't open  s.txt for reading - aborting\7\n", filename);
        exit(1);
    }
    if ((rtnfp = openext(".rtn", "w")) == NULL) {
        printf("Can't open  s.rtn for writing - aborting\7\n", filename);
        exit(1);
    }
    if ((lchfp = openext(".lch", "w")) == NULL) {
        printf("Can't open  s.lch for writing - aborting\7\n", filename);
        exit(1);
    }
    if ((bokfp = openext(".bok", "w")) == NULL) {
        printf("Can't open  s.bok for writing - aborting\7\n", filename);
        exit(1);
    }
    if ((rdcfp = openext(".rdc", "w")) == NULL) {
        printf("Can't open  s.rdc for writing - aborting\7\n", filename);
        exit(1);
    }
    printf("Initial hash table size [ d]? ", DEFAULTHASHSIZE);
    if ((c = getchar()) == '\n')
        hashsize = DEFAULTHASHSIZE;
    else {
        ungetc(c, stdin);
        scanf(" d", &hashsize);
    }
    hashlimit = LIMITFACTOR * hashsize;
/* allocate hash table */
    if ((hashtbl = (hashentry *) calloc(hashsize, sizeof(hashentry))) == NULL) { printf("Cannot allocate  d bytes for hash table - aborting\n",
            hashsize * sizeof(hashentry));
        exit(1);
    }
    printf("Processing...\n");
    makedictn();
    printf("\n d tokens output,  d different words,  d punctuation\
 characters\n", numtkns, numwords, numpunct);
    printf("Hash table  d  full with  d entries\n",
        numentries*100/hashsize, numentries);
    printf(" d books,  d chapters,  d verses\n", numbooks, numchaps, numverses);

fclose(txtfp);
    fclose(rtnfp);
    fclose(lchfp);
    fclose(bokfp);
    printf("Writing dictionary...");
    writedictn();
    fclose(rdcfp);
    putchar('\n');
    exit(0);
}

FILE *openext(ext, mode)
char *ext, *mode;
{
    char *s;
```

```
FILE *retval;

s = fnextp;
while (*s++ = *ext++)
    ;
    retval = fopen(filename, mode);
    *fnextp = '\0';
    return retval;
} makedictn()
{
    char bookname[6], *bookp, c, *chapbkp;
    int i;
    boolean eoln, verse, chap, space, inword, lookup();

if ((c = fgetc(txtfp)) == '\n') {
    c = fgetc(txtfp);
    lineno++;
    }
    while (c != EOF) {
/*****************************************************************
    if (c != ' ') {
        ungetc(c, txtfp);
        printf("Unexpected non blank at beginning of book in line  d\7\n",
               lineno);
    } else if ((c = fgetc(txtfp)) != ' ') {
        ungetc(c, txtfp);
        printf("Unexpected non blank at beginning of book in line  d\7\n",
               lineno);
    } else
        c = getc(txtfp);
*****************************************************************/
        bookp = bookname;           /* read in book name */
        *bookp++ = c;
        for (i = 0; i < 3; i++)
            *bookp++ = getc(txtfp);
        *bookp = '\0';
        if (*(--bookp) == ' ')
            *bookp = '\0';
        else if ((c = getc(txtfp)) != ' ') {
            printf("Error in \" s\" book beginning - not aborting\7\n", bookname
);
            /*exit(1);*/
        }
        chapbkp = "1:1 ";           /* validate "1:1 " */
        while (*chapbkp++ == (c = fgetc(txtfp)))
            ;
        if (*(--chapbkp) != '\0') {
            printf("Error in \" s\" book beginning at line  d - not aborting\t\n"
,
                   bookname, lineno);
            /*exit(1);*/
        }
        fprintf(bokfp, " -4.4s  d\n", bookname, numchaps);
    numbooks++;
    putchap(numtkns);
    puttkn(LNBRK_TKN);
    puttkn(BOOK1_TKN);
    puttkn(LNBRK_TKN);
    puttkn(BOOK2_TKN);
    puttkn(LNBRK_TKN);
    puttkn(LNBRK_TKN);
        verse = chap = space = TRUE;
    inword = FALSE;
```

```
            while ((c != '\n') && (c != EOF)) {
                if (chap) {
                    puttkn(LNBRK_TKN);
                    puttkn(CHAPT_TKN);
                    puttkn(LNBRK_TKN);
                    chap = FALSE;
                }
                if (verse) {
                    puttkn(VERSE_TKN);
                    numverses++;
                    verse = FALSE;
                }
                eoln = FALSE;
                while (!eoln) {            /* process rest of line normally */
                    switch (c) {
                        case EOF:
                            printf("Unexpected end of .txt file!\7\n");
                            puttkn(LNBRK_TKN);
                            goto endit;
                        case '\n':
                            eoln = TRUE;
/****************************************************************
                            if ((c = fgetc(txtfp)) != ' ')
                                ungetc(c, txtfp);
                            else if ((c = fgetc(txtfp)) != ' ') {
                                ungetc(c, txtfp);
                                printf("Error - no double blank beginning\
line d\7\n", lineno);
                            }
****************************************************************/
                            if ((++lineno   REPORTVAL) == 0)
                                printf("\015 7d ", lineno);
                        case ' ':
                            if (inword) {
                                if (!space) {
                                    puttkn(NOSPC_TKN);
                                    nospctly++;
                                    space = TRUE;
                                }
                                lowerwrd();
                                if (lookup(word, endword - word))
                                    numwords++;
                                inword = FALSE;
                            } else
                                space = TRUE;
                            break;
                        default:
                            if (isalpha(c)) {
                                if (inword)
                                    *endword++ = c;
                                else {                 /* first char of word */
                                    endword = word;
                                    *endword++ = c;
                                    inword = TRUE;
                                }
                            } else {
                                if (inword) {
                                    if (!space) {
                                        puttkn(NOSPC_TKN);
                                        nospctly++;
                                    } else
                                        space = FALSE;
                                    lowerwrd();
                                    if (lookup(word, endword - word))
                                        numwords++;
                                    inword = FALSE;
```

```
                }
                if (space) {
                    puttkn(SPACE_TKN);
                    spacetly++;
                }
                if (lookup(&c, 1))
                    numpunct++;
            }
        }
        c = fgetc(txtfp);
    }
    if (isdigit(c)) {
        puttkn(LNBRK_TKN);
        if (c == '1')
            if ((c = getc(txtfp)) == ' ') {
                putchap(numtkns);
                chap = TRUE;
            } else
                while (isdigit(c = getc(txtfp)))
                    ;
        else
            while (isdigit(c = getc(txtfp)))
                ;
        if (c != ' ')
            printf("No blank after verse number in line  d\7\n",
                    lineno);
        verse = TRUE;
    }
}
if ((++lineno   REPORTVAL) == 0)
    printf("\015 7d ", lineno);
    puttkn(LNBRK_TKN);
if (c != EOF)
    c = fgetc(txtfp);
}
endit:
    putchap(numtkns);
    if ((numtkns   16) != 0)
        putc('\n', rtnfp);
    if ((numchaps   8) != 0)
        putc('\n', lchfp);
    fprintf(bokfp, "end   d\n", numchaps);
}

/*
lowerwrd() uses the external variables "word" and "endword" to define the
start and end+1 of the character string.  If the first character is lowercase
then the rest are checked to be lowercase.  If the first is uppercase and the
second are lowercase a UPCHR_TKN is output and the rest are checked to be
lowercase.  If the first and second are uppercase a UPWRD_TKN is output and
the rest are checked to be uppercase.
*/
lowerwrd()
{
    char *wordp, *badwordp;

wordp = word;
    if (islower(*wordp)) {
    while (++wordp < endword)
        if (isupper(*wordp)) {
            printf("\015 7d Invalid word \"", lineno);
            badwordp = word;
            goto invalid;
        }
```

```
        } else {
            *wordp |= 0x20;         /* fast lowercase conversion */
            if (++wordp < endword)
                if (islower(*wordp)) {
                    puttkn(UPCHR_TKN);
                    upchrtly++;
                    while(++wordp < endword)
                        if (isupper(*wordp)) {
                            printf("\015 7d Invalid word \"", lineno);
                            putchar(toupper(*word));
                            badwordp = word + 1;
                            goto invalid;
                        }
                } else {
                    puttkn(UPWRD_TKN);
                    upwrdtly++;
                    *wordp |= 0x20;
                    while (++wordp < endword)
                        if (islower(*wordp)) {
                            printf("Invalid word \"");
                            badwordp = word;
                            while (badwordp < wordp)
                                putchar(toupper(*badwordp++));
                            goto invalid;
                        } else
                            *wordp |= 0x20;
                }
        }
        else {
            puttkn(UPCHR_TKN);         /* single uppercase character */
            upchrtly++;
        }
    }
    return;
invalid:
    while (badwordp < endword) {
        putchar(*badwordp);
        *badwordp++ |= 0x20;
    }
    printf("\" - changed to a valid form\7\7\n");
} puttkn(tkn)
tokentype tkn;
{
    fprintf(rtnfp, " x", (int) tkn);
    if ((++numtkns  16) == 0)
        putc('\n', rtnfp);
    else
        putc(' ', rtnfp);
} putchap(chap)
int chap;
{
    fprintf(lchfp, " x", chap);
    if ((++numchaps  8) == 0)
        putc('\n', lchfp);
    else
        putc(' ', lchfp);
} boolean lookup(word, length)
char *word;
int length;
```

```
{
    char *endp, *wordp, *oldwordp, *saveword();
    boolean retval;
    hashentry *hashp;
    retval = FALSE;
    endp = word + length;
    hashp = hashtbl + hash(word, length);   /* calculate hash value */
    while (hashp->length != 0) {     /* look for word */
    if (hashp->length == length) {
        wordp = word;
        oldwordp = hashp->wordp;
        while (wordp < endp)
            if (*wordp++ != *oldwordp++)
                goto notit;
        goto foundit;                         /* already exists */
    }
notit:
    if (--hashp < hashtbl)
        hashp = hashtbl + hashsize - 1;
    }
/* word does not yet exist in the dictionary - place it */
    hashp->wordp = saveword(word, (int) (hashp->length = length));
    hashp->wrdtkn = nexttkn++;
    hashp->tally = 0;
    if (maxlength < hashp->length)
    maxlength = hashp->length;
    if (++numentries >= hashlimit)
    rebuildhashtbl();
    retval = TRUE;
foundit:
    puttkn(hashp->wrdtkn);
    hashp->tally++;
    return retval;
}

/*
saveword(word, length) places the word somewhere and returns the address.
Note: the word is not terminated with a null.
*/
define CHUNKSIZE 0x10000 char *nextsaved = NULL, *endsaved = NULL;

char *saveword(word, length)
char *word;
int length;
{
    char *retval;

if (endsaved - (nextsaved + length) < 0) {          /* need more space */
    if ((nextsaved = calloc(CHUNKSIZE, sizeof(char))) == NULL) {
        printf("Error - cannot allocate  d bytes for words -\
 aborting\7\7\n", CHUNKSIZE);
        exit(1);
    }
    endsaved = nextsaved + CHUNKSIZE;
    }
    retval = nextsaved;
    while (length--)
    *nextsaved++ = *word++;
    return retval;
} rebuildhashtbl()
```

```
{
/*
to rebuild the hash table:
Request a larger array, rehash the current contents and cfree the old hash
table.
*/
    register hashentry *hp, *oldhashtbl, *hashp;

hp = (oldhashtbl = hashtbl) + hashsize;
    hashsize = hashsize * GROWFACTOR;
    hashlimit = LIMITFACTOR * hashsize;
    if ((hashtbl = (hashentry *) calloc(hashsize, sizeof(hashentry))) == NULL) { printf("Cannot allocate  d bytes to rehash hashtbl - aborting\7\n",
            hashsize*sizeof(hashentry));
        exit(1);
    }
    printf("Rebuilding hash table to  d\n", hashsize);
/* rehash old entries into new table */
    while (--hp >= oldhashtbl) {     /* backwards as it was built */
        if (hp->length != 0) {
            hashp = hashtbl + hash(hp->wordp, (int) hp->length);
            while (hashp->length != 0)
                if (--hashp < hashtbl)
                    hashp = hashtbl + hashsize - 1;
            *hashp = *hp;
        }
    }
    cfree(oldhashtbl);
} int hash(word, length)
char *word;
int length;
{
    int retval;

retval = (1231 * (729 + *word++))   hashsize;
    while (--length > 0)
    retval = (retval + 428 * (8271 + *word++))   hashsize;
    return retval;
} writedictn()
{
    int i, l;
    char format[100], *wordp;
    hashentry *hashp;

sprintf(format, " 3.1d  - d. ds   4.4x   5d\n", maxlength, maxlength);
/* see #defines at top of file with following defns */
    fprintf(rdcfp, format, 0, "BOOK1_TKN", 0x0001, numbooks);
    fprintf(rdcfp, format, 0, "BOOK2_TKN", 0x0002, numbooks);
    fprintf(rdcfp, format, 0, "CHAPT_TKN", 0x0003, numchaps);
    fprintf(rdcfp, format, 0, "LNBRK_TKN", 0x0004,
        numverses + numchaps * 2 + numbooks * 4);
    fprintf(rdcfp, format, 0, "NOSPC_TKN", 0x0005, nospctly);
    fprintf(rdcfp, format, 0, "SPACE_TKN", 0x0006, spacetly);
    fprintf(rdcfp, format, 0, "UPCHR_TKN", 0x0007, upchrtly);
    fprintf(rdcfp, format, 0, "UPWRD_TKN", 0x0008, upwrdtly);
    fprintf(rdcfp, format, 0, "VERSE_TKN", 0x0009, numverses);
    i = numentries;
    hashp = hashtbl;
    while (i--) {
```

```c
        while (hashp->length == 0)
            hashp++;
        fprintf(rdcfp, " 3.1d ", (int) (l = hashp->length));
        wordp = hashp->wordp;
        while (l--)
            fputc(*wordp++, rdcfp);
        l = maxlength - hashp->length;
        while (l--)
            fputc(' ', rdcfp);
        fprintf(rdcfp, " 4.4x  5d\n", (int) hashp->wrdtkn,
                (int) hashp->tally);
        hashp++;
    }
}
#include <stdio.h>
include <string.h> define MAX     0x10000
define UP_TKN  0007
#define PR_CH(cnt,val) ((cnt   val) == 0 ? '\n':' ')
#define DICTNAME  "kjbible.ldc"
#define NEWDICT   "kjbible.sdc"
#define TKNNAME   "kjbible.ltn"
#define NEWTKN    "kjbible.stn"
#define OLDCHAPT  "kjbible.lch"
#define NEWCHAPT  "kjbible.sch"
#define UPNAME    "kjbible.upw"

typedef unsigned short token;
char upw_array[MAX];
FILE *sdc, *ldc, *lch, *ltn, *stn, *sch, *upw;

main()
{
    pack_up_array();
    do_dict_update();
    do_tkn_update();
} pack_up_array()
{
    token tkn;
    char str[80];

upw=fopen(UPNAME,"r");
    while (fscanf(upw, " hx  s", &tkn, str) != EOF)
    upw_array[tkn]=1;
    fclose(upw);
    return;
} do_dict_update()

{
    int  int1, int2, i;
    char ch, str[80];
    token tkn;

ldc=fopen(DICTNAME,"r");
    sdc=fopen(NEWDICT,"w");

i=0;
    while (fscanf(ldc, " d  s   hx  d",&int1, str, &tkn, &int2) != EOF) {
```

```
    i++;
    if (upw_array[i]==1)
        str[0]=toupper(str[0]);

/*printf(" 2d  -18s  4.4x  5d\n", int1, str, tkn, int2);*/
    fprintf(sdc," 3d  -18s  4.4x  5d\n", int1, str, tkn, int2);
    } fclose(ldc);
    fclose(sdc);
    return;
}
in_tkn_set(tkn)
token tkn;

{
    return(tkn);
} do_tkn_update()
{
    int incnt, outcnt, chapadr, chapcnt;
    token tkn;

ltn=fopen(TKNNAME, "r");
    lch=fopen(OLDCHAPT, "r");
    stn=fopen(NEWTKN, "w");
    sch=fopen(NEWCHAPT, "w");

incnt = outcnt = chapcnt = 0;
    putchar('\n');
    fscanf(lch, " x", &chapadr);
    while (fscanf(ltn, " hx", &tkn) != EOF) {
        if ((incnt 10000)==0) {
            printf("\r 6d  6d ", incnt, outcnt);
            fflush(stdout);
        }
        if (incnt++ == chapadr) {
            chapcnt++;
            fprintf(sch, " 6.6x c", outcnt, PR_CH(chapcnt,10));
            if (fscanf(lch, " x", &chapadr) != 1) {
                printf("/nError reading .sch file!!/n");
                chapadr = -1;
            }
        }
        if (tkn == UP_TKN) {
            fscanf(ltn, " hx", &tkn);
            if ((incnt++ 10000)==0) {
                printf("\r 6d ",outcnt);
                fflush(stdout);
            }
            if (upw_array[tkn] == 0) {
                outcnt++;
                fprintf(stn, " 4.4x c", UP_TKN, PR_CH(outcnt,16));
            }
        }
        outcnt++;
        fprintf(stn, " 4.4x c", tkn, PR_CH(outcnt,16));
    }
```

```
fprintf(sch, " 6.6x c", outcnt, PR_CH(chapcnt,10));

fclose(ltn);
    fclose(stn);
    fclose(sch);
    fclose(lch);
    return;
} do_chapt_update()
{
return;
}
```

We claim:

1. A method of processing a text comprising words represented by binary character code in order to store the text in storage means, said method comprising:
   creating a dictionary file which relates the binary character code of each word in said text to a binary word code representative of the word itself;
   altering the binary character code representation of said text by replacing the binary character code representation of each word with the corresponding binary word code according to said dictionary file;
   creating a phrase table file which relates the binary word code of pairs of words, which are adjacent one another in said text and occur in said text at least three times, to binary phrase code representative of said pairs;
   adjusting said phrase table file so as to relate two binary phrase codes, or a binary phrase code and a binary word code, to a single distinct binary phrase code, said two phrase codes, or said phrase and word codes, representing a group of words which comprise a phrase and occur in said text at least three times; and
   altering the code representation of said text so as to replace binary word code with binary phrase code according to said phrase table file.

2. A method of processing a text as claimed in claim 1, further comprising:
   creating a phrase tally file which includes a tally of the numbers of occurrences of pairs of words adjacent one another in said text; and
   adjusting said phrase tally file so as to include a tally of the number of occurrences of phrases in said text which correspond to two phrase codes, or a phrase code and word code;
   wherein a phrase code is allocated to represent two word codes, two phrase codes, or a phrase code and a word code if, according to said tally file, the pair of adjacent words, or phrase, represented thereby has a tally greater than two; and
   the tally of any preceding or succeeding pair of adjacent words, or phrase is decremented by one.

3. A method of processing a text as claimed in claim 2, wherein prior to allocating a phrase code to represent two word codes, two phrase codes, or a phrase code and a word code, the phrase tally file is processed and if the pair of adjacent words, or phrase, corresponding thereto overlaps with another pair of adjacent words, or phrase, having a higher tally, the respective two codes representative thereof clash and said allocation is prevented.

4. A method of processing a text as claimed in claim 3, further comprising processing said binary word code representation of said text so as to generate said phrase tally file which comprises a plurality of records each having a first field including a pair of adjacent word codes, a second field including the tally of said pair, and a third field which may be used to indicate operations to be performed in respect of said pair, said records being accessible by a respective index.

5. A method of processing a text as claimed in claim 4, wherein said phrase tally file only includes records in respect of pairs of word codes having tallys greater than two, and said method further comprises processing said word code representation of said text so as to generate an index stream representative of the position of pairs of adjacent word codes in said text, said index stream including the indices associated with the pairs of word codes in said phrase tally file and markers of representative the pairs of word codes having tallys less than three.

6. A method of processing a text as claimed in claim 5, wherein said phrase tally file is processed so that the third field of records relating to pairs of word codes, which clash with other pairs having a higher tally, indicates allocation of a phrase code is to be prevented, and the third field of the remaining records indicates allocation is to be performed.

7. A method of processing a text as claimed in claim 6, wherein after processing of said phrase tally file, said index stream is sequentially processed according to the following steps:
   (a) an index is accessed and a corresponding record is accessed from the phrase tally file;
   (b) if the third field of the accessed record indicates allocation is to be performed:
      (i) a phrase code is allocated to represent the pair of adjacent codes of the second field of the accessed record and a corresponding entry is made in the phrase table file;
      (ii) any indices immediately preceding or succeeding the accessed index are used to access the phrase tally file and the second fields of the records corresponding thereto are decremented by one and if said second fields become less than three the third field corresponding thereto is adjusted to indicate the respective index is to be removed from the index stream;
      (iii) if an index immediately precedes or succeeds said accessed index a new pair of adjacent codes, including said allocated phrase, is created and an index is allocated thereto and inserted in said stream and a tally kept thereof of occurrences in said stream during processing of said stream (c) if the third field of the accessed record indicates the respective index is to be removed from the stream the accessed index is removed from the stream.

8. A method of processing a text as claimed in claim 7, wherein after said stream is sequentially processed, the phrase tally file is adjusted to include each said new pair of adjacent codes having a tally greater than two and said stream is continually sequentially processed and the phrase tally file adjusted accordingly thereafter until all of the indices in said stream have been removed.

9. A method of processing a text as claimed in claim 8 wherein said dictionary file comprises a plurality of dictionary records each including the binary character code for at least the last character of a word, the binary character code of a word being accessible from said dictionary file, after the address of a corresponding dictionary record, the number of characters in the word, the number of characters which the binary character code of the corresponding record represents and the next dictionary record which needs to be accessed to obtain any remaining characters of the word, are determined using the corresponding word code.

10. A method of processing a text as claimed in claim 9, wherein each dictionary record further includes three fields indicating the number of characters in the word, the number of characters which the character code of the dictionary record represents, and the next dictionary which needs to be accessed, respectively, and the corresponding word code directly accesses said record.

11. A method of processing a text as claimed in claim 10, wherein said word and phrase codes comprise sixteen bits.

12. A method of processing a text as claimed in claim 11, wherein the 256 words which occur the most in said text are represented by eight bit word codes.

13. The method of claim 1, further including the step of accessing text stored within said storage means by:
receiving a signal indicating that a predetermined word or phrase is to be searched for in the text,
accessing said dictionary file and phrase file, in response to said signal, to determine the corresponding binary word and/or phrase code to be searched for in said stored text so as to locate said predetermined word or phrase,
searching said stored text on the basis of said corresponding binary code, and
displaying, in response to said searching step, a location of said predetermined word or phrase in said text.

14. The method of claim 1, further including the step of decompressing said text by sequentially processing the code representation of said text and using each word and phrase code accessed therefrom to access the dictionary and phrase table files until character code is obtained therefrom, said phrase table file being recursively accessed by phrase code until word code is retrieved for accessing said dictionary file.

15. An apparatus for processing a text comprising words represented by binary character code in order to store the text in storage means, said apparatus comprising:
means for creating a dictionary file which relates the binary character code of each word in said text to a binary word code representative of the word itself;
means for altering the binary character code representation of said text by replacing the binary character code representation of each word with the corresponding binary word code according to said dictionary file;
means for creating a phrase table file which relates the binary word code of pairs of words, which are adjacent one another in said text and occur in said text at least three times, to binary phrase code representative of said pairs;
means for adjusting said phrase table file so as to relate two binary phrase codes, or a binary phrase code and a binary word code, to a single distinct binary phrase code, said two phrase codes, or said phrase and word codes, representing a group of words which comprise a phrase and occur in said text at least three times; and
means for altering the code representation of said text so as to replace binary word code with binary phrase code according to said phrase table file.

16. The apparatus of claim 15, further including a data processing system connectable to the storage means, said system comprising:
means for sequentially accessing the code representation of said text in said storage means and using each word and phrase code accessed from said code to access the dictionary and phrase table files in said storage means until character code is obtained therefrom, said means recursively accessing said phrase table file by phrase code until word code is retrieved for accessing said dictionary file; and
means for displaying at least part of said text corresponding to the obtained character code, said displaying means being controlled by said accessing means.

17. The apparatus of claim 15, further including a data processing system connectable to said storage means, said system comprising:
means for receiving a signal indicating that a predetermined word or phrase is to be searched for in the text,
means responsive to said receiving means for accessing said dictionary file and phrase table file to determine the corresponding binary word and/or phrase code to be searched for in said stored text in order to locate said predetermined word or phrase, and for searching said stored text on the basis of said corresponding binary code, and
means responsive to said accessing means for displaying a location of said predetermined word or phrase in said text.

18. The apparatus of claim 15 further including a data processing system connectable to said storage means, with said storage means having a first section which includes the code representation of said text, a second section which includes said dictionary file, a third section which includes said phrase table file, and a fourth section which includes decompressing, searching and display programs, said system comprising:
an address bus and a data bus which are connectable to said storage means;
a register bank connected to part of said address bus and input/output ports connected to said data bus and the remainder of said address bus;

processor means connectable to said bank and ports so as to control said buses and thereby access said storage means; and means for displaying at least part of said text;

said bank being adapted to store four different most significant parts of an address to be placed on said address bus, thereby enabling said processor means to access one of said sections of storage means in one access cycle and another of said sections in the succeeding cycle and retain an indication as to the location at which said one of said sections was last accessed, such that said processor means may sequentially access and process the code representation of said text using said programs and use each word and phrase code accessed therefrom to access said dictionary and phrase table files until character code is obtained therefrom, said processor means recursively accessing said phrase table file by phrase code until word code is retrieved for accessing said dictionary file;

said processor means being adapted to control said display means to display a part of said text corresponding to said obtained character code.

19. The apparatus of claim 18, wherein said storage means is housed in a module connectable to said system and said system comprises a reset circuit which initializes and supplies power to said system and said memory when said module is connected to said system.

20. The apparatus of claim 19, wherein said module and system are such that on connecting said module to said system, first circuitry in the module is earthed, secondly a reset signal is applied to the processor means and input/output ports of the module are disabled, thirdly power is supplied to the module, fourthly corresponding input/output signal lines of the system and module are connected and finally the reset signal to the processor means is removed and the ports of the module are enabled.

21. The apparatus of claim 18, further comprising selection means for causing said processor means and said display means to move a cursor on a display so as to select a displayed word or menu item, execution means causing said processor means to perform an operation according to said selected menu item and based on said selected word, and cancellation means for causing said processor means to cancel said operation.

22. The apparatus of claim 21, further comprising means for disabling power supply to said storage means and selected units of said system when switches associated with said selection, execution and cancellation means are unused for a first predetermined period of time.

23. The apparatus of claim 21, further comprising additional memory for storing initialization and diagnostic routines and variables used during execution of said programs in said memory, a sub-address bus used by said processor means to access said additional memory and holding latches for storing a current address outputted by said processor means while a main address/data bus is used to carry data accessed from said additional memory.

24. The apparatus of claim 18, further comprising additional storage means for storing initialization and diagnostic routines and variables used during execution of said programs in said storage means, a sub-address bus used by said processor means to access said additional storage means and holding latches for storing a current address outputted by said processor means whilst a main address/data bus is used to carry data accessed from said additional storage means.

25. The apparatus of claim 18, further comprising selection means for causing said processor means and said display means to move a cursor on a display so as to select a displayed word or menu item, execution means causing said processor means to perform an operation according to said selected menu item and based on said selected word, and cancellation means for causing said processor means to cancel said operation.

26. The apparatus of claim 18, further comprising additional memory for storing initialization and diagnostic routines and variables used during execution of said programs in said memory, a sub-address bus used by said processor means to access said additional memory and holding latches for storing a current address outputted by said processor means while a main address/data bus is used to carry data accessed from said additional memory.

27. The apparatus of claim 15, further including a memory medium for storing said text.

28. A method of accessing text stored in a storage means having a dictionary file which relates a binary character code of each word in a text to a binary word code representative of the word itself, a phrase table file which relates the binary word code of pairs of words, which are adjacent to one another in said text and occur in said text at least three times, to binary phrase code representative of said pairs, a binary phrase code and a binary word code representation of said text, wherein said method comprises:

receiving a signal indicating that a predetermined word or phrase is to be searched for in the text, accessing said dictionary file and phrase file, in response to said signal, to determine the corresponding binary word and/or phrase code to be searched for in said stored text so as to locate said predetermined word or phrase, searching said stored text on the basis of said corresponding binary code, and displaying, in response to said searching step, a location of said predetermined word or phrase in said text.

29. A data processing system connectable to a storage means having a dictionary file which relates a binary character code or each word in a text to a binary word code representative of the word itself, a phrase table file which relates the binary word code of pairs of words, which are adjacent to one another in said text and occur in said text at least three times, to binary phrase code representative of said pairs, and a binary phrase code and a binary word code representation of said text, said system comprising:

means for sequentially accessing the code representation of said text in said storage means and using each word and phrase code accessed from said code to access the dictionary and phrase table files in said storage means until character code is obtained therefrom, said means recursively accessing said phrase table file by phrase code until word code is retrieved for accessing said dictionary file; and means for displaying at least part of said text corresponding to the obtained character code, said displaying means being controlled by said accessing means.

30. A data processing system connectable to a storage means having a dictionary file which relates a binary character code of each word in a text to a binary word code representative of the word itself, a phrase table file which relates the binary word code of pairs of words, which are adjacent to one another in said text and occur in said text at least three times, to binary phrase code representative of said pairs, and a binary phrase code and a binary word code representation of said text, said system comprising;

means for receiving a signal indicating that a predetermined word or phrase is to be searched for in the text, means responsive to said receiving means for accessing said dictionary file and phrase table file to determine the corresponding binary word and/or phrase code to be searched for in said stored text in order to locate said predetermined word or phrase, and for searching said stored text on the basis of said corresponding binary code, and means responsive to said accessing means for displaying a location of said predetermined word or phrase in said text.

31. A data processing system connectable to a storage means having a dictionary file which relates a binary character code of each word in a text to a binary word code representative of the word itself, a phrase table file which relates the binary word code of pairs of words, which are adjacent to one another in said text and occur in said text at least three times, to binary phrase code representative of said pairs, and a binary phrase code and a binary word code representation of said text, with said storage means having a first section which includes the code representation of said text, a second section which includes said dictionary file, a third section which includes said phrase table file, and a fourth section which includes decompressing, searching and display programs, said system comprising:

an address bus and a data bus which are connectable to said storage means;

a register bank connected to part of said address bus and input/output ports connected to said data bus and the remainder of said address bus;

processor means connectable to said bank and ports so as to control said buses and thereby access said storage means; and means for displaying at least part of said text;

said bank being adapted to store four different most significant parts of an address to be placed on said address bus, thereby enabling said processor means to access one of said sections of storage means in one access cycle and another of said sections in the succeeding cycle and retain an indication as to the location at which said one of said sections was last accessed, such that said processor means may sequentially access and process the code representation of said text using said programs and use each word and phrase code accessed therefrom to access said dictionary and phrase table files until character code is obtained therefrom, said processor means recursively accessing said phrase table file by phrase code until word code is retrieved for accessing said dictionary file;

said processor means being adapted to control said display means to display a part of said text corresponding to said obtained character code.

32. The data processing system of claim 31, wherein said storage means is housed in a module connectable to said system and said system comprises a reset circuit which initializes and supplies power to said system and said memory when said module is connected to said system.

33. The data processing system of claim 31, wherein said module and system are such that on connecting said module to said system, first circuitry in the module is earthed, secondly a reset signal is applied to the processor means and input/output ports of the module are disabled, thirdly power is supplied to the module, fourthly corresponding input/output signal lines of the system and module are connected and finally the reset signal to the processor means is removed and the ports of the module are enabled.

34. The data processing system of claim 31, further comprising selection means for causing said processor means and said display means to move a cursor on a display so as to select a displayed word or menu item, execution means causing said processor means to perform an operation according to said selected menu item and based on said selected word, and cancellation means for causing said processor means to cancel said operation.

35. The data processing system of claim 34, further comprising additional memory for storing initialization and diagnostic routines and variables used during execution of said programs in said memory, a sub-address bus used by said processor means to access said additional memory and holding latches for storing a current address outputted by said processor means while a main address/data bus is used to carry data accessed from said additional memory.

36. The data processing system of claim 31, further comprising means for disabling power supply to said storage means and selected units of said system when switches associated with said selection, execution and cancellation means are unused for a first predetermined period of time.

37. The data processing system of claim 31, further comprising additional storage means for storing initialization and diagnostic routines and variables used during execution of said programs in said storage means, a sub-address bus used by said processor means to access said additional storage means and holding latches for storing a current address outputted by said processor means whilst a main address/data bus is used to carry data accessed from said additional storage means.

38. The data processing system of claim 31, further comprising selection means for causing said processor means and said display means to move a cursor on a display so as to select a displayed word or menu item, execution means causing said processor means to perform an operation according to said selected menu item and based on said selected word, and cancellation means for causing said processor means to cancel said operation.

39. The data processing system of claim 31, further comprising additional memory for storing initialization and diagnostic routines and variables used during execution of said programs in said memory, a sub-address bus used by said processor means to access said additional memory and holding latches for storing a current address outputted by said processor means while a main address/data bus is used to carry data accessed from said additional memory.

* * * * *